(12) United States Patent
Kobayashi

(10) Patent No.: US 11,594,677 B2
(45) Date of Patent: Feb. 28, 2023

(54) SEMICONDUCTOR STORAGE DEVICE WITH INSULATING FILMS ADJACENT RESISTANCE CHANGING FILMS

(71) Applicant: KIOXIA CORPORATION, Tokyo (JP)

(72) Inventor: Yusuke Kobayashi, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 195 days.

(21) Appl. No.: 17/010,382

(22) Filed: Sep. 2, 2020

(65) Prior Publication Data

US 2021/0083184 A1 Mar. 18, 2021

(30) Foreign Application Priority Data

Sep. 17, 2019 (JP) .............................. JP2019-168160

(51) Int. Cl.
| | | |
|---|---|---|
| *H01L 45/00* | (2006.01) | |
| *G11C 8/14* | (2006.01) | |
| *H01L 27/24* | (2006.01) | |
| *G11C 7/18* | (2006.01) | |
| *G11C 13/00* | (2006.01) | |

(52) U.S. Cl.
CPC ............ *H01L 45/1226* (2013.01); *G11C 7/18* (2013.01); *G11C 8/14* (2013.01); *G11C 13/003* (2013.01); *G11C 13/0004* (2013.01); *H01L 27/2463* (2013.01); *H01L 45/06* (2013.01); *H01L 45/16* (2013.01)

(58) Field of Classification Search
CPC ..... G11C 8/14; G11C 13/0004; G11C 13/003; H01L 27/2463; H01L 45/06; H01L 45/16; H01L 27/2427; H01L 45/1616; H01L 45/1683; H01L 27/2481; H01L 27/249; H01L 45/08
See application file for complete search history.

(56) References Cited

U.S. PATENT DOCUMENTS

| | | |
|---|---|---|
| 7,589,364 B2 | 9/2009 | Asano et al. |
| 7,883,930 B2 | 2/2011 | Tsukamoto et al. |
| 7,902,539 B2 | 3/2011 | Moniwa et al. |
| 7,943,502 B2 | 5/2011 | Park et al. |

(Continued)

FOREIGN PATENT DOCUMENTS

| | | |
|---|---|---|
| JP | 2009-267219 A | 11/2009 |
| JP | 2011-040579 A | 2/2011 |
| JP | 2012-209548 A | 10/2012 |

*Primary Examiner* — Jerome Leboeuf
(74) *Attorney, Agent, or Firm* — Foley & Lardner LLP

(57) ABSTRACT

A semiconductor storage device includes a first wiring, a second wiring, an insulating portion, and a resistance changing film. The first wiring extends in a first direction. The second wiring extends in a second direction intersecting the first direction, and is provided at a location different from that of the first wiring in a third direction intersecting the first direction and the second direction. The insulating portion is provided between the first wiring and the second wiring in the third direction. The resistance changing film is provided between the first wiring and the second wiring in the third direction, is adjacent to the insulating film from a first side and a second side which is opposite to the first side in the first direction, and the resistance changing film being smaller than the second wiring in the first direction.

18 Claims, 42 Drawing Sheets

(56) References Cited

U.S. PATENT DOCUMENTS

| | | |
|---|---|---|
| 9,076,820 B2 | 7/2015 | Kitazaki et al. |
| 9,136,466 B2 | 9/2015 | Son |
| 9,601,691 B2 | 3/2017 | Park |
| 2007/0063180 A1 | 3/2007 | Asano et al. |
| 2009/0267047 A1 | 10/2009 | Sasago et al. |
| 2011/0037046 A1 | 2/2011 | Sato et al. |
| 2011/0140068 A1* | 6/2011 | Ozawa ................ H01L 27/2418 257/4 |
| 2011/0186798 A1* | 8/2011 | Kwon .................... H01L 45/124 257/E45.002 |
| 2012/0068136 A1* | 3/2012 | Park ...................... H01L 45/148 257/3 |
| 2012/0228577 A1 | 9/2012 | Park et al. |
| 2016/0260736 A1 | 9/2016 | Fujii et al. |
| 2018/0254083 A1* | 9/2018 | Czornomaz ........ G11C 13/0004 |

\* cited by examiner

SEMICONDUCTOR STORAGE DEVICE WITH INSULATING FILMS ADJACENT RESISTANCE CHANGING FILMS

CROSS-REFERENCE TO RELATED APPLICATION(S)

This application is based upon and claims the benefit of priority from Japanese Patent Application No. 2019-168160, filed Sep. 17, 2019, the entire contents of which are incorporated herein by reference.

FIELD

Embodiments described herein relate generally to a semiconductor storage device.

BACKGROUND

A semiconductor storage device having a cross-point structure using a phase-change memory (PCM) is known as an example of storage class memories (SCM).

Examples of related art include JP-A-2011-40579.

DETAILED DESCRIPTION

Figure 1:
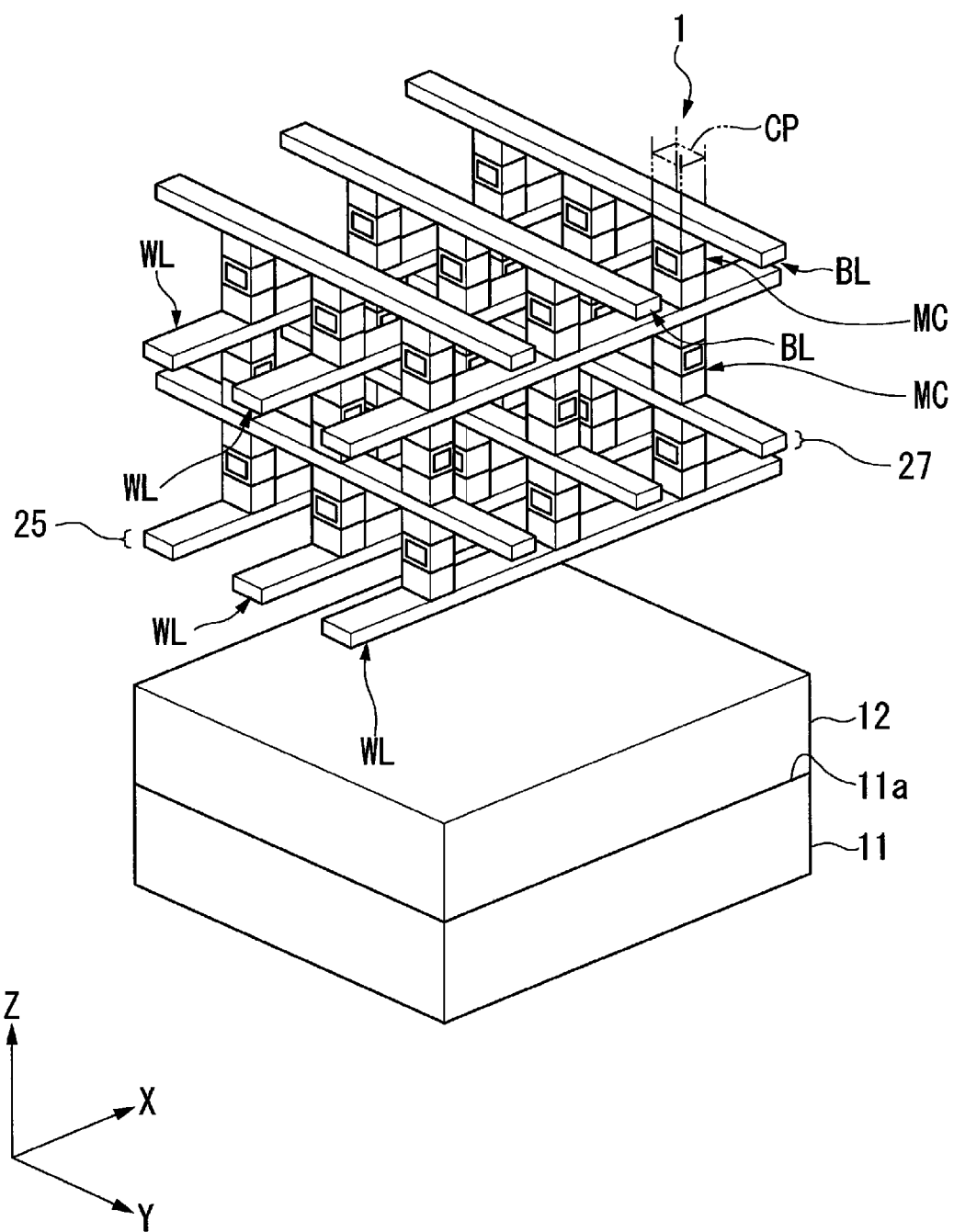
FIG. 1 is a schematic perspective view of a semiconductor storage device according to a first embodiment.

Embodiments provide a semiconductor storage device whose electric characteristics are improved.

In general, according to at least one embodiment, a semiconductor storage device includes a first wiring, a second wiring, an insulating film, and a resistance changing film. The first wiring extends in a first direction. The second wiring extends in a second direction intersecting the first direction, and is provided at a location different from that of the first wiring in a third direction intersecting the first direction and the second direction. The insulating portion is provided between the first wiring and the second wiring in the third direction. The resistance changing film is provided between the first wiring and the second wiring in the third direction, is adjacent to the insulating film from a first side and a second side which is opposite to the first side in the first direction, and the resistance changing film being smaller than the second wiring in the first direction.

According to at least one other embodiment, a semiconductor storage device includes a first wiring, a second wiring, a selector film, an insulating film, and a resistance changing film. The first wiring extends in a first direction. The second wiring extends in a second direction intersecting the first direction, and is provided at a location different from that of the first wiring in a third direction intersecting the first direction and the second direction. The selector film is provided between the first wiring and the second wiring in the third direction. The insulating film is provided between the first wiring and the second wiring in the third direction, and is adjacent to the selector film from a first side and a second side which is opposite to the first side in the first direction. The resistance changing film is provided between the first wiring and the second wiring in the third direction, and is connected to the selector film in the third direction.

Hereinafter, semiconductor storage devices according to at least one embodiment will be described with reference to drawings. In the following description, configurations having a same function or similar functions with each other are denoted by the same reference numeral. Configurations having a same function or similar functions with each other may not be repeatedly described. "Parallel", "orthogonal", "same", and "equivalent" described in the present specification include cases of "substantially parallel", "substantially orthogonal", "substantially same", and "substantially equivalent", respectively.

"Connection" described in the present specification is not limited to a case of being physically connected, and includes a case of being electrically connected. That is, "connection" is not limited to a case where two members are in direct contact, but also includes a case where another member is interposed between the two members. "Contact" described in the present specification means being in direct contact. "Overlap", "face", and "adjacent" described in the present specification are not limited to two members directly facing each other or being in contact with each other, and include a case where a member different from the two members is present between the two members.

(First Embodiment) First, a configuration of a semiconductor storage device 1 according to the first embodiment will be described. FIG. 1 is a schematic perspective view of the semiconductor storage device 1. In the following description, an X direction (second direction) is a direction parallel to a surface 11a of a silicon substrate 11, and is a direction in which word lines WLs extend. A Y direction (first direction) is a direction parallel to the surface 11a of the silicon substrate 11, is a direction intersecting the X direction, and is a direction in which bit lines BLs extend. For example, the Y direction is substantially orthogonal to the X direction. A Z direction (third direction) is a thickness direction of the silicon substrate 11 and is a direction intersecting the X direction and the Y direction. For example, the Z direction is substantially orthogonal to the X direction and the Y direction.

The semiconductor storage device 1 is a so-called crosspoint type semiconductor storage device using a PCM. The semiconductor storage device 1 includes, for example, the silicon substrate 11, an interlayer insulating layer 12, a plurality of word lines WLs, a plurality of bit lines BLs, and a plurality of memory cells MCs.

On the surface 11a of the silicon substrate 11, a drive circuit (not shown) of the semiconductor storage device 1 is formed. The interlayer insulating layer 12 is formed on the surface 11a of the silicon substrate 11 and covers the drive circuit. The interlayer insulating layer 12 is formed of, for example, silicon oxide ($SiO_2$).

Each of the plurality of word lines WLs is formed in a band shape along the X direction, and extends in the X direction. The plurality of word lines WLs are arranged at intervals in the Y direction and the Z direction. More specifically, a plurality of word lines WLs lined up in the Y direction are at a same position in the Z direction, and constitute one word line layer 25. A plurality of word line layers 25 are arranged at intervals in the Z direction. The word line WL is formed of, for example, tungsten (W). One word line WL is an example of a "second wiring". A word line WL adjacent to the word line which is the second wiring in the Y direction is an example of a "third wiring". A word line WL adjacent to the word line which is the second wiring from an opposite side of the third wiring in the Y direction is an example of a "fourth wiring".

The plurality of bit lines BLs are formed in a band shape along the Y direction, and extend in the Y direction. The plurality of bit lines BLs are arranged at intervals in the X direction and the Z direction. A plurality of bit lines BLs arranged in the X direction are at a same position in the Z direction, and constitute one bit line layer 27. The bit line layer 27 is provided between two word line layers 25 adjacent in the Z direction, and has intervals from the two word line layers 25 in the Z direction. The plurality of word line layers 25 and the plurality of bit line layers 27 are alternately disposed one by one in the Z direction. The bit line BL is formed of, for example, tungsten (W). The bit line BL is an example of a "first wiring".

A size of each word line WL in the Y direction and a size of each bit line BL in the X direction are substantially equivalent to a minimum feature size F of the semiconductor storage device 1. Interlayer insulating layers (not shown in FIG. 1) are interposed between the plurality of adjacent word lines WLs in each word line layer 25 and between the plurality of adjacent bit lines BLs in each bit line layer 27.

When viewed from the Z direction, the word lines WLs and the bit lines BLs are disposed in a manner of intersecting each other. When viewed from the Z direction, the word lines WLs and the bit lines BLs are, for example, orthogonal to each other. When viewed from the Z direction, the memory cells MCs are provided in overlapping parts CPs where the word lines WLs and the bit lines BLs overlap each other. The memory cells MCs are interposed between the word lines WLs and the bit lines BLs in the overlapping parts CPs in the Z direction. That is, the plurality of memory cells MCs are arranged in a three-dimensional matrix shape at intervals with one another in the X direction, the Y direction, and the Z direction by being provided in the plurality of overlapping parts CPs.

Figure 2:
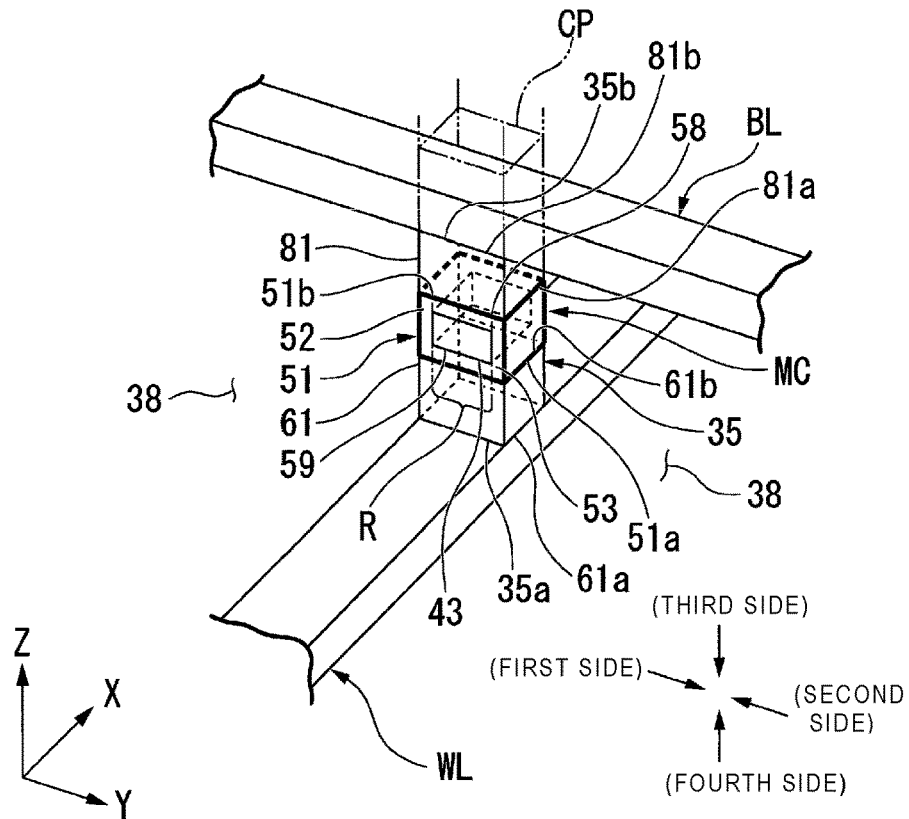
FIG. 2 is a perspective view of one memory cell according to the first embodiment.

FIG. 2 is a perspective view showing one memory cell MC of the semiconductor storage device 1. As shown in FIG. 2, the memory cell MC is constituted with a pillar 35 having a substantially prismatic shape, whose longitudinal direction is the Z direction. An end surface 35a on one side of the pillar 35 in the Z direction is in contact with the word line WL over an entire overlapping part CP. An end surface 35b on the other side of the pillar 35 in the Z direction is in contact with the bit line BL over the entire overlapping part CP. An interlayer insulating portion 38 is provided between adjacent memory cells MCs in the X direction and the Y direction.

The memory cell MC includes, for example, a conductive film 81, a resistance changing film 51, an insulating film 43, and a selector film 61.

The conductive film 81 is provided between the word line WL and the bit line BL in the Z direction. The conductive film 81 is interposed between the resistance changing film 51 and the bit line BL in the Z direction. An end surface 81a on one side of the conductive film 81 in the Z direction is in contact with the resistance changing film 51. An end surface 81b on the other side of the conductive film 81 in the Z direction is in contact with the bit line BL. A size of the conductive film 81 viewed from the Z direction is the same as that of the overlapping parts CP. The conductive film 81 is adjacent to the interlayer insulating portion 38 in the Y direction. The conductive film 81 functions as an electrical connection layer between the bit line BL and the resistance changing film 51, and also functions as a hard mask layer of the memory cell MC. The conductive film 81 is formed of, for example, tungsten.

The resistance changing film 51 is provided between the word line WL and the bit line BL in the Z direction, and is interposed between the selector film 61 and the conductive film 81 in the Z direction. That is, an end surface 51a on one side of the resistance changing film 51 in the Z direction is in contact with the selector film 61. An end surface 51b on the other side of the resistance changing film 51 in the Z direction is in contact with the conductive film 81. The resistance changing film 51 is adjacent to the interlayer insulating portion 38 in the Y direction.

Figure 3:
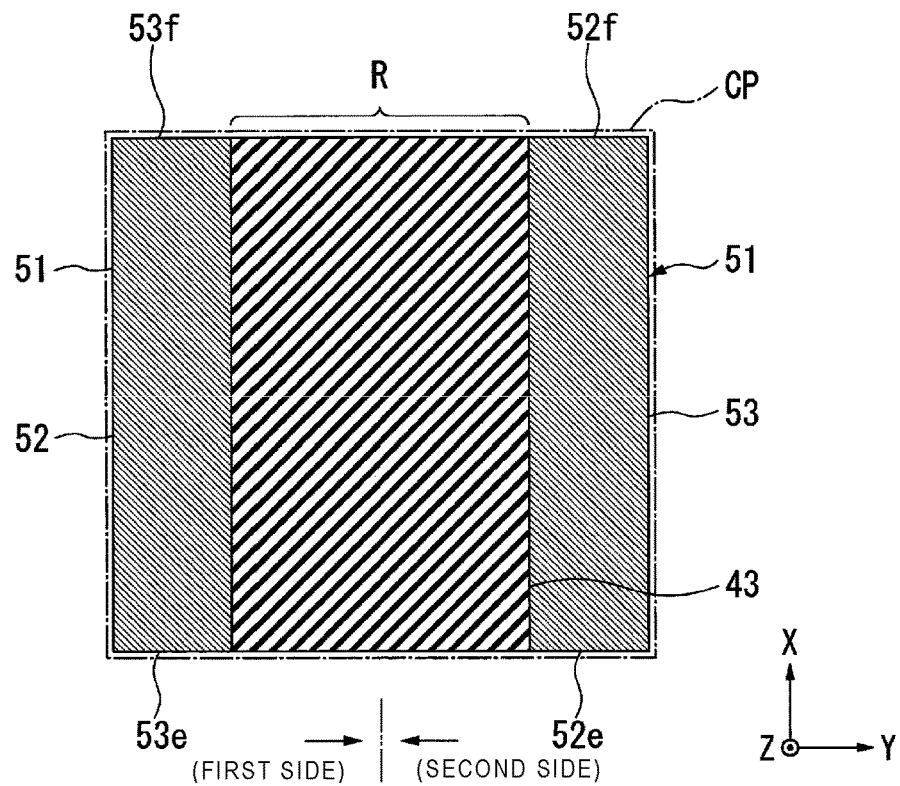
FIG. 3 is a cross-sectional view of a resistance changing film and an insulating film of the one memory cell according to the first embodiment.

FIG. 3 is a cross-sectional view of the resistance changing film 51 and the insulating film 43 of one memory cell MC, which is orthogonal to the Z direction. As shown in FIG. 3, the resistance changing film 51 is adjacent to the insulating film 43 from the first side and the second side which is opposite to the first side in the Y direction.

The resistance changing film 51 is formed by the PCM. The resistance changing film 51 is formed of, for example, a chalcogenide alloy of germanium (Ge), antimony (Sb), and tellurium (Te) called GST. A composition ratio of Ge, Sb, and Te is, for example, 2:2:5. The resistance changing film is in a crystalline state by overheating at a temperature lower than a melting temperature and higher than a crystallization temperature and being gradually cooled, and is in a low resistance state. The resistance changing film is in an amorphous state by being heated at a temperature equal to or higher than the melting temperature and being rapidly cooled, and is in a high resistance state.

That is, when a current applied to the resistance changing film 51 increases and a voltage reaches a predetermined value, a carrier inside the resistance changing film 51 is multiplied and a resistance of the resistance changing film 51 decreases rapidly. When a voltage equal to or higher than the predetermined value is applied to the resistance changing film 51, a large current flows, joule heat is generated, and a temperature of the resistance changing film 51 rises. When the voltage to be applied is controlled and the temperature of the resistance changing film 51 is maintained in a crystallization temperature region, the resistance changing film 51 transits to a polycrystalline state, and a resistance of the resistance changing film 51 decreases. When the resistance changing film 51 is in the polycrystalline state, the polycrystalline state is maintained and the resistance of the resistance changing film 51 remains low even when the applied voltage is zero. When a high voltage is applied to the resistance changing film 51 in the low resistance state, the large current flows, and the temperature of the resistance changing film 51 exceeds a melting point of the chalcogenide alloy or the like, the chalcogenide alloy of the resistance changing film 51 is melted. When the applied voltage decreases rapidly, although the resistance changing film 51 is cooled rapidly, the resistance of the resistance changing film 51 remains high. In an operation principle of such a resistance changing film 51, a state where the resistance of the resistance changing film 51 is lower than the predetermined value is called a "set state", and a state where the resistance of the resistance changing film 51 is equal to or higher than the predetermined value is called a "reset state". A rewrite operation for lowering the resistance of the resistance changing film 51 is called a "set operation", and a rewrite operation for raising the resistance of the resistance changing film 51 is called a "reset operation".

The resistance changing film 51 is a layer that maintains the low resistance state or the high resistance state described above. A plurality of resistance changing films 51 change their phases, and selectively operate the plurality of memory cells MCs. The resistance changing film 51 can take at least two different resistance values as a bistable state at a room temperature by applying the voltage or supplying the current. By writing and reading the two stable resistance values, at least a binary memory operation can be implemented. When the binary memory operation is performed on the resistance changing film 51, for example, the set state of the resistance changing film 51 is set to 1, and the reset state of the resistance changing film 51 is set to 0.

The resistance changing film 51 includes a first resistance changing portion 52, a second resistance changing portion 53, a third resistance changing portion 58, and a fourth resistance changing portion 59. The resistance changing film includes the four resistance changing portions and is integrally formed. The first resistance changing portion 52 is adjacent to the insulating film 43 from the first side in the Y direction. The second resistance changing portion 53 is adjacent to the insulating film 43 from the second side in the Y direction. The first resistance changing portion 52 and the second resistance changing portion 53 are separated from each other in the Y direction. The first resistance changing portion 52 and the second resistance changing portion 53 are not in contact with each other when viewed in a cross section orthogonal to the Z direction at any position in the Z direction.

The third resistance changing portion 58 and the fourth resistance changing portion 59 are adjacent to the insulating film 43 from opposite sides in the Z direction. The third resistance changing portion 58 is adjacent to the insulating film 43 from a third side of a first region R in the Z direction. The fourth resistance changing portion 59 is adjacent to the insulating film 43 from a fourth side of the first region R in the Z direction.

A Y-direction maximum width of end surfaces 52e and 52f of the first resistance changing portion 52 in the X direction is smaller than a Y-direction minimum width of the overlapping part CP and smaller than a Y-direction minimum width of the word line WL. A Y-direction maximum width of end surfaces 53e and 53f of the second resistance changing portion 53 is smaller than the Y-direction minimum width of the overlapping part CP and smaller than the Y-direction minimum width of the word line WL. Y-direction minimum widths of the end surfaces 52e and 52f of the first resistance changing portion 52 and the end surfaces 53e and 53f of the second resistance changing portion 53, and Z-direction minimum thicknesses of the end surfaces of the third resistance changing portion 58 and the fourth resistance changing portion 59 in the X direction are, for example, equal to or more than 20% and equal to or less than 50% of a smaller one between the Y-direction minimum width of the overlapping part CP and a Z-direction minimum thickness of the overlapping part CP. When the resistance changing film 51 is formed as described below, a Y-direction minimum width of the first resistance changing portion 52, a Y-direction minimum width of the second resistance changing portion 53, and Z-direction minimum thicknesses of the resistance changing portions 58 and 59 are, for example, equal to or more than 5 μm.

As shown in FIG. 3, the insulating film 43 is disposed in the first region R of the overlapping region CP in the Y direction when viewed in the Z direction. The first region R is a central part of the overlapping region CP in the Y direction. The insulating film 43 is adjacent to the first resistance changing portion 52 and the second resistance changing portion 53 in the Y direction, and is interposed between the first resistance changing portion 52 and the second resistance changing portion 53. When viewed from the X direction, the insulating film 43 is surrounded by the first resistance changing portion 52, the second resistance changing portion 53, and the resistance changing portions 58 and 59, and is buried in a central part of the first region R. The insulating film 43 is formed of, for example, silicon oxide ($SiO_2$), silicon nitride (SiN).

When viewed from the X direction, an area of an end surface of the resistance changing film 51, that is, a total area of the end surfaces of the first resistance changing portion 52, the second resistance changing portion 53, and the resistance changing portions 58 and 59 is smaller than an area of the end surface of the resistance changing film in which the insulating film 43 is not embedded. For example, when viewed from the X direction, the area of the end surface of the resistance changing film 51, that is, the total area of the end surfaces of the first resistance changing portion 52, the second resistance changing portion 53, and the resistance changing portions 58 and 59 is equal to or more than 50% and equal to or less than 80% of that of the end surface of the resistance changing film in which the insulating film 43 is not embedded.

As shown in FIG. 2, the selector film 61 is provided between the word line WL and the bit line BL in the Z direction, and is interposed between the word line WL and the resistance changing film 51 in the Z direction. That is, an end surface 61a on one side of the selector film 61 in the Z direction is in contact with the word line WL. A predetermined end surface 61p on the first side of an end surface 61b on the other side of the selector film 61 in the Z direction is in contact with the resistance changing film 51. A predetermined end surface 61q on the second side of the end surface 61b of the selector film 61 is in contact with the insulating film 43. The selector film 61 is adjacent to an insulating portion 71 from the first side in the Y direction, and is provided only in a region on the first side of the insulating portion 71 in the Y direction. A size of the selector film 61 in the Y direction, a length from an end on the first side of the first resistance changing portion 52 to an end on the second side of the second resistance changing portion 53 in the Y direction and a size of the conductive film 81 in the Y direction are smaller than F, for example, are (2F/3).

The selector film 61 is a film functioning as a selection element of the memory cell MC. The selector film 61 may be, for example, a two-terminal switch element. When a voltage to be applied between two terminals is equal to or lower than a threshold value, the switch element is in the "high resistance" state, for example, an electrically nonconductive state. When the voltage to be applied between the two terminals is equal to or higher than the threshold value, the switch element changes to the "low resistance" state, for example, an electrically conductive state. The switch element may have the function regardless of a polarity of the voltage. The switch element contains at least one chalcogen element selected from the group containing tellurium (Te), selenium (Se), and sulfur (S). The switch element may contain a chalcogenide which is a compound containing the chalcogen element. In addition to the above-described elements, the switch element may contain at least one element selected from a group containing boron (B), aluminum (Al), gallium (Ga), indium (In), carbon (C), silicon (Si), germanium (Ge), tin (Sn), arsenic (As), phosphorus (P), and antimony (Sb).

With relative arrangement of each of the configurations described above, the end surface 35a of the pillar 35 is constituted with the end surface 61a of the selector film 61 in the Y direction. The end surface 35b of the pillar 35 is constituted with an end surface 81b of the conductive film 81 in the Y direction. When viewed from the Z direction, the end surfaces 35a and 35b of the pillar 35 substantially coincide with the overlapping part CP.

Figure 4:
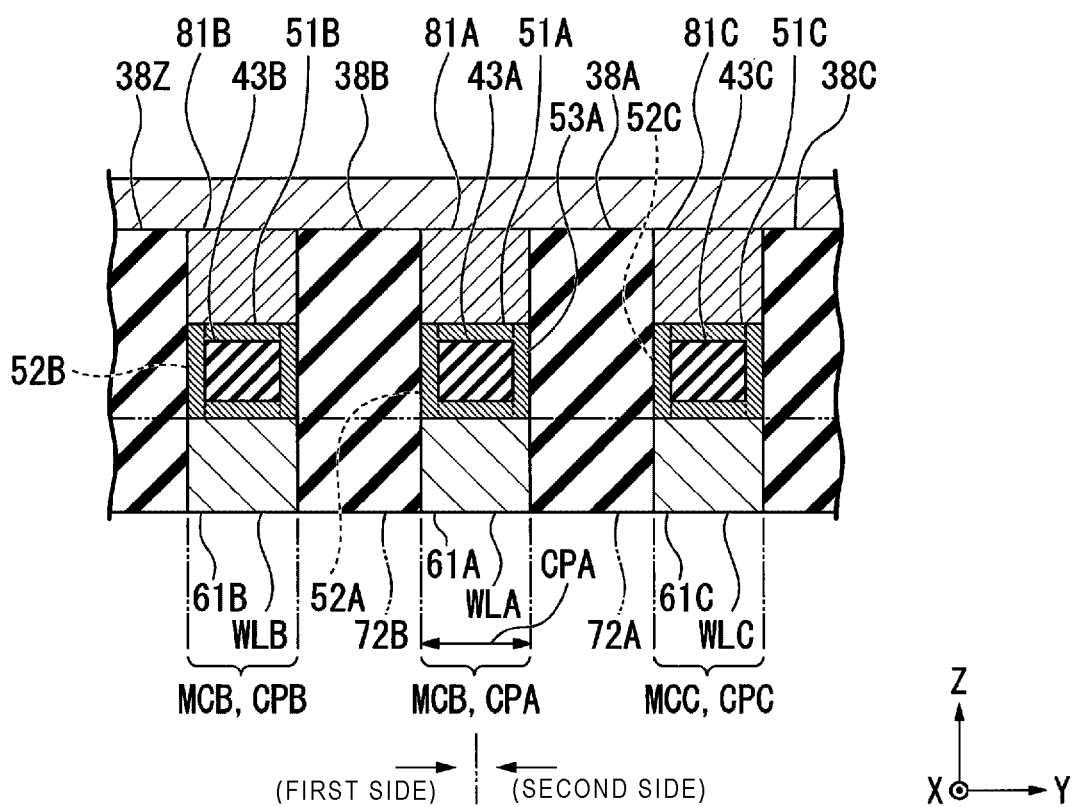
FIG. 4 is a cross-sectional view of a plurality of memory cells according to the first embodiment.

FIG. 4 is a cross-sectional view showing a plurality of the memory cells MCs lined up in the Y direction in the semiconductor storage device 1. As shown in FIG. 4, one memory cell MC is defined as a first memory cell MCA. A memory cell MC that is adjacent to the first memory cell MCA from the first side and sandwiches a second insulating portion 38B with the first memory cell MCA is set as a second memory cell MCB. A memory cell MC that is adjacent to the first memory cell MCA from the second side which is opposite to the first side and sandwiches a first insulating portion 38A with the first memory cell MCA is set as a third memory cell MCC. Hereinafter, components of the first memory cell MCA are denoted by A at ends of reference numerals of the components. Components of the second memory cell MCB are denoted by B at ends of reference numerals of the components. Components of the third memory cell MCC are denoted by C at ends of reference numerals of the components.

The semiconductor storage device 1 includes, for example, the bit line BL, a word line WLA, a first insulating film 43A, a first resistance changing film 51A, a first conductive film 81A, and the first insulating portion 38A. As shown in FIG. 4, the bit line BL is common to the first memory cell MCA, the second memory cell MCB, and the third memory cell MCC, and extends in the Y direction. The word line WLA extends in the X direction and is provided at a position different from the bit line BL in the Z direction. The word line WLA is an example of the "second wiring".

The first memory cell MCA includes, for example, the first insulating film 43A, the first resistance changing film 51A, a selector film 61A, the first conductive film 81A, and the first insulating portion 38A.

The first insulating film 43A is provided between the bit line BL and the word line WLA in the Z direction. The first resistance changing film 51A is provided between the bit line BL and the word line WLA in the Z direction. The first resistance changing film 51A and the first insulating film 43A overlap with an overlapping part CPA when viewed in the Z direction. The first resistance changing film 51A is adjacent to the first insulating portion 38A from the first side and the second side.

The first resistance changing film 51A is disposed at a center of the word line WLA in the Y direction. The center of the word line WLA in the Y direction is a center that is equidistant from an end on the first side of the word line WLA in the Y direction and an end on the second side which is opposite to the first side in the Y direction. The first resistance changing film 51A is in contact with each of the first insulating portions 38A and 38B in the Y direction. The first resistance changing film 51A is disposed between the center of the word line WLA in the Y direction and an edge of the word line WLA in the Y direction.

The first insulating portion 38A is adjacent to the first insulating film 43A from the second side in the Y direction via a second resistance changing portion 53B of the first resistance changing film 51A. The second resistance changing portion 53B is an example of "a part of the first resistance changing film". The second side is an example of "a same side as the part of the first resistance changing film". The second insulating portion 38B is in contact with the first resistance changing film 51A from the first side in the Y direction. The first side is an example of "an opposite side of the first insulating film".

A total maximum thickness of the first resistance changing film 51A in the Y direction is smaller than a maximum thickness of the first insulating film 41A in the Y direction. The total maximum thickness of the first resistance changing film 51A in the Y direction is a total value of a maximum thickness of a first resistance changing portion 52A in the Y direction and a maximum thickness of the second resistance changing portion 53A in the Y direction. The total maximum thickness of the first resistance changing film 51A in the Y direction is equal to or less than half of a maximum width of the word line WLA in the Y direction. The total maximum thickness of the first resistance changing film 51A in the Y direction is smaller than a maximum thickness of the selector film 61A in the Z direction.

The semiconductor storage device 1 further includes, for example, a word line WLB, a second insulating film 43B, a second resistance changing film 51B, and a second insulating portion 38Z. The word line WLB is adjacent to the word line WLA from the first side in the Y direction via an insulating portion 72B and extends in the X direction. The word line WLB is an example of the "third wiring". The second resistance changing film 51B is provided between the bit line BL and the word line WLB in the Z direction, and is adjacent to the second insulating portion 38Z from the second side in the Y direction. The second insulating portion 38Z is adjacent to the second resistance changing film 51B from the first side and the second side in the Y direction.

The second resistance changing film 51B is disposed at a central part of the word line WLB in the Y direction. The second insulating portion 38Z is adjacent to the second insulating film 43B from the first side in the Y direction via a first resistance changing portion 52B of the second resistance changing film 51B. The first resistance changing portion 52B is an example of "a part of the first resistance changing film". The first side is an example of "a same side as the part of the first resistance changing film".

The semiconductor storage device 1 further includes, for example, a word line WLC, a third insulating film 43C, and a third resistance changing film 51C. The word line WLC is adjacent to the word line WLA from the second side in the Y direction via an insulating portion 72A and extends in the X direction. The word line WLC is an example of the "fourth wiring". The second side is an example of "an opposite side of the third wiring".

The third resistance changing film 51C is disposed at a central part of the word line WLC in the Y direction. The third insulating film 43C is provided between the bit line BL and the word line WLC in the Z direction. The third resistance changing film 51C is provided between the bit line BL and the word line WLC in the Z direction, and is adjacent to the third insulating film 43C from the first side and the second side in the Y direction.

The first insulating portion 38A includes an insulating portion 72A provided between the word line WLA and the word line WLC in the Y direction. The insulating portion 72A is adjacent to the selector films 61A and 61C in the Y direction. The insulating portion 72A is an example of "a part of a first insulating portion". The second insulating portion 38B includes an insulating portion 72B provided between the word line WLA and the word line WLB in the Y direction. The insulating portion 72B is adjacent to the selector films 61A and 61B in the Y direction. The insulating portion 72B is an example of "a part of a second insulating portion".

Figure 5:
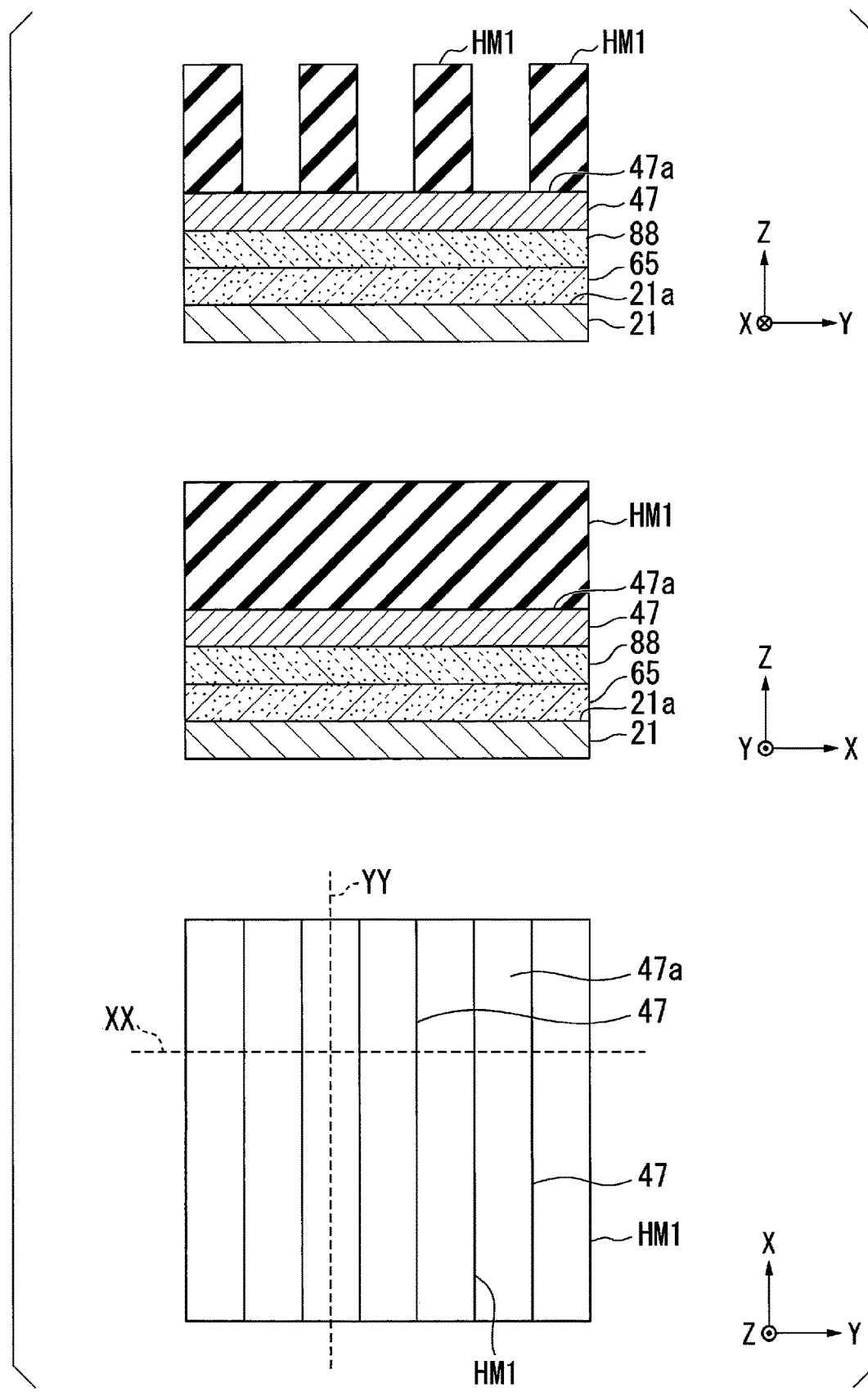
FIG. 5 is a cross-sectional view and a plan view showing an example of a manufacturing step of the plurality of memory cells according to the first embodiment.

Next, a method for manufacturing the memory cell MC of the semiconductor storage device 1 will be briefly described. FIG. 5 shows an example of a manufacturing step of the memory cell MC, and is a cross-sectional view of a stacked body for forming the word line WL and the pillar 35. An upper part of each of FIGS. 5 to 12 is a cross-sectional view of components in each manufacturing step when viewed along the X direction at a position of a line XX shown in a lower part of each drawing. A middle part of each of FIGS. 5 to 12 is a cross-sectional view of the components in each manufacturing step when viewed along the Y direction at a position of a line YY shown in the lower part of each drawing. The lower part of each of FIGS. 5 to 12 is a plan view of the components in each manufacturing step when viewed along the Z direction.

FIG. 5 is a cross-sectional view and a plan view showing an example of the manufacturing step of the memory cell MC, and showing a first hard mask forming step. As shown in FIG. 5, a selector forming film 65, a sacrificial film 88, and a stopper film 47 are stacked, in the Z direction, on a surface 21a of a first conductor 21 extending in the X direction and the Y direction. The first conductor 21 and the stopper film 47 are, for example, tungsten (W). The selector forming film 65 is formed by, for example, a physical vapor deposition (PVD) method. The sacrificial film 88 is formed of, for example, amorphous silicon (aSi). Subsequently, a plurality of hard masks HM1 are formed on a surface 47a of the stopper film 47 at predetermined intervals in the Y direction. The hard mask HM1 is formed of a known resist or the like. A size of each of the plurality of hard masks HM1 in the Y direction is set to be substantially the same as a size of the pillar 35 of the semiconductor storage device 1 in the Y direction.

Figure 6:
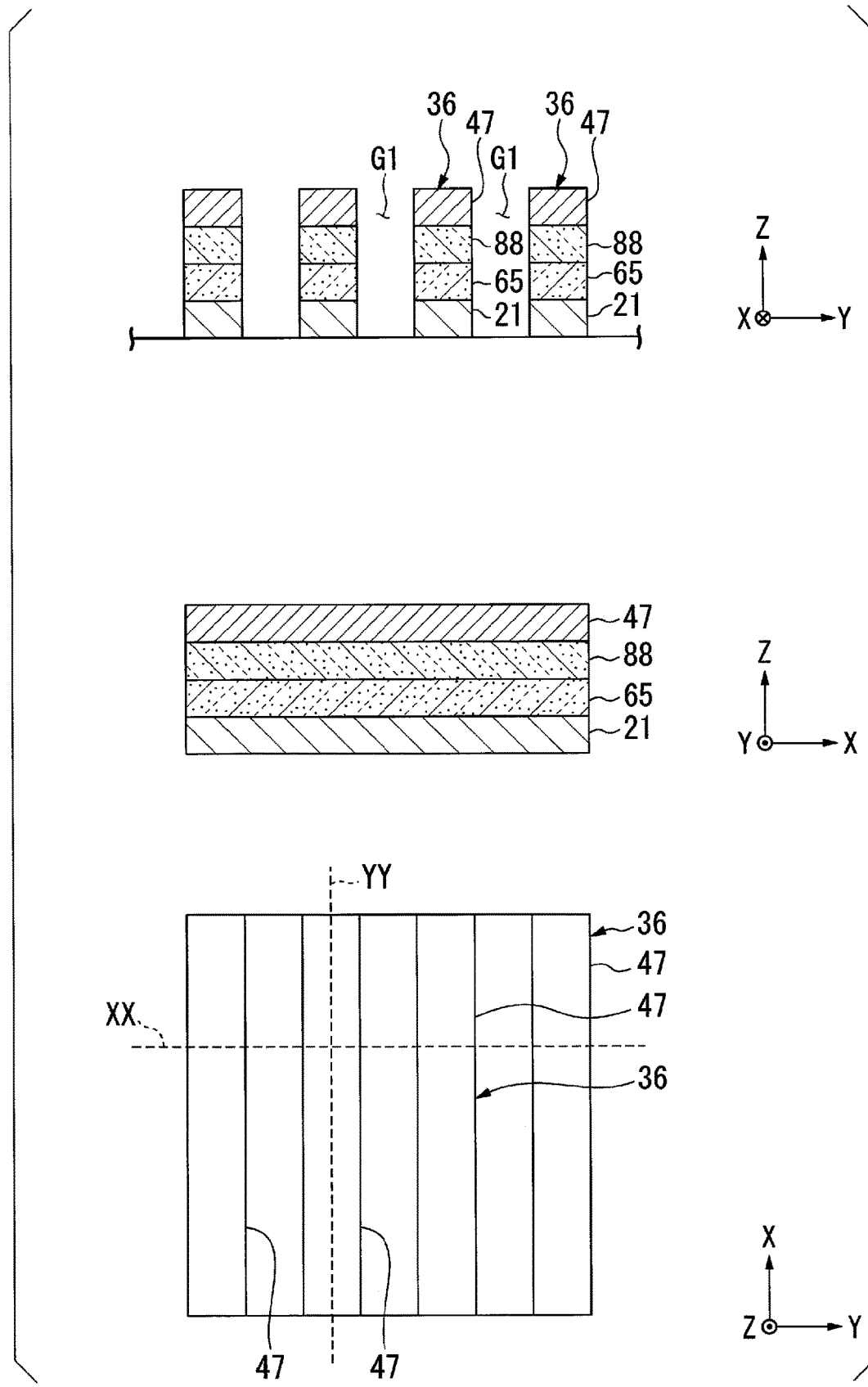
FIG. 6 is a cross-sectional view and a plan view showing an example of the manufacturing step of the plurality of memory cells according to the first embodiment.

FIG. 6 is a cross-sectional view and a plan view showing an example of the manufacturing step of the memory cell MC, and showing a first groove forming step. For example, a groove G1 is formed in the stacked body of the first conductor 21, the selector forming film 65, the sacrificial film 88, and the stopper film 47 where the hard mask HM1 is not formed when viewed from the Z direction by performing patterning. The plurality of grooves G1 extend in the X direction and are formed at intervals in the Y direction. After the formation of the plurality of grooves G1, by removing the remaining hard mask HM1, a plurality of the first conductors 21, the selector forming films 65, the sacrificial films 88, and the stopper films 47 are dividedly present at intervals in the Y direction as shown in FIG. 6. That is, a plurality of pillars 36 are formed in the Y direction.

Figure 7:
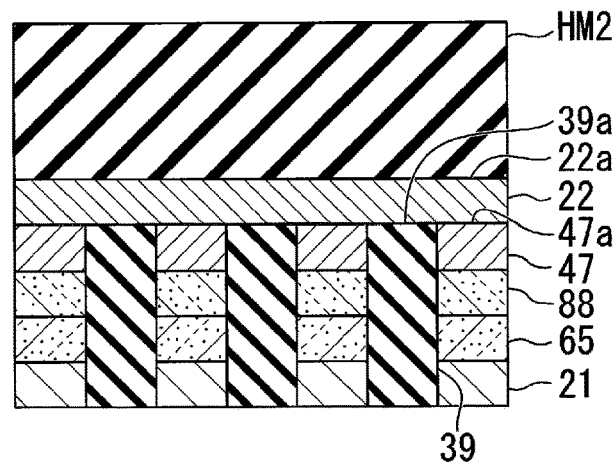
FIG. 7 is a cross-sectional view and a plan view showing an example of the manufacturing step of the plurality of memory cells according to the first embodiment.
Figure 7:
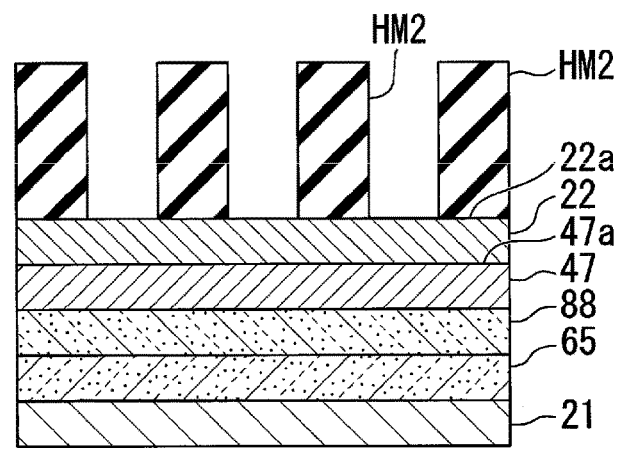
Figure 7:
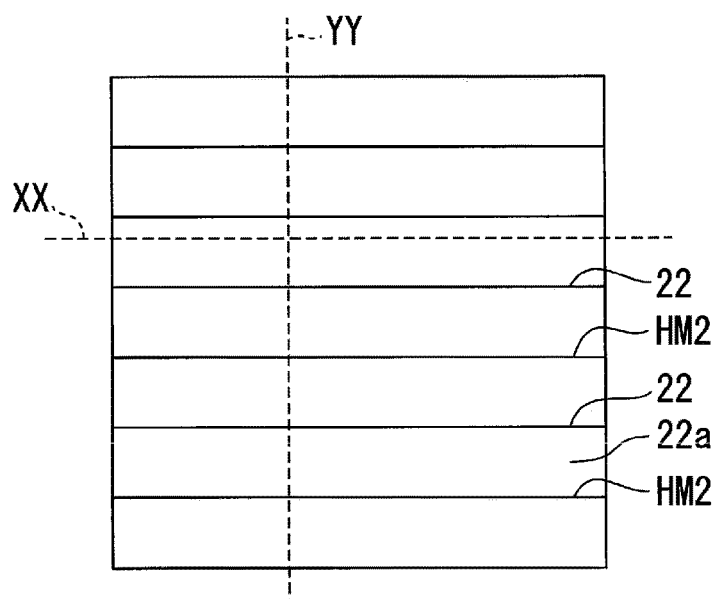

FIG. 7 is a cross-sectional view and a plan view showing an example of the manufacturing step of the memory cell MC, and showing a second hard mask forming step. An insulating film 39 is buried in the groove G1 of the component shown in FIG. 6. The insulating film 39 is formed of, for example, silicon oxide (SiO$_2$). The insulating film 39 buried in the groove G1 is an interlayer insulating portion 38. As shown in FIG. 7, the surface 47a of the stopper film 47 and a surface 39a of the insulating film 39 are located on a same plane.

Subsequently, as shown in FIG. 7, a second conductor 22 is formed on the surface 47a of the stopper film 47 and the surface 39a of the insulating film 39. The second conductor 22 is, for example, tungsten (W). A plurality of hard masks HM2 are formed on a surface 22a of the second conductor 22 at predetermined intervals in the X direction. The hard mask HM2 is formed of a known resist or the like. A size of each of the plurality of hard masks HM2 in the X direction is set to be substantially the same as a size of the pillar 35 of the semiconductor storage device 1 in the X direction.

Figure 8:
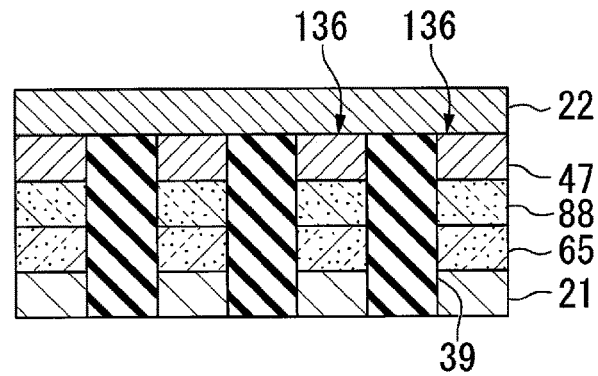
FIG. 8 is a cross-sectional view and a plan view showing an example of the manufacturing step of the plurality of memory cells according to the first embodiment.
Figure 8:
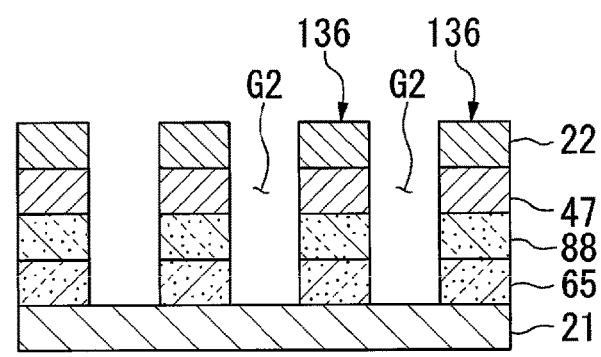
Figure 8:
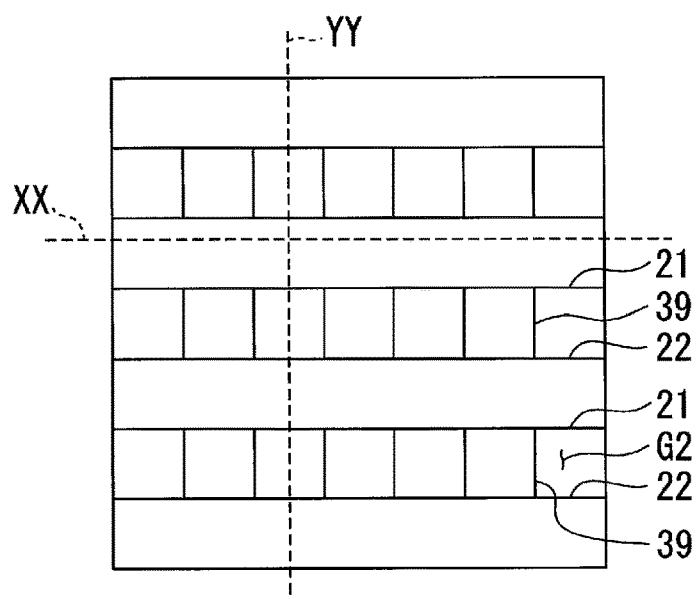

FIG. 8 is a cross-sectional view and a plan view showing an example of the manufacturing step of the memory cell MC, and showing a second groove forming step. For example, a groove G2 is formed in the stacked body of the selector forming film 65, the sacrificial film 88, the stopper film 47, and the second conductor 22 where the hard mask HM2 is not formed when viewed from the Z direction by performing patterning. The plurality of grooves G2 extend in the Y direction and are formed at intervals in the X direction. After the formation of the plurality of grooves G2, by removing the remaining hard mask HM2, a plurality of the selector forming films 65, the sacrificial films 88, the stopper films 47, and the second conductors 22 are dividedly present at intervals in the X direction as shown in FIG. 8. That is, a plurality of pillars 136 are formed in the X direction and the Y direction.

By performing the steps described above, the first conductor 21 is divided in the Y direction, and a plurality of word lines WL are formed in the Y direction. The second conductor 22 is divided in the X direction, and a plurality of bit lines BL are formed in the X direction.

Figure 9:
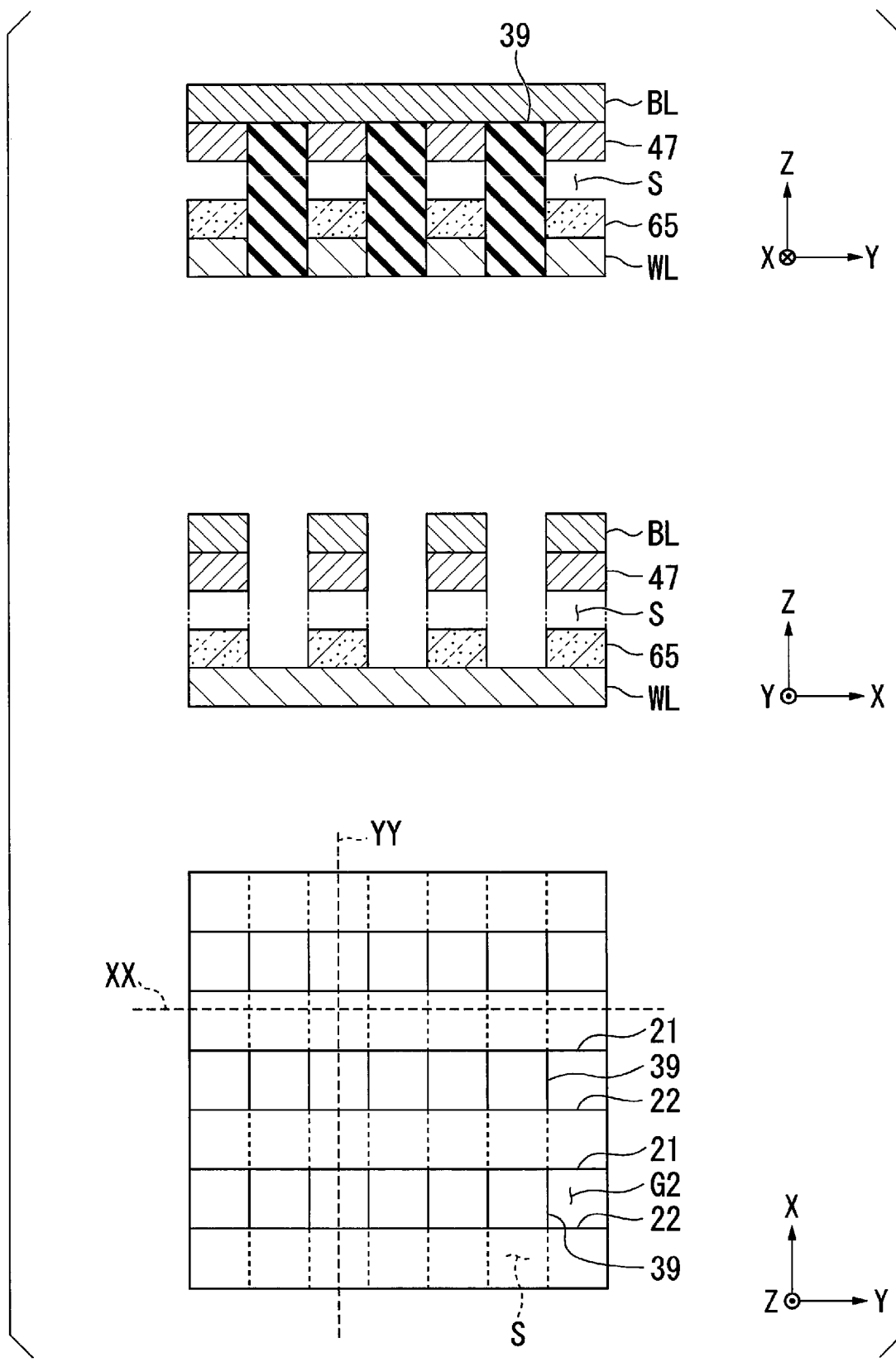
FIG. 9 is a cross-sectional view and a plan view showing an example of the manufacturing step of the plurality of memory cells according to the first embodiment.

FIG. 9 is a cross-sectional view and a plan view showing an example of the manufacturing step of the memory cell MC, and showing a sacrificial film peeling step. For example, only the sacrificial film 88 is removed using a chemical solution. For example, the chemical solution that reacts only with the sacrificial film 88 may be injected into the groove G2, the sacrificial film 88 may be dissolved by the chemical solution, and then the chemical solution may be discharged. As shown in FIG. 9, a space S is formed in a part where the sacrificial film 88 is provided.

Figure 10:
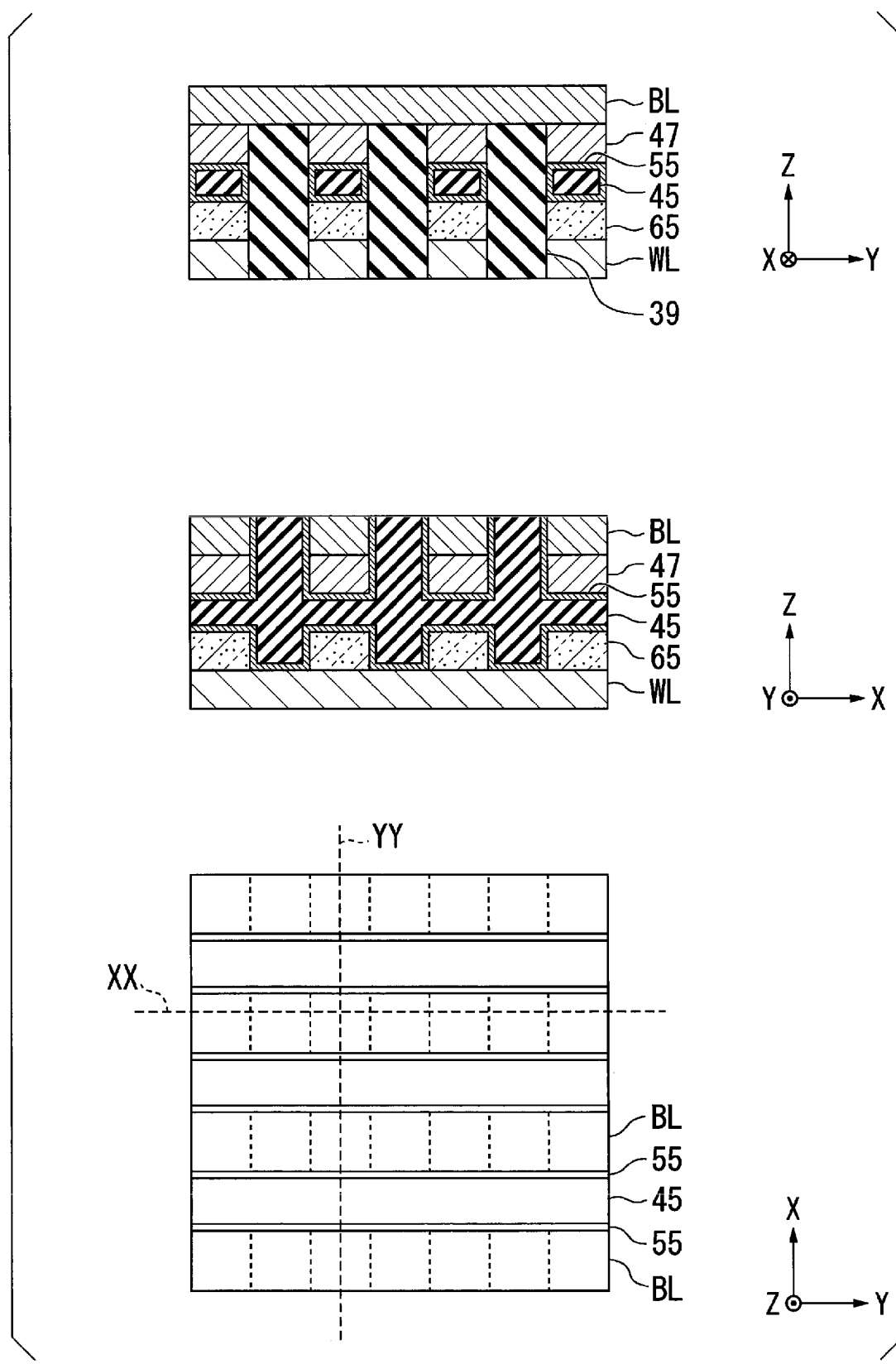
FIG. 10 is a cross-sectional view and a plan view showing an example of the manufacturing step of the plurality of memory cells according to the first embodiment.

FIG. 10 is a cross-sectional view and a plan view showing an example of the manufacturing step of the memory cell MC, and showing a resistance changing film forming step. For example, as shown in FIG. 10, a resistance changing film forming film 55 is formed with a predetermined film thickness on a wall surface communicating with the groove G2 and exposed to the space S using an atomic layer deposition (ALD) method or a chemical vapor deposition (CVD) method. More specifically, the above-described wall surface is a surface of the selector forming film 65 facing the space S, a surface of the stopper film 47, and a side surface of the selector forming film 65, a side surface of the stopper film 47, and a side surface of the second conductor 22 that constitute a side surface of the groove G2. A maximum film thickness of the resistance changing film forming film 55 is, for example, at least equal to or less than 50%, preferably equal to or less than 25%, of the size of the selector forming film 65 in the Y direction.

Subsequently, an insulating film 45 is formed so as to fill a gap of the selector forming film 65. As shown in FIG. 10, when viewed along the X direction, the insulating film 45 is surrounded by the selector forming film 65 in the Y direction and the Z direction.

Figure 11:
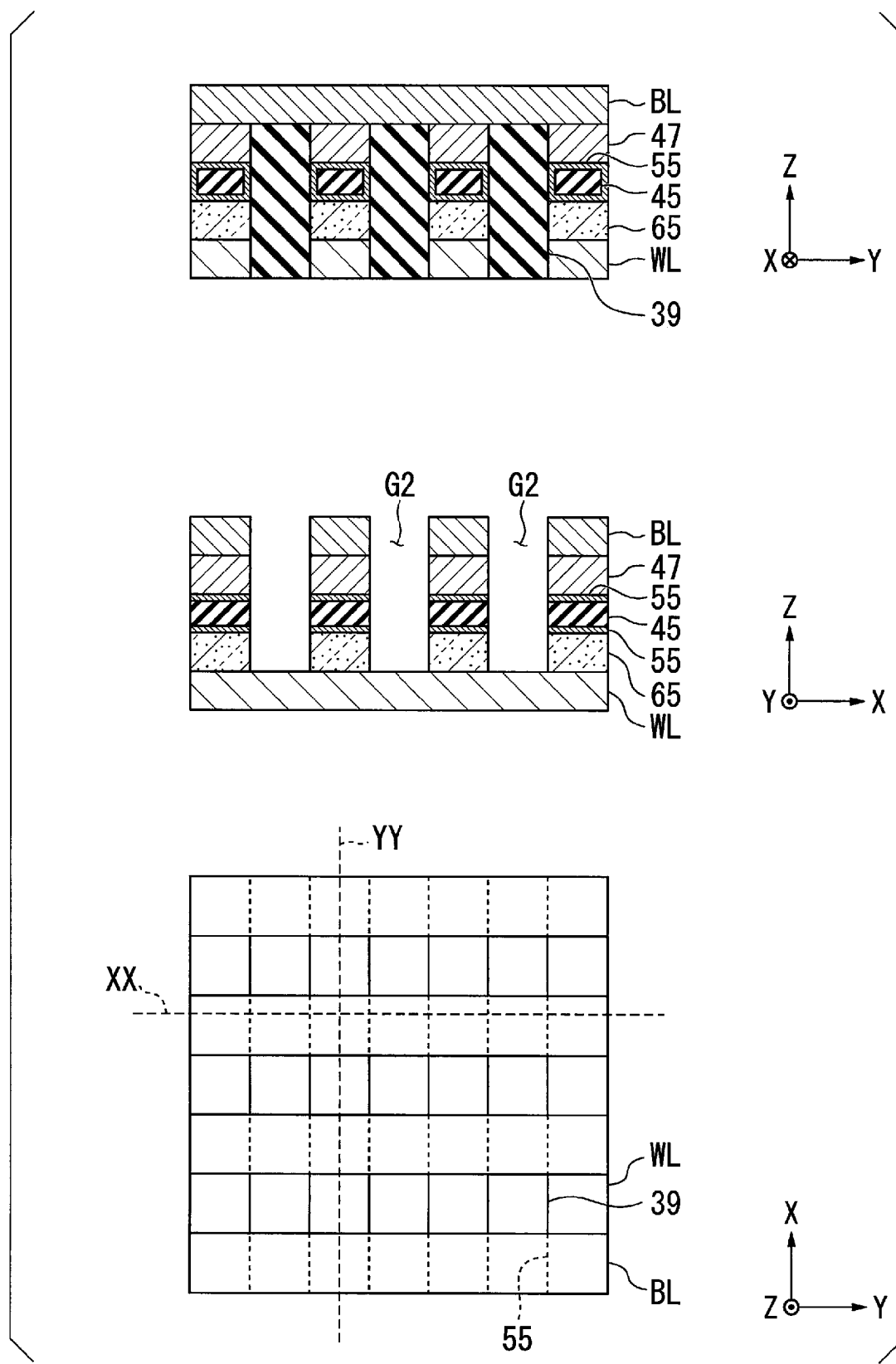
FIG. 11 is a cross-sectional view and a plan view showing an example of the manufacturing step of the plurality of memory cells according to the first embodiment.

FIG. 11 is a cross-sectional view and a plan view showing an example of the manufacturing step of the memory cell MC, and showing a resistance changing film partially removing step. For example, as shown in FIG. 11, only the selector forming film 65 and the insulating film 45 of the groove G2 are removed using a chemical solution or patterning, and only the selector forming film 65 and the insulating film 45 provided in the space S are left. At this time, the groove G2 is exposed again. When viewed along the Y direction, each of the plurality of insulating films 45 is sandwiched between two resistance changing film forming films 55 in the Z direction. The pillar 35 of the semiconductor storage device 1 is formed by removing only the selector forming film 65 and the insulating film 45 of the groove G2.

Figure 12:
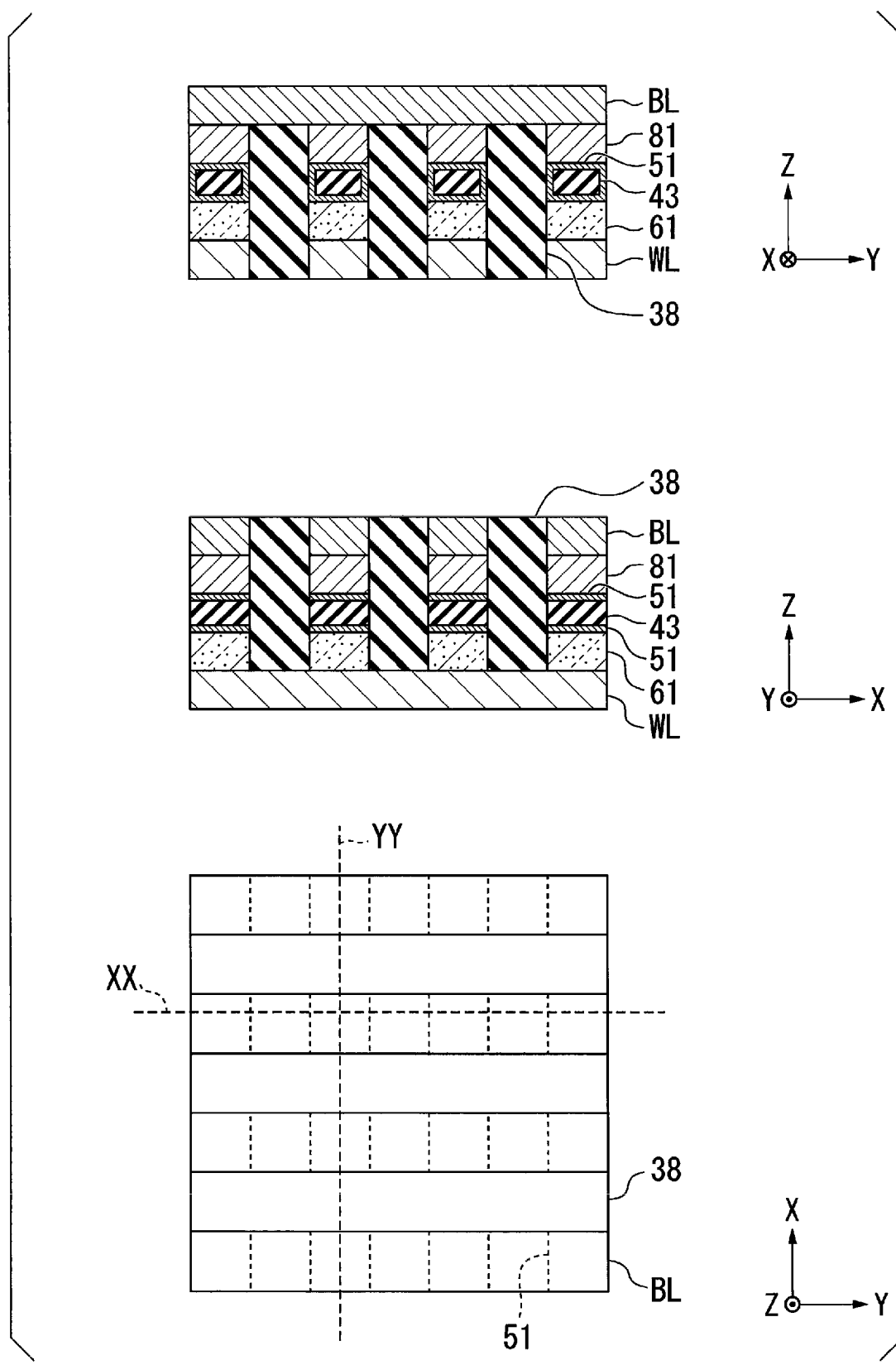
FIG. 12 is a cross-sectional view and a plan view showing an example of the manufacturing step of the plurality of memory cells according to the first embodiment.

FIG. 12 is a cross-sectional view and a plan view showing an example of the manufacturing step of the memory cell MC, and showing an interlayer insulating film forming step. As shown in FIG. 12, the insulating film is buried in the groove G2. The insulating film is formed of the same material as the insulating film 39, and is formed of, for example, silicon oxide (SiO$_2$). Therefore, the insulating film 39 and the above-described insulating film buried in the groove G2 are integrated, and the interlayer insulating portion 38 is formed.

By performing the steps described above, the memory cell MC shown in FIGS. 1 to 3 can be manufactured. The semiconductor storage device 1 is formed by performing a known pretreatment before the steps described above and performing a known posttreatment after the steps described above. However, a method for manufacturing the semiconductor storage device 1 is not limited to the method described above.

Next, an operation effect of the semiconductor storage device 1 according to the first embodiment described above will be described. According to the semiconductor storage device 1, when viewed along the X direction, the thickness of the resistance changing film 51 in contact with the insulating film 43 in the Y direction and the Z direction is smaller than the width of the word line WL in the Y direction and the Z direction. Accordingly, a cross-sectional area of the resistance changing film 51 can be reduced, and reset current for changing the resistance changing film 51 from the low resistance state to the high resistance state in the semiconductor storage device 1 can be reduced.

According to the semiconductor storage device 1, when viewed along the X direction, the resistance changing film 51 is formed to have a same size as the overlapping part CP. When viewed along the X direction, the insulating film 43 is disposed at a central part of the resistance changing film 51 in the Y direction and the Z direction. That is, according to the semiconductor storage device 1, since the resistance changing film 51 is disposed only in a part of the overlapping part CP when viewed from the X direction, the cross-sectional area of the resistance changing film 51 can be reduced as compared with a case where the resistance changing film is formed in a rectangular parallelepiped shape as the entire overlapping part CP in the Y direction and the Z direction as in the semiconductor storage device in the related art. By reducing the cross-sectional area of the resistance changing film 51 when viewed from the Z direction, current density per unit area flowing through the resistance changing film 51, that is, the PCM can be increased, and the reset current of the semiconductor storage device 1 can be reduced.

According to the semiconductor storage device 1, the cross-sectional area of the resistance changing film 51 in the X direction can be reduced to equal to or less than HP×HP by forming the PCM as thin as approximately a film thickness at a time of film formation, and the reset current can be reduced.

(Second Embodiment) Next, a configuration of a semiconductor storage device according to the second embodiment will be described. Although not shown, the semiconductor storage device according to the second embodiment is a so-called cross-point type semiconductor storage device using a PCM similar to the semiconductor storage device 1 according to the first embodiment. The semiconductor storage device according to the second embodiment includes, for example, the silicon substrate 11, the interlayer insulating layer 12, the plurality of word lines WLs, the plurality of bit lines BLs, and the plurality of memory cells MCs. Hereafter, regarding components of the semiconductor storage device according to the second embodiment, only contents different from the components of the semiconductor storage device 1 will be described, and detailed description of contents common to the components of the semiconductor storage device 1 will be omitted.

Figure 13:
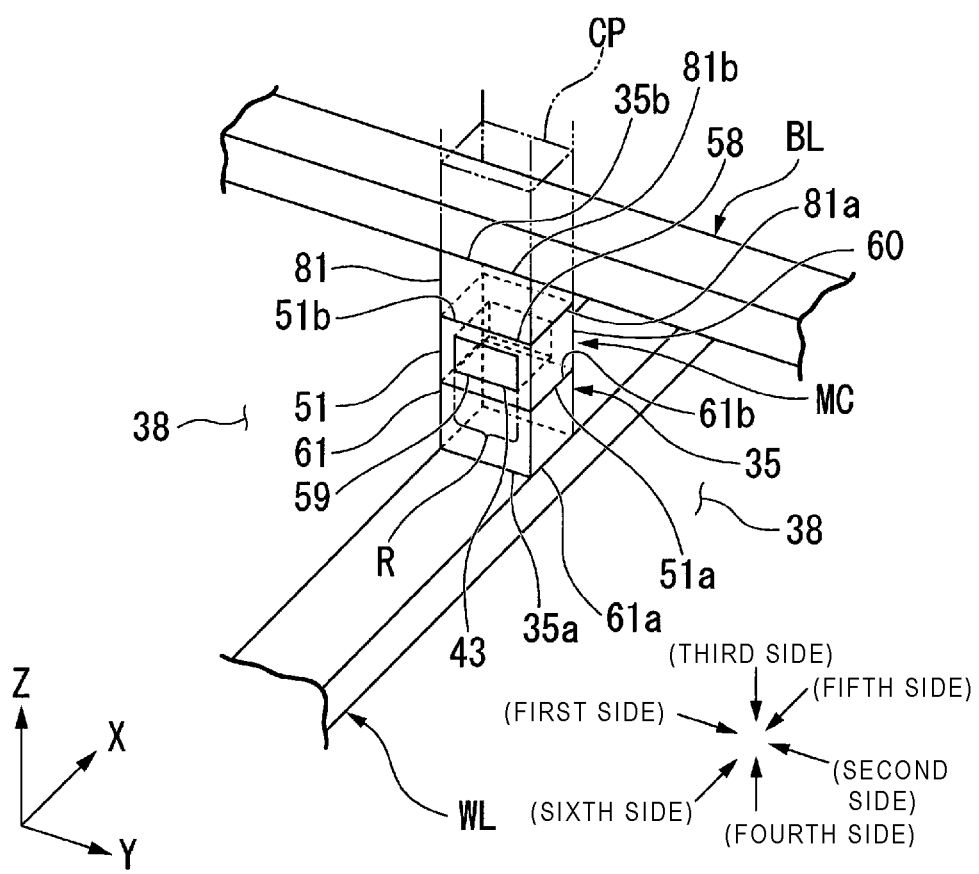
FIG. 13 is a perspective view of one memory cell according to a second embodiment.
Figure 14:
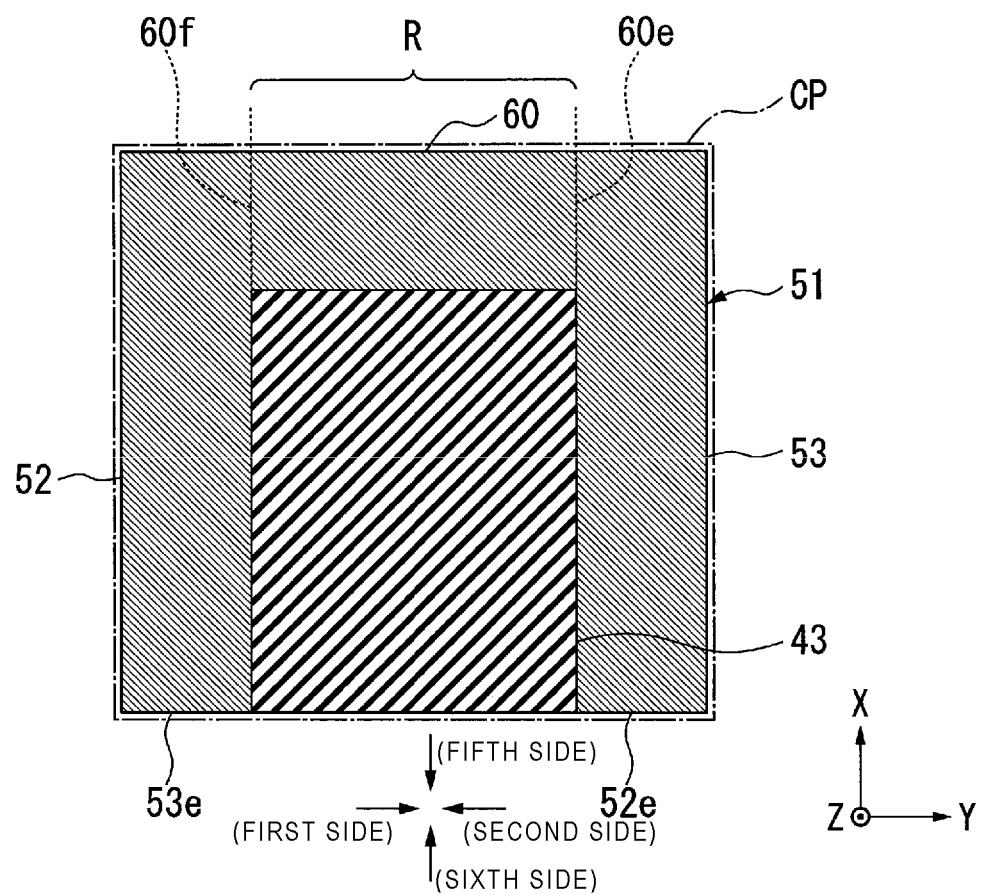
FIG. 14 is a cross-sectional view of a resistance changing film and an insulating film of the one memory cell according to the second embodiment.

FIG. 13 is a perspective view showing one memory cell MC of the semiconductor storage device according to the second embodiment. FIG. 14 is a cross-sectional view of the resistance changing film 51 and the insulating film 43 of the memory cell MC shown in FIG. 13 orthogonal to the Z direction. As shown in FIGS. 13 and 14, the resistance changing film 51 includes a fifth resistance changing portion 60 in addition to the first resistance changing portion 52, the second resistance changing portion 53, the third resistance changing portion 58, and the fourth resistance changing portion 59.

The fifth resistance changing portion 60 is adjacent to the insulating film 43 from a fifth side of the first region R in the X direction. The resistance changing film 51 includes the first resistance changing portion 52, the second resistance changing portion 53, the third resistance changing portion 58, the fourth resistance changing portion 59, and the fifth resistance changing portion 60, and the resistance changing portions are integrally formed.

In one memory cell MC of the semiconductor storage device according to the second embodiment, although the insulating film 43 is in contact with the interlayer insulating portion 38 from the fifth side in the X direction, the insulating film 43 is not in contact with the interlayer insulating portion 38 from a sixth side which is opposite to the fifth side in the X direction. The insulating film 43 is in contact with the fifth resistance changing portion 60 from the sixth side in the X direction and is connected to the interlayer insulating portion 38 via the fifth resistance changing portion 60.

An X-direction minimum width of end surfaces 60e and 60f of the fifth resistance changing portion 60 in the Y direction is smaller than an X-direction minimum length of the overlapping part CP and smaller than a Y-direction minimum width of the word line WL. When the resistance changing film 51 is formed as described below, the minimum width of the end surfaces 60e and 60f of the fifth resistance changing portion 60 in the X direction is, for example, equal to or more than 5 μm.

Next, a method for manufacturing the memory cell MC of the semiconductor storage device according to the second embodiment will be briefly described. The memory cell MC of the semiconductor storage device according to the second embodiment can be manufactured by performing similar steps as the method for manufacturing the semiconductor storage device 1 from the first hard mask forming step shown in FIG. 5 to the second groove forming step shown in FIG. 8.

An upper part of each of FIGS. 15 to 21 is a cross-sectional view of components in each manufacturing step when viewed along the X direction at a position of a line XX shown in a lower part of each drawing. A middle part of each of FIGS. 15 to 21 is a cross-sectional view of the components in each manufacturing step when viewed along the Y direction at a position of a line YY shown in the lower part of each drawing. The lower part of each of FIGS. 15 to 21 is a plan view of the components in each manufacturing step when viewed along the Z direction.

Figure 15:
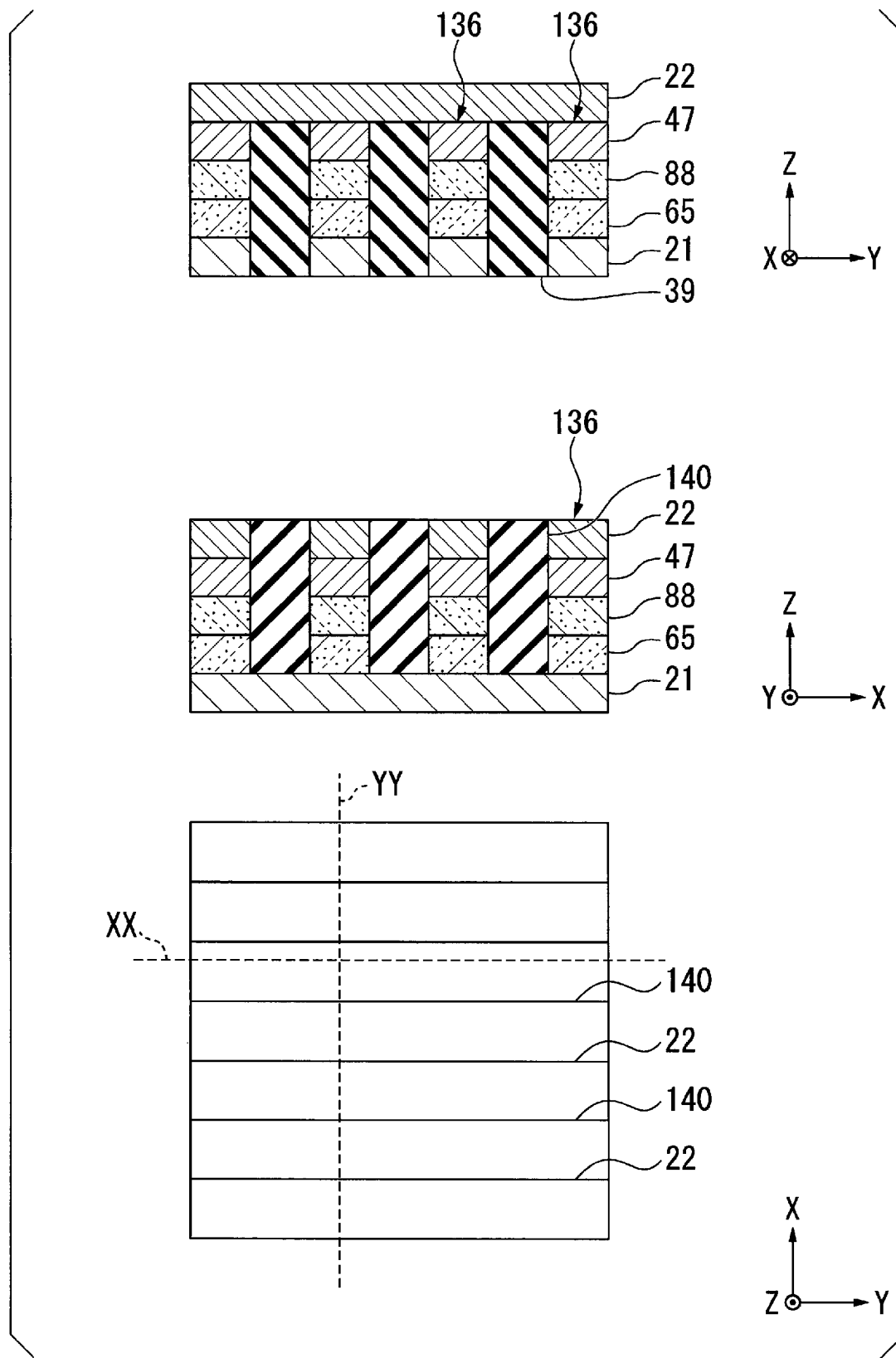
FIG. 15 is a cross-sectional view and a plan view showing an example of a manufacturing step of a plurality of memory cells according to the second embodiment.

FIG. 15 is a cross-sectional view and a plan view showing an example of the manufacturing step of the memory cell MC, and showing an insulating film forming step. After the second groove forming step shown in FIG. 8, an insulating film 140 is buried in the groove G2 using, for example, the ALD method or the CVD method, as shown in FIG. 15. The insulating film 140 is formed of, for example, silicon nitride (SiN).

Figure 16:
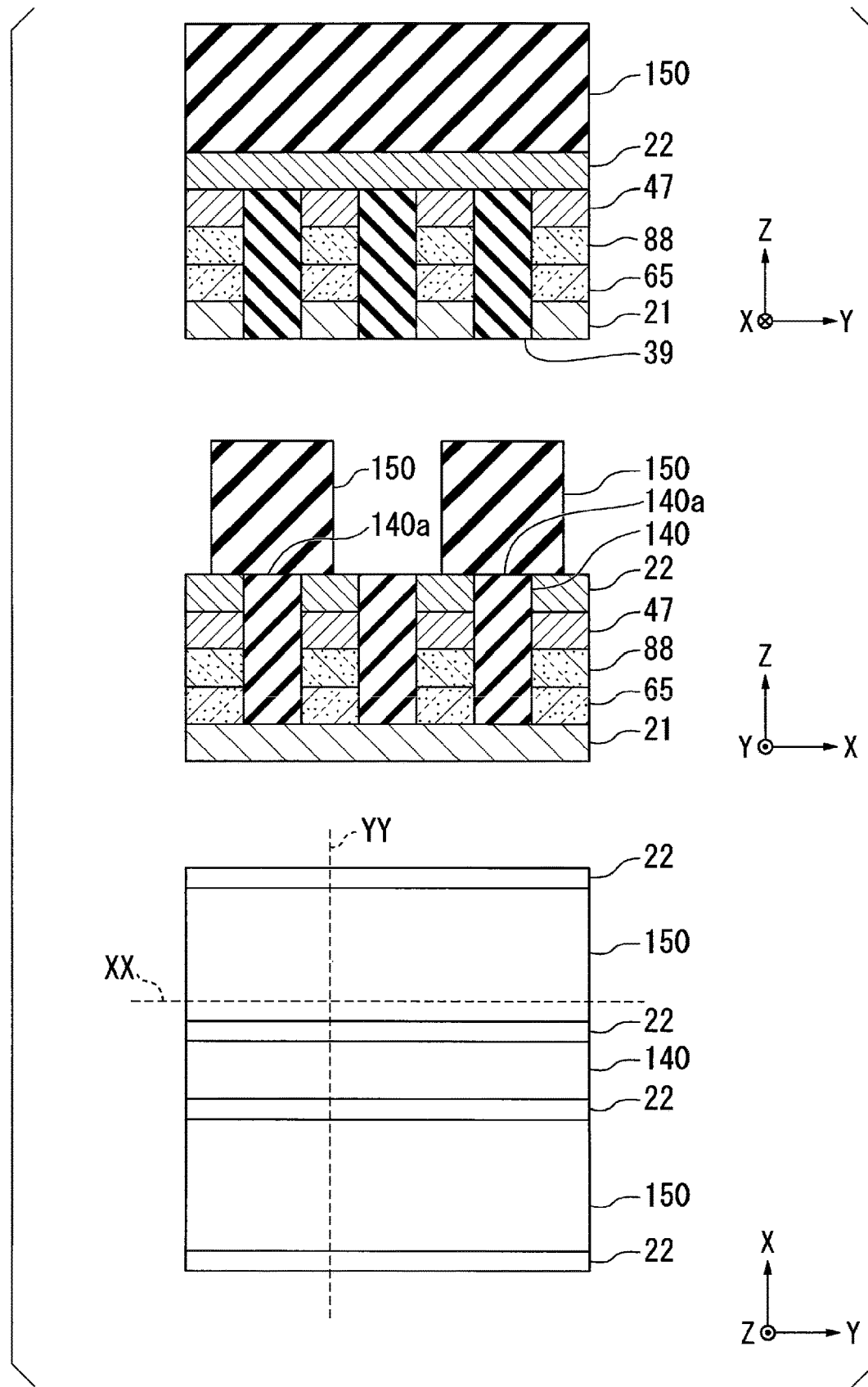
FIG. 16 is a cross-sectional view and a plan view showing an example of the manufacturing step of the plurality of memory cells according to the second embodiment.

FIG. 16 is a cross-sectional view and a plan view showing an example of the manufacturing step of the memory cell MC, and showing a resist film forming step. As shown in FIG. 16, a resist film 150 is formed on surfaces 140a of every other insulating film 140 among the plurality of insulating films 140 formed in the X direction, and only a part of the surfaces 22a of the second conductor 22 adjacent to the surfaces 140a in the X direction. The resist film 150 extends in the Y direction.

Figure 17:
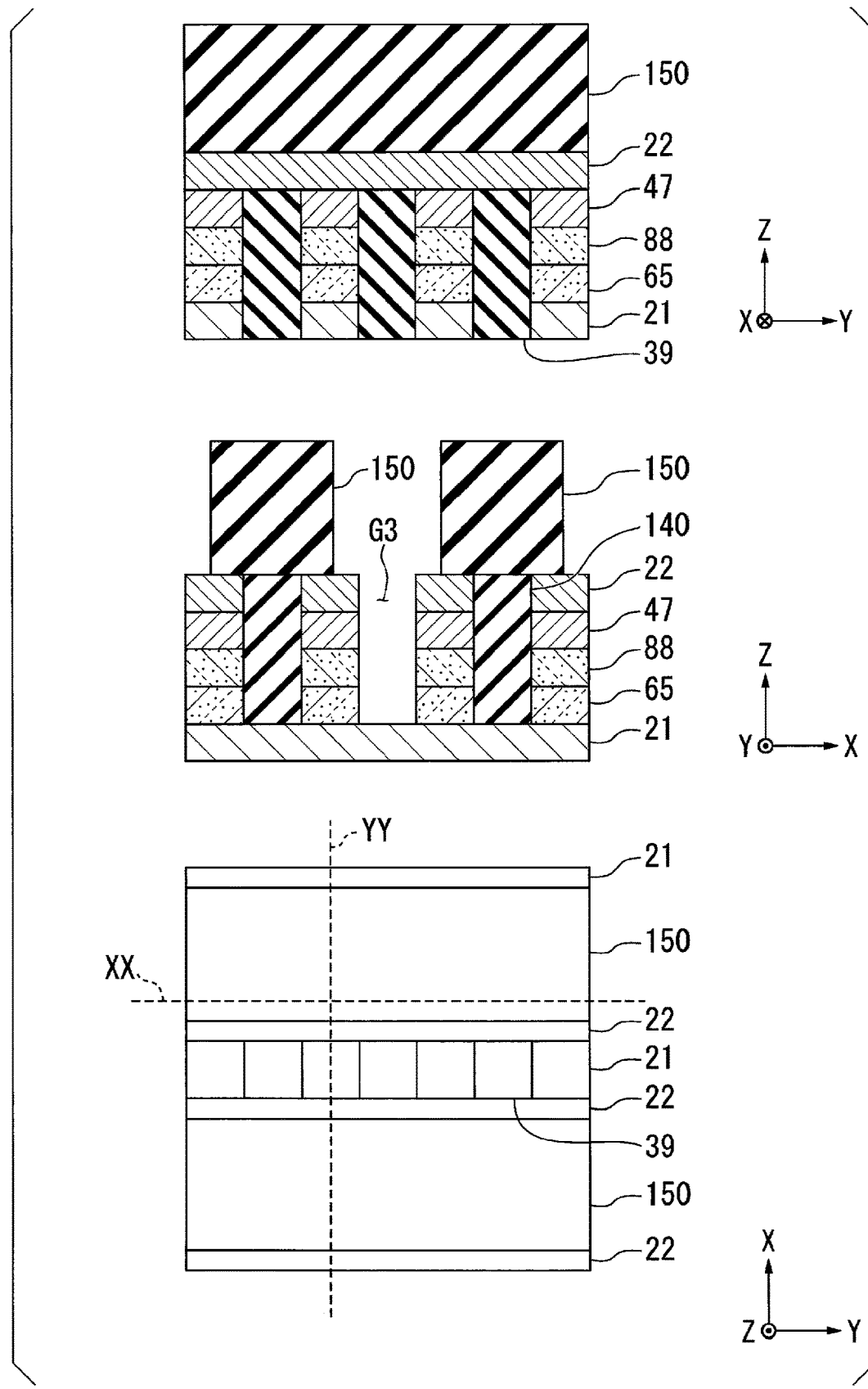
FIG. 17 is a cross-sectional view and a plan view showing an example of the manufacturing step of the plurality of memory cells according to the second embodiment.

FIG. 17 is a cross-sectional view and a plan view showing an example of the manufacturing step of the memory cell MC, and showing a patterning step. Using the resist film 150 as a mask, as shown in FIG. 17, the insulating film 140 not covered with the resist film 150 when viewed from the Z direction is removed. Since the insulating film 140 is removed, a groove G3 is formed.

Figure 18:
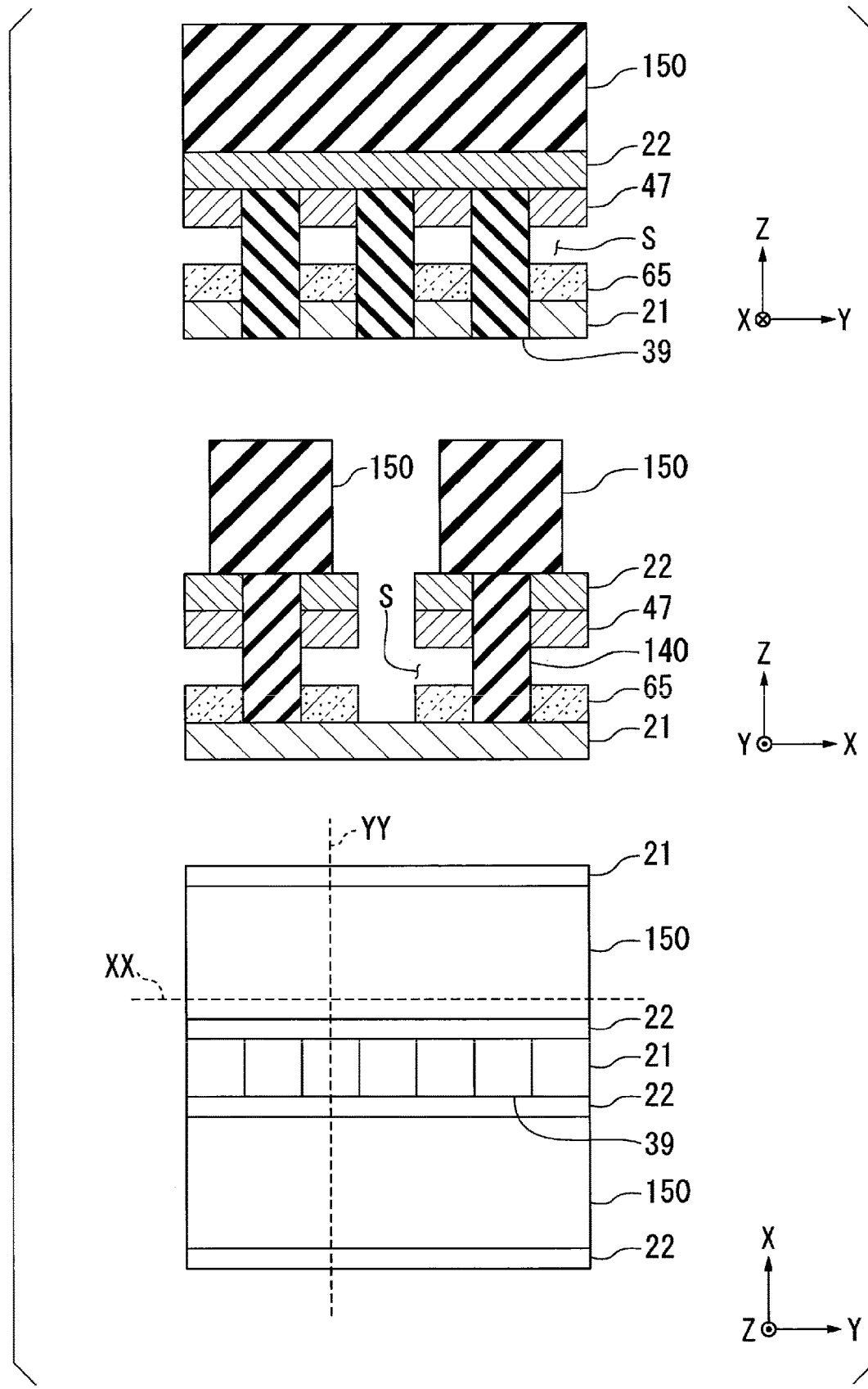
FIG. 18 is a cross-sectional view and a plan view showing an example of the manufacturing step of the plurality of memory cells according to the second embodiment.

FIG. 18 is a cross-sectional view and a plan view showing an example of the manufacturing step of the memory cell MC, and showing a sacrificial film removing step. For example, only the sacrificial film 88 is removed using a chemical solution. For example, the chemical solution that reacts only with the sacrificial film 88 may be injected into the groove G3, the sacrificial film 88 may be dissolved by the chemical solution, and then the chemical solution may be discharged. As shown in FIG. 18, the space S is formed in a part where the sacrificial film 88 is provided.

Figure 19:
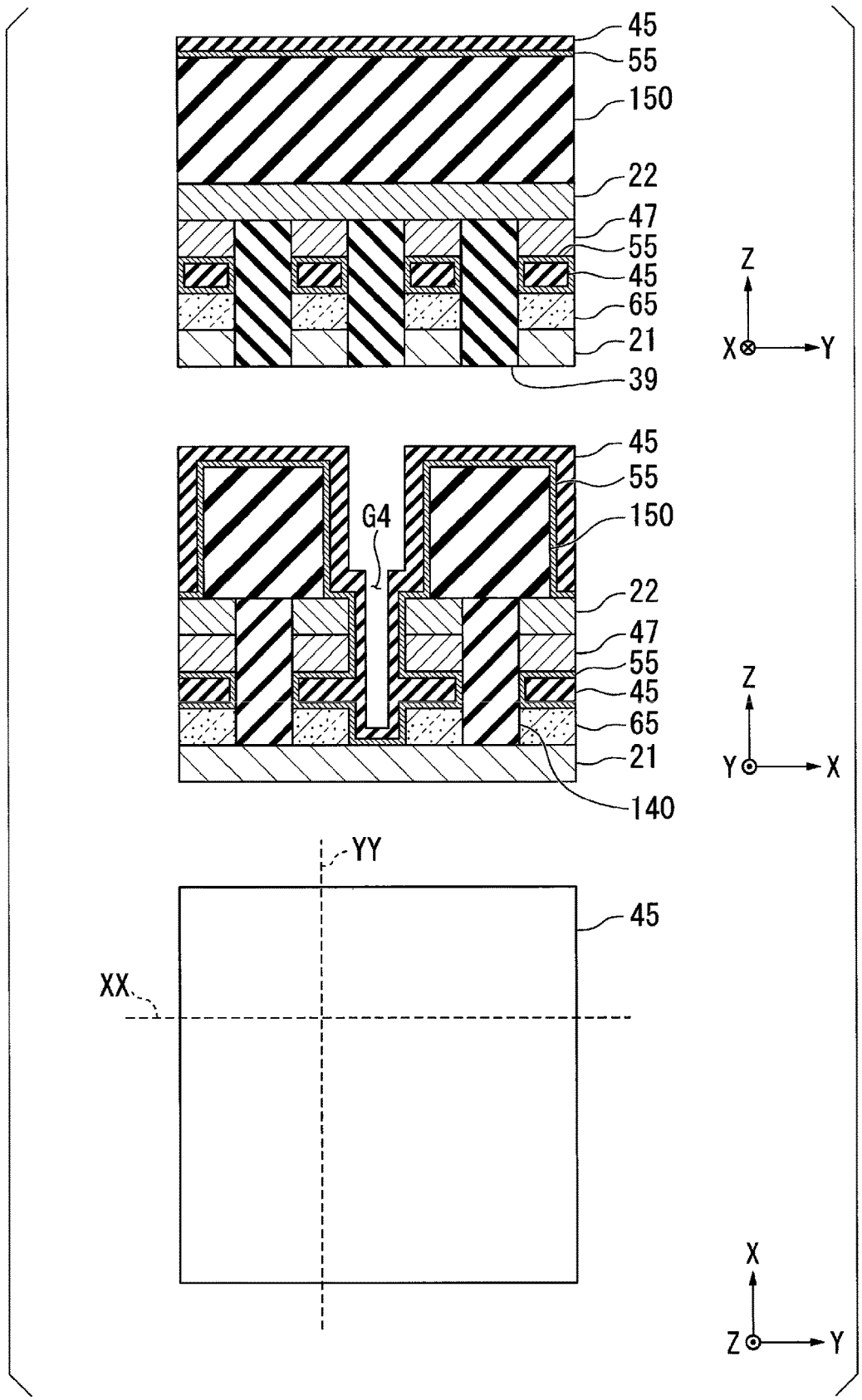
FIG. 19 is a cross-sectional view and a plan view showing an example of the manufacturing step of the plurality of memory cells according to the second embodiment.

FIG. 19 is a cross-sectional view and a plan view showing an example of the manufacturing step of the memory cell MC, and showing a resistance changing film forming step. For example, as shown in FIG. 19, the resistance changing film forming film 55 is formed with a predetermined film thickness on a wall surface communicating with the groove G3 and exposed to the space S using the ALD method or the CVD method. More specifically, the above-described wall surface is the surface of the selector forming film 65 facing the space S, the surface of the stopper film 47, a side surface of the insulating film 140, and the side surface of the selector forming film 65, the side surface of the stopper film 47, and the side surface of the second conductor 22 that constitute the side surface of the groove G2. The maximum film thickness of the resistance changing film forming film 55 is, for example, at least equal to or less than 50%, preferably equal to or less than 25%, of the size of the selector forming film 65 in the Y direction.

Figure 20:
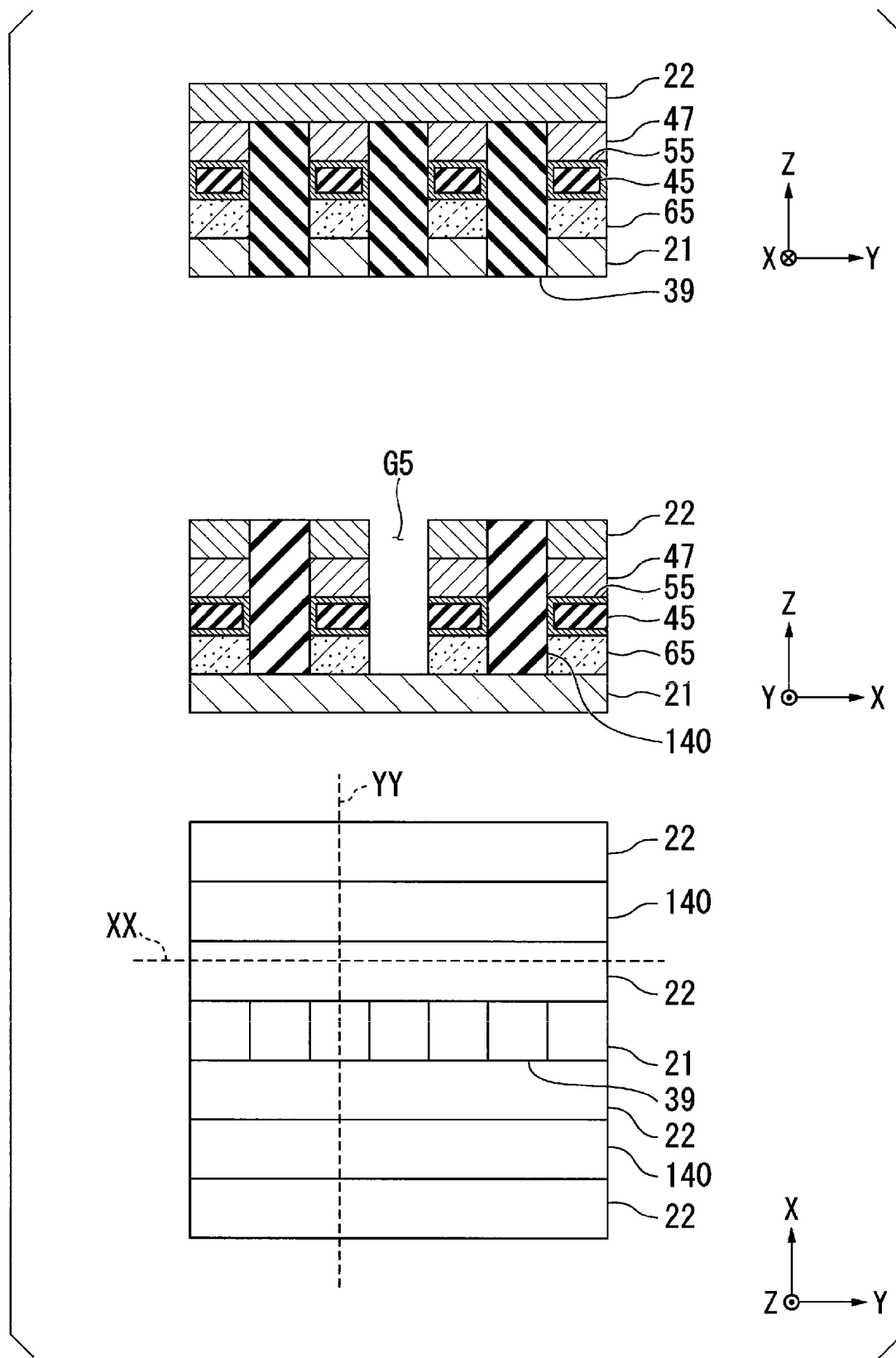
FIG. 20 is a cross-sectional view and a plan view showing an example of the manufacturing step of the plurality of memory cells according to the second embodiment.

FIG. 20 is a cross-sectional view and a plan view showing an example of the manufacturing step of the memory cell MC, and showing a resistance changing film partially removing step. For example, as shown in FIG. 20, using a chemical mechanical polishing (CMP) method, the insulating film 140 is removed, and the insulating film 45, the resistance changing film forming film 55, and the resist film 150 are removed up to a position where the second conductor 22 starts to be exposed in the Z direction. Thereafter, the insulating film 45 and the resistance changing film forming film 55 that are exposed and formed on a side surface of a groove G4 between the insulating films 140 in the X direction are removed using, for example, a chemical solution or patterning. At this time, the insulating film 45 and the resistance changing film forming film 55 formed in the space S remain.

Figure 21:
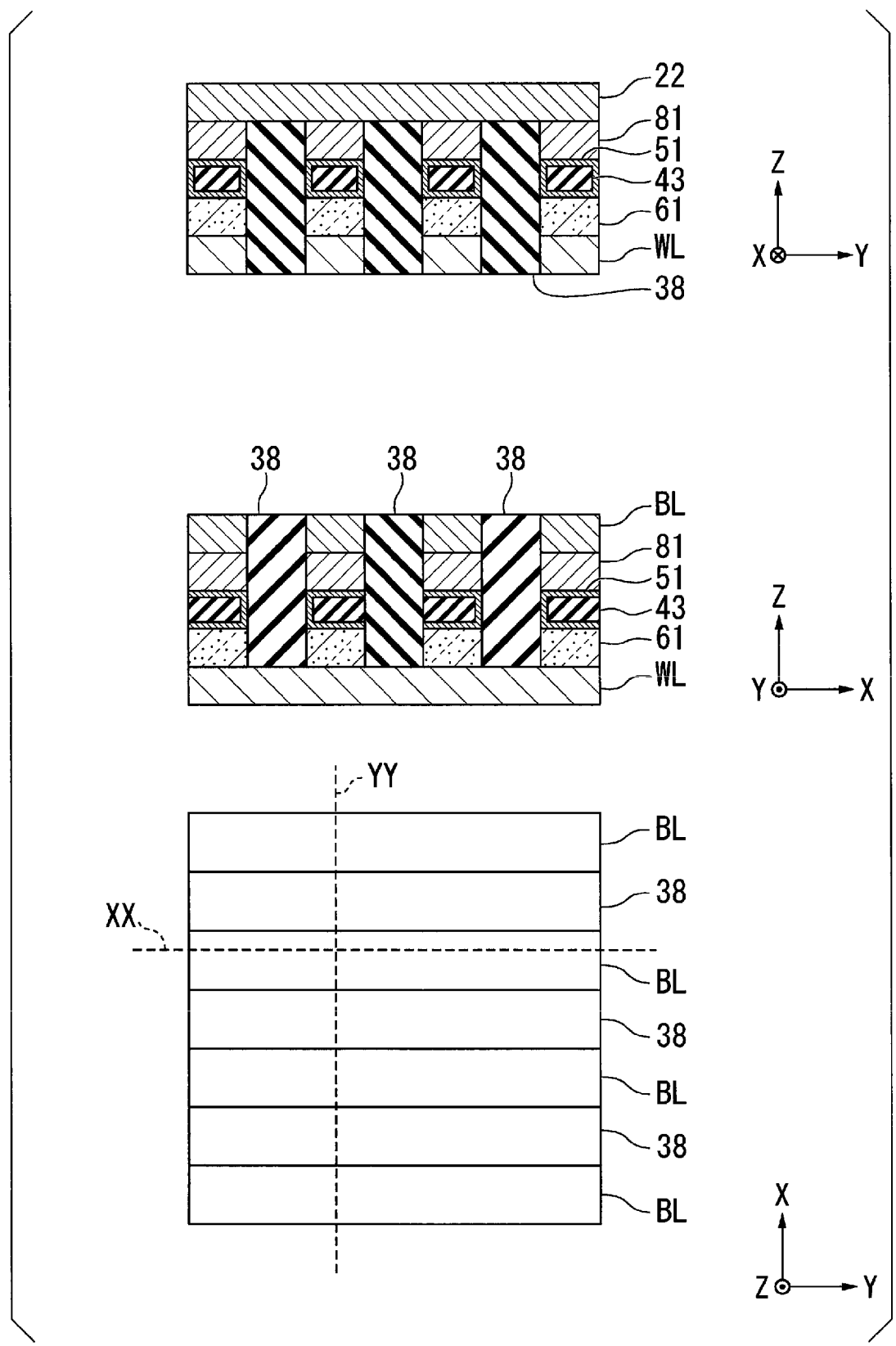
FIG. 21 is a cross-sectional view and a plan view showing an example of the manufacturing step of the plurality of memory cells according to the second embodiment.

FIG. 21 is a cross-sectional view and a plan view showing an example of the manufacturing step of the memory cell MC, and showing an interlayer insulating film adding step. For example, an insulating film 142 is buried in a groove G5 by the ALD method or the CVD method. The insulating film 142 is formed of, for example, silicon oxide ($SiO_2$). By performing the steps described above, as shown in FIG. 21, the pillar 35 of the semiconductor storage device according to the second embodiment is formed. In the method for manufacturing the semiconductor storage device according to the second embodiment, the resistance changing film forming film 55 serving as the fifth resistance changing portion 60 is in contact with the insulating film 140 in the X direction. The interlayer insulating portion 38 includes the insulating film 140 formed of silicon nitride or the like, and the insulating films 39 and 142 formed of silicon oxide or the like.

By performing the steps described above, the memory cell MC shown in FIGS. 13 and 14 can be manufactured. The semiconductor storage device according to the second embodiment is formed by performing a known pretreatment before the steps described above and performing a known posttreatment after the steps described above. However, a method for manufacturing the semiconductor storage device according to the second embodiment is not limited to the method described above.

Next, an operation effect of the semiconductor storage device according to the second embodiment described above will be described. According to the semiconductor storage device according to the second embodiment, when viewed along the X direction, the thickness of the resistance changing film 51 in contact with the insulating film 43 in the Y direction and the Z direction is smaller than the width of the word line WL in the Y direction and the Z direction. Accordingly, similar to the semiconductor storage device 1 according to the first embodiment, a cross-sectional area of the resistance changing film 51 can be reduced, and the reset current for changing the resistance changing film 51 from the low resistance state to the high resistance state in the semiconductor storage device 1 can be reduced.

A similar operation effect as that of the semiconductor storage device 1 can be attained since the semiconductor storage device according to the second embodiment has a similar configuration as that of the semiconductor storage device 1.

According to the semiconductor storage device according to the second embodiment, since the resistance changing film 51 further includes the fifth resistance changing portion 60, a removal rate and a condition of the resistance changing film forming film 55 can be kept constant and a variation in removal amount of the resistance changing film forming film 55 can be prevented in the resistance changing film partially removing step at the time of manufacturing. Accordingly, electrical characteristics of the semiconductor storage device according to the second embodiment can be improved, and a variation in performance of each device can be prevented.

(Third Embodiment) Next, a configuration of a semiconductor storage device according to the third embodiment will be described. Although not shown, the semiconductor storage device according to the third embodiment is a so-called cross-point type semiconductor storage device using a PCM similar to the semiconductor storage device 1 according to the first embodiment. The semiconductor storage device according to the third embodiment includes, for example, the silicon substrate 11, the interlayer insulating layer 12, the plurality of word lines WLs, the plurality of bit lines BLs, and the plurality of memory cells MCs. Hereafter, regarding components of the semiconductor storage device according to the third embodiment, only contents different from the components of the semiconductor storage device 1 will be described, and detailed description of contents common to the components of the semiconductor storage device 1 will be omitted.

Figure 22:
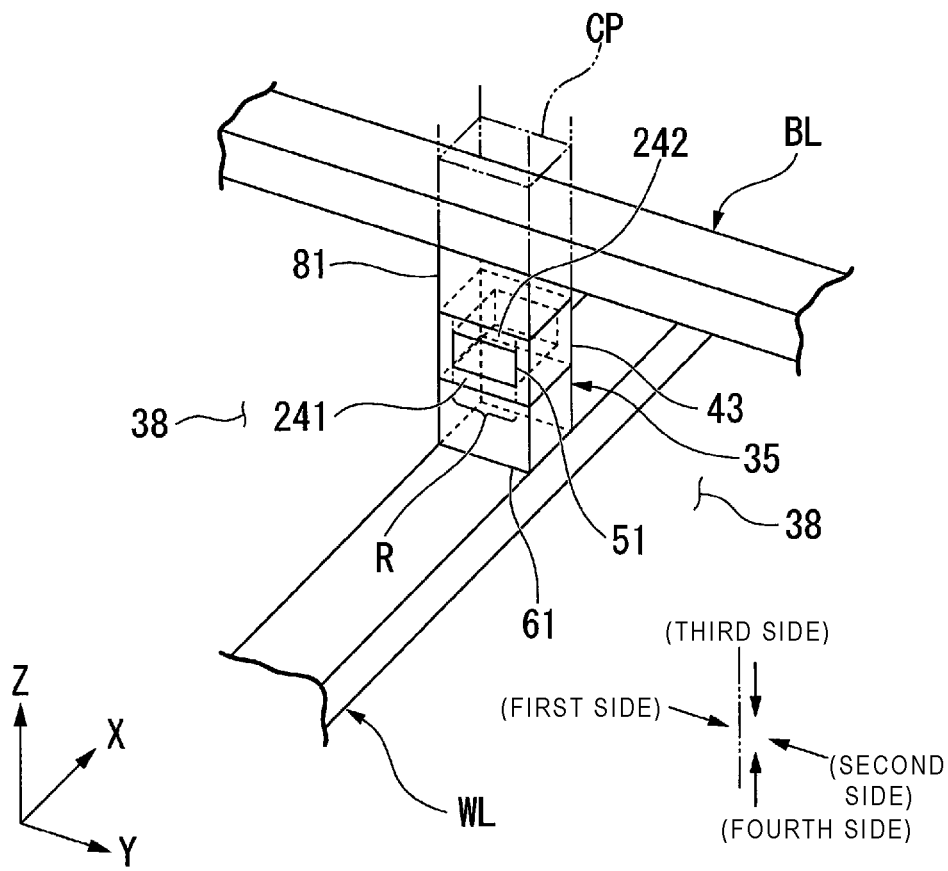
FIG. 22 is a perspective view of one memory cell according to a third embodiment.
Figure 23:
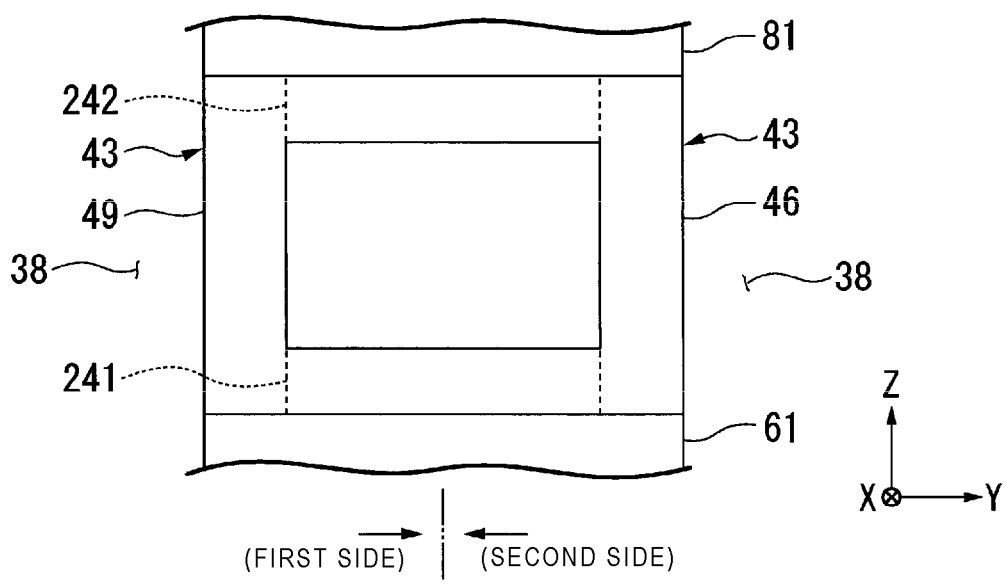
FIG. 23 is a cross-sectional view of a resistance changing film and an insulating film of the one memory cell according to the third embodiment.

FIG. 22 is a perspective view showing one memory cell MC of the semiconductor storage device according to the third embodiment. FIG. 23 is an enlarged side view showing the relative arrangement of the resistance changing film 51 and the insulating film 43 of the memory cell MC. As shown in FIGS. 22 and 23, each memory cell MC of the semiconductor memory device according to the third embodiment includes, for example, the conductive film 81, the resistance changing film 51, the insulating film 43, and the selector film 61, similar to each memory cell MC of the semiconductor storage device 1 according to the first embodiment. However, relative locations of the resistance changing film 51 and the insulating film 43 of each memory cell MC of the semiconductor storage device according to the third embodiment are opposite to relative locations of the resistance changing film 51 and the insulating film 43 of each memory cell MC of the semiconductor storage device 1. That is, basically, in the description of the semiconductor storage device 1 according to the first embodiment, the resistance changing film 51 in the memory cell MC can be replaced and read as the insulating film 43, and the insulating film 43 in the memory cell MC can be replaced and read as the resistance changing film 51.

When viewed from the Z direction, the resistance changing film 51 is disposed in the first region R of the overlapping region CP in the Y direction. The insulating film 43 includes at least a first adjacent insulating portion 46 and a second adjacent insulating portion 49. The resistance changing film 51 is adjacent to the first adjacent insulating portion 46 and the second adjacent insulating portion 49 in the Y direction, and is interposed between the first adjacent insulating portion 46 and the second adjacent insulating portion 49. When viewed from the X direction, the resistance changing film 51 is surrounded by the insulating film 43 and is buried in the central part of the first region R.

However, in the third embodiment, insulation of the selector film 61 with the resistance changing film 51 is broken. That is, in the Z direction, an insulation breaking portion 241 is provided between the selector film 61 and the resistance changing film 51. Insulation of the conductive film 81 with the resistance changing film 51 is broken. That is, in the Z direction, an insulation breaking portion 242 is provided between the conductive film 81 and the resistance changing film 51.

Next, a method for manufacturing the memory cell MC of the semiconductor storage device according to the third embodiment will be briefly described. However, a method for manufacturing the memory cell MC stacked in the Z direction will be described in the following description. The memory cell MC of the semiconductor storage device according to the third embodiment can be manufactured by performing similar steps as the method for manufacturing the semiconductor storage device 1 from the first hard mask forming step shown in FIG. 5 to the first groove forming step shown in FIG. 6.

An upper part of each of FIGS. 24 to 35 is a cross-sectional view of components in each manufacturing step when viewed along the X direction at a position of a line XX shown in a lower part of each drawing. A middle part of each of FIGS. 24 to 35 is a cross-sectional view of the components in each manufacturing step when viewed along the Y direction at a position of a line YY shown in the lower part of each drawing. The lower part of each of FIGS. 24 to 35 is a plan view of the components in each manufacturing step when viewed along the Z direction.

Figure 24:
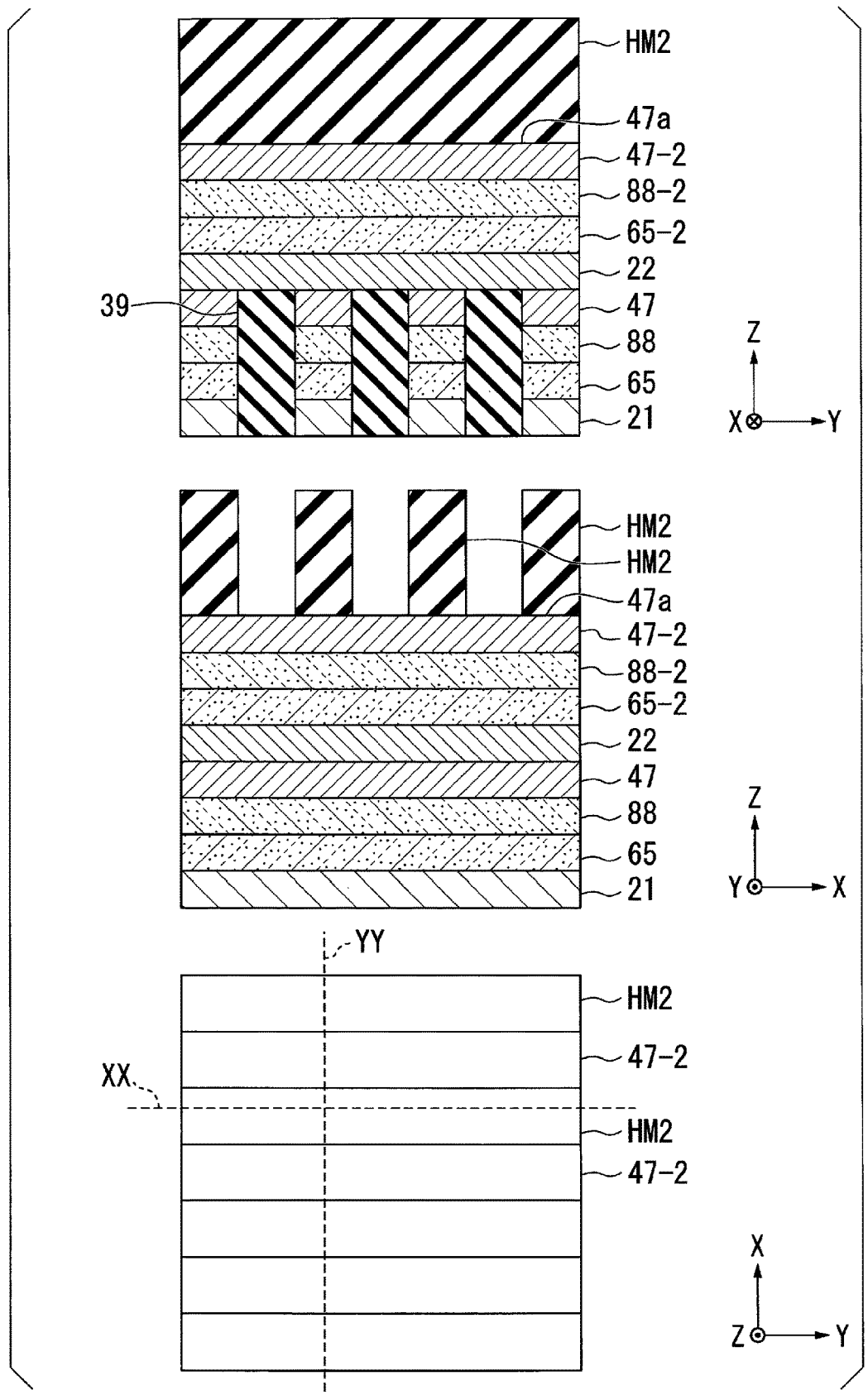
FIG. 24 is a cross-sectional view and a plan view showing an example of a manufacturing step of a plurality of memory cells according to the third embodiment.

FIG. 24 is a cross-sectional view and a plan view showing an example of the manufacturing step of the memory cell MC and showing a second hard mask forming step. As shown in FIG. 24, after the insulating film 39 is buried in the groove G1, the second conductor 22, a selector forming film 65-2, a sacrificial film 88-2, and a stopper film 47-2 are sequentially stacked on the surface 47a of the stopper film 47 and the surface 39a of the insulating film 39. A plurality of hard masks HM2 are formed on the surface 47a of the stopper film 47-2 at predetermined intervals in the X direction. A size of each of the plurality of hard masks HM2 in the X direction is set to be substantially the same as the size of the pillar 35 of the semiconductor storage device 1 in the X direction.

Figure 25:
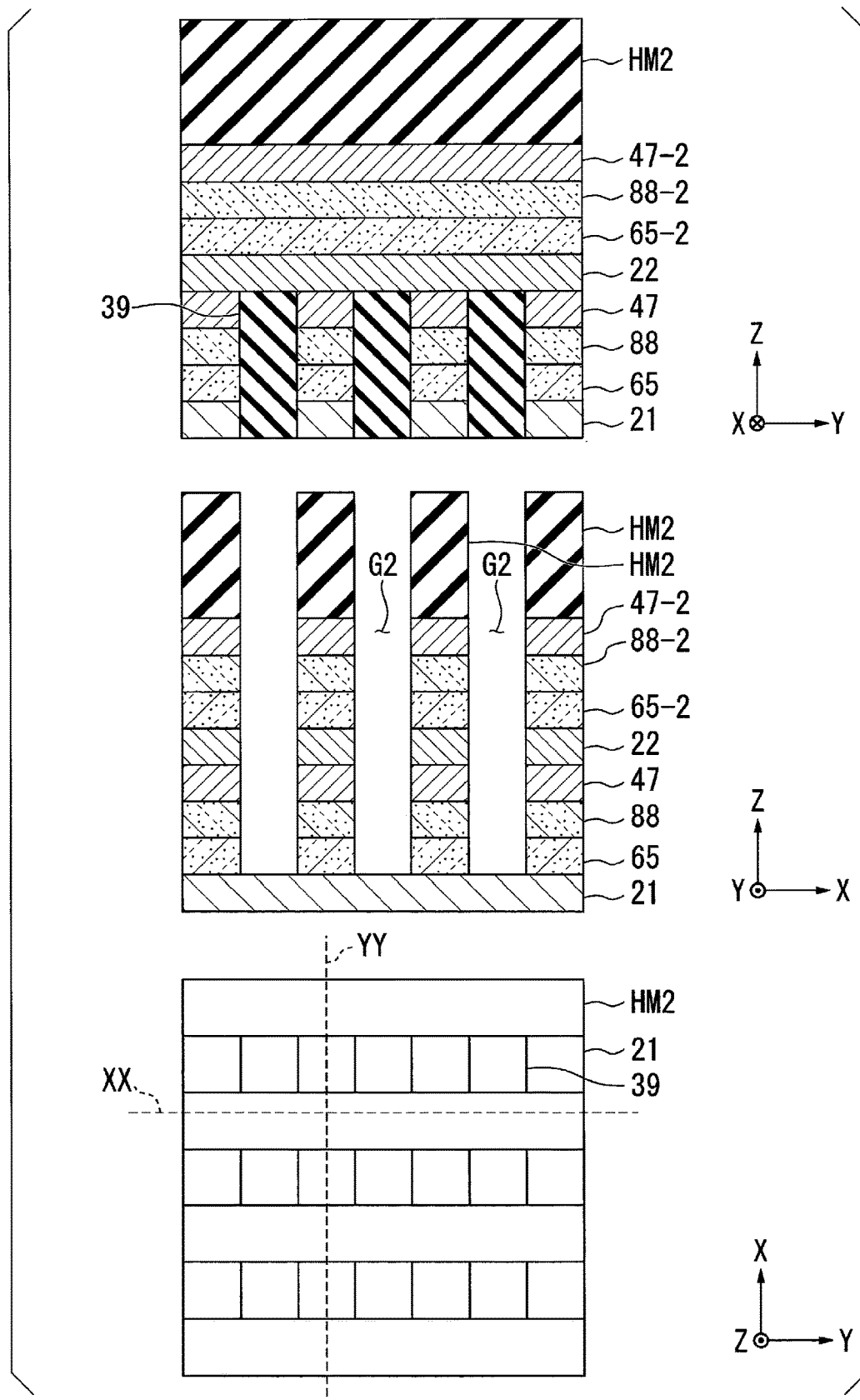
FIG. 25 is a cross-sectional view and a plan view showing an example of the manufacturing step of the plurality of memory cells according to the third embodiment.

FIG. 25 is a cross-sectional view and a plan view showing an example of the manufacturing step of the memory cell MC, and showing a second groove forming step. For example, a groove G2 is formed in the stacked body formed of the selector forming film 65, the sacrificial film 88, the stopper film 47, the second conductor 22, the selector forming film 65-2, the sacrificial film 88-2, and the stopper film 47-2 where the hard mask HM2 is not formed when viewed from the Z direction by performing patterning. The plurality of grooves G2 extend in the Y direction and are formed at intervals in the X direction.

Figure 26:
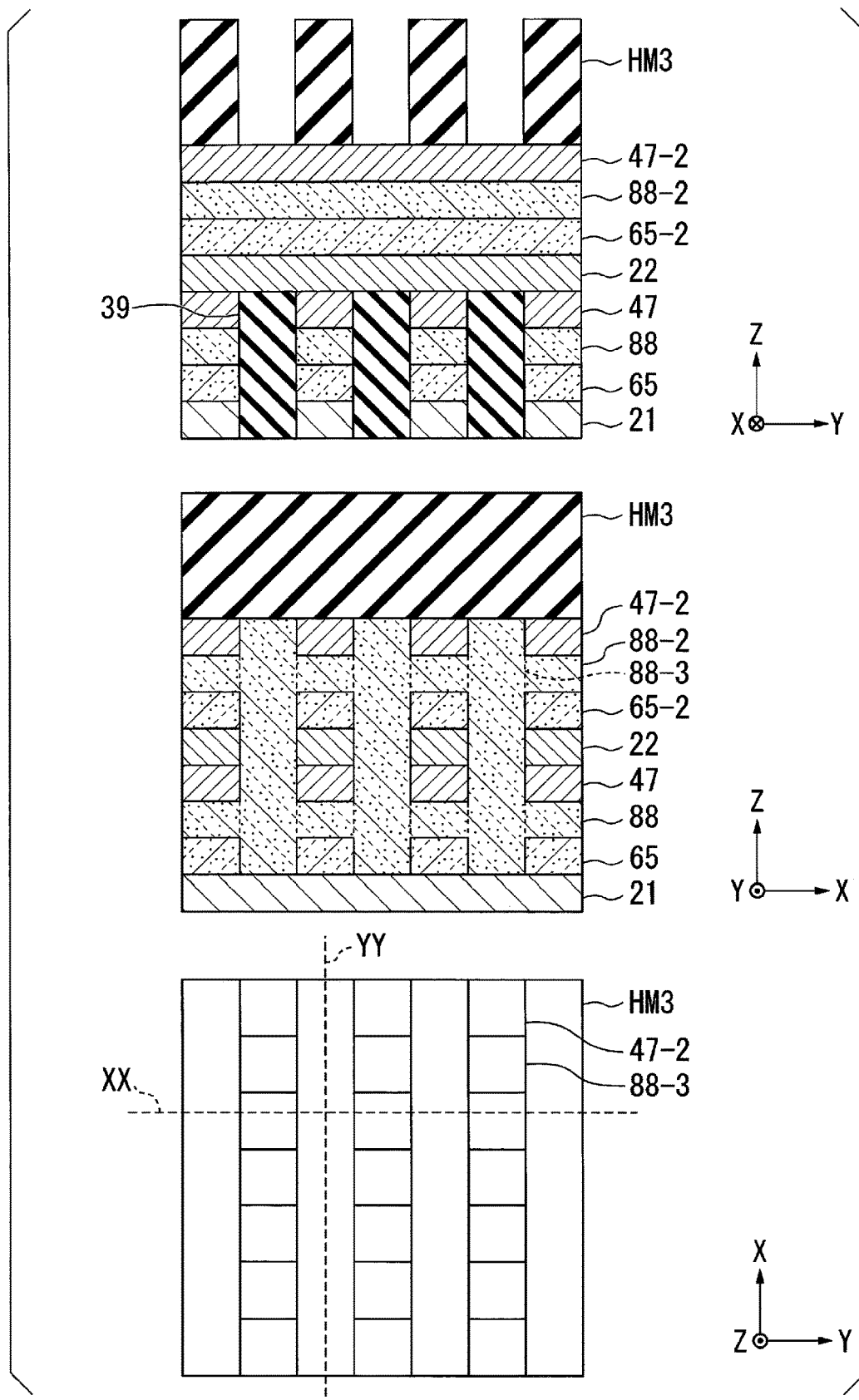
FIG. 26 is a cross-sectional view and a plan view showing an example of the manufacturing step of the plurality of memory cells according to the third embodiment.

FIG. 26 is a cross-sectional view and a plan view showing an example of the manufacturing step of the memory cell MC, and showing a sacrificial film add forming step. For example, as shown in FIG. 26, a sacrificial film 88-3 is formed in the groove G2 using a similar method as the method for forming the sacrificial film 88. Subsequently, a plurality of hard masks HM3 are formed on the surface 47a of the stopper film 47-2 and a surface 88a of the sacrificial film 88-3. The hard masks HM3 are formed at predetermined intervals in the Y direction. A size of each of the plurality of hard masks HM3 in the Y direction is set to be substantially the same as the size of the pillar 35 of the semiconductor storage device 1 in the Y direction.

Figure 27:
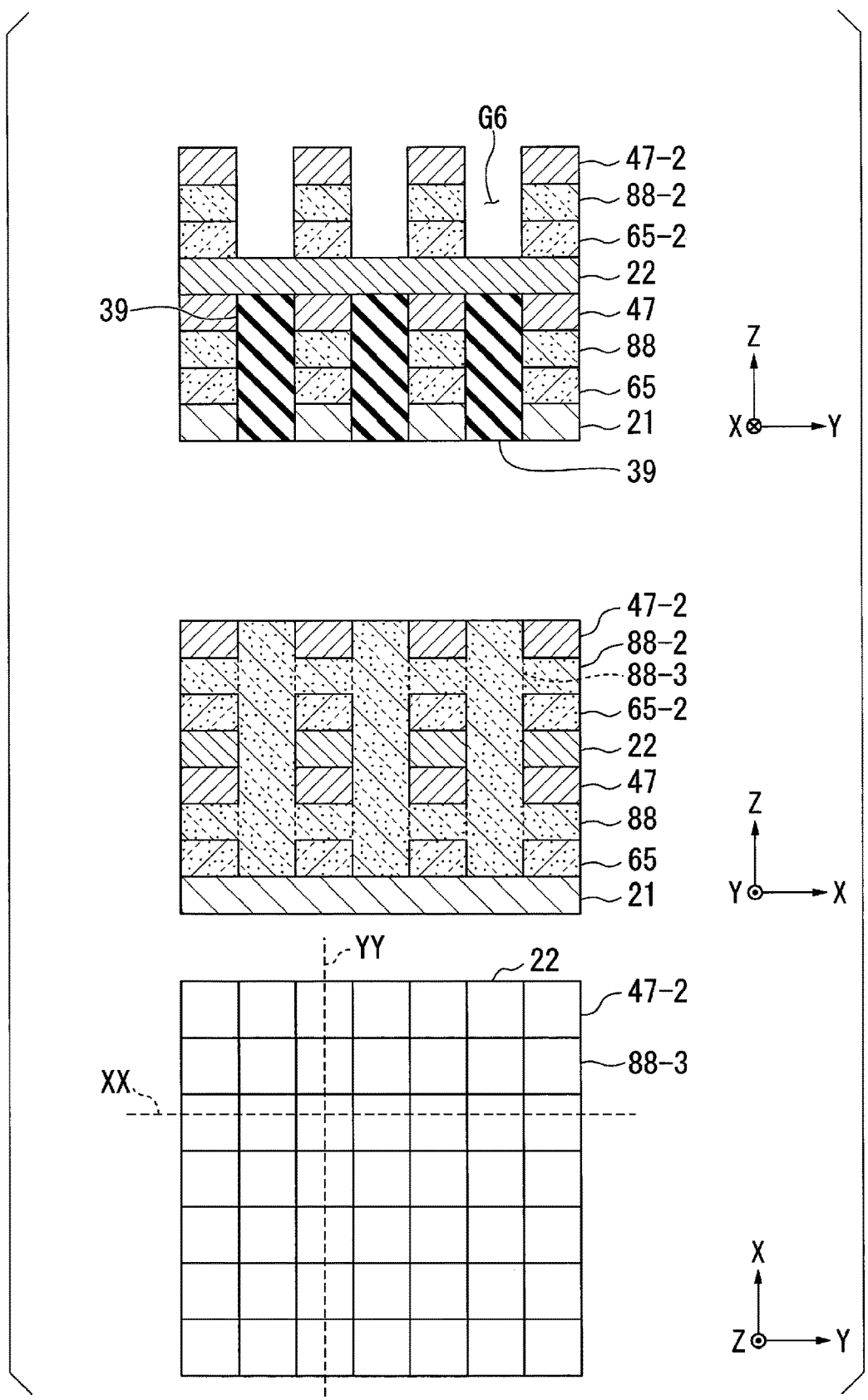
FIG. 27 is a cross-sectional view and a plan view showing an example of the manufacturing step of the plurality of memory cells according to the third embodiment.

FIG. 27 is a cross-sectional view and a plan view showing an example of the manufacturing step of the memory cell MC, and showing a stacked body partially removing step. For example, a groove G6 is formed in the stacked body including the selector forming film 65-2, the sacrificial film 88-2, and the stopper film 47-2 where the hard mask HM3 is not formed when viewed from the Z direction by performing patterning. The plurality of grooves G6 extend in the X direction and are formed at intervals in the Y direction.

Figure 28:
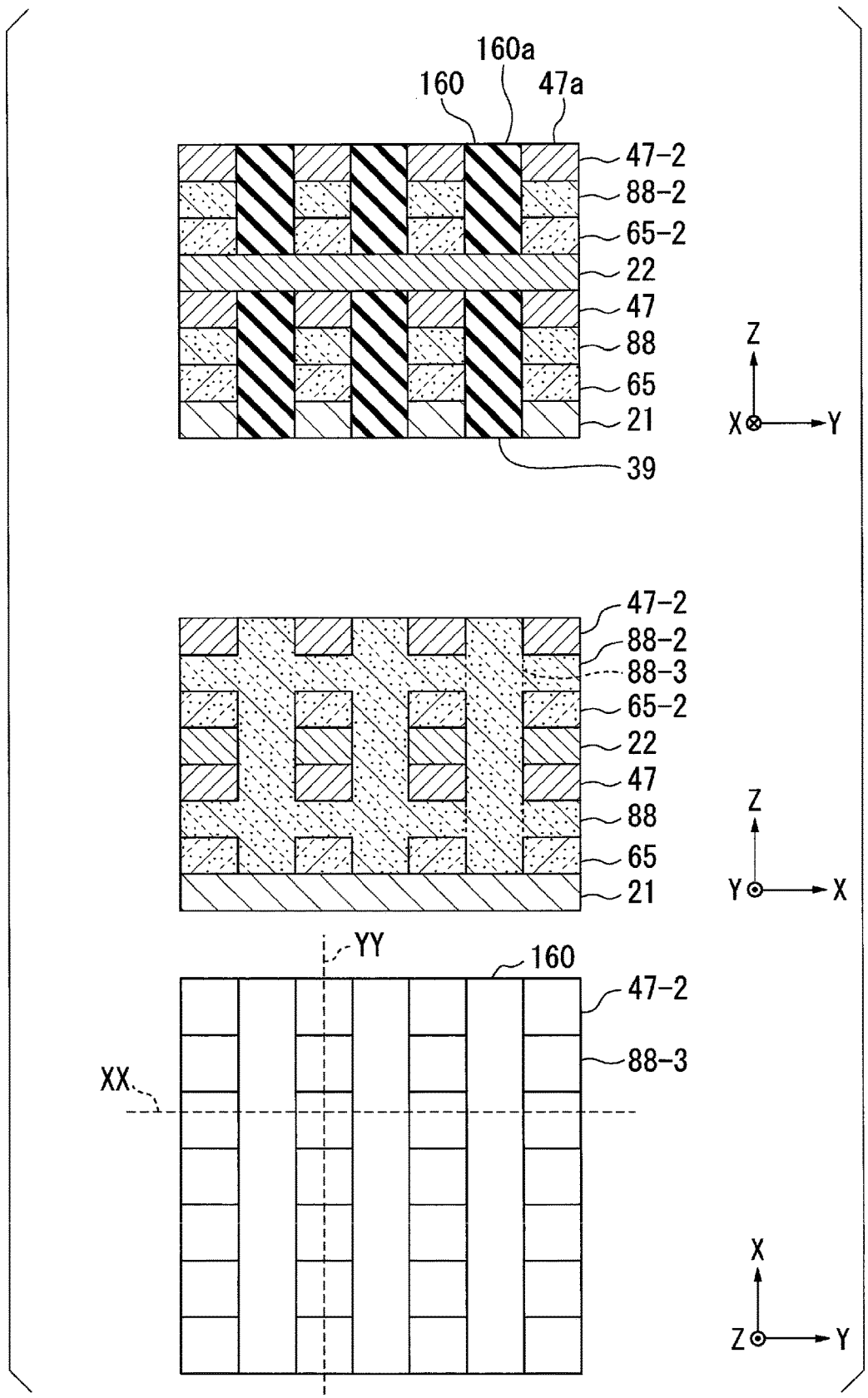
FIG. 28 is a cross-sectional view and a plan view showing an example of the manufacturing step of the plurality of memory cells according to the third embodiment.

FIG. 28 is a cross-sectional view and a plan view showing an example of the manufacturing step of the memory cell MC, and showing an insulating film forming step. For example, an insulating film 160 is buried in the groove G6 using the ALD method or the CVD method. The insulating film 160 is formed of, for example, silicon oxide ($SiO_2$). A surface 160a of the insulating film 160 and the surface 47a of the stopper film 47-2 are located on a same line.

Figure 29:
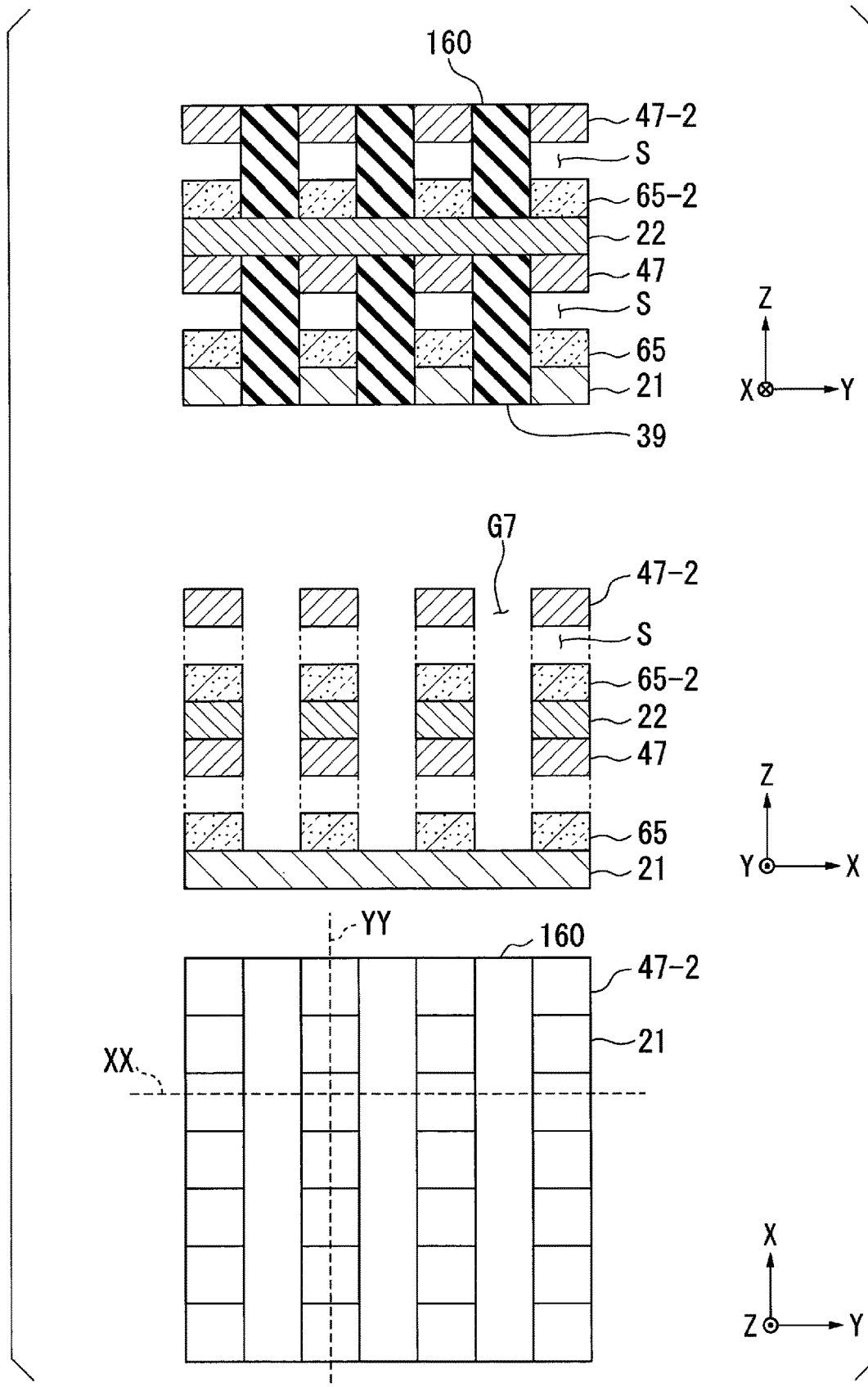
FIG. 29 is a cross-sectional view and a plan view showing an example of the manufacturing step of the plurality of memory cells according to the third embodiment.

FIG. 29 is a cross-sectional view and a plan view showing an example of the manufacturing step of the memory cell MC, and showing a sacrificial film removing step. For example, when the sacrificial films 88, 88-2, and 88-3 are removed using a chemical solution, a groove G7 and the space S are formed.

Figure 30:
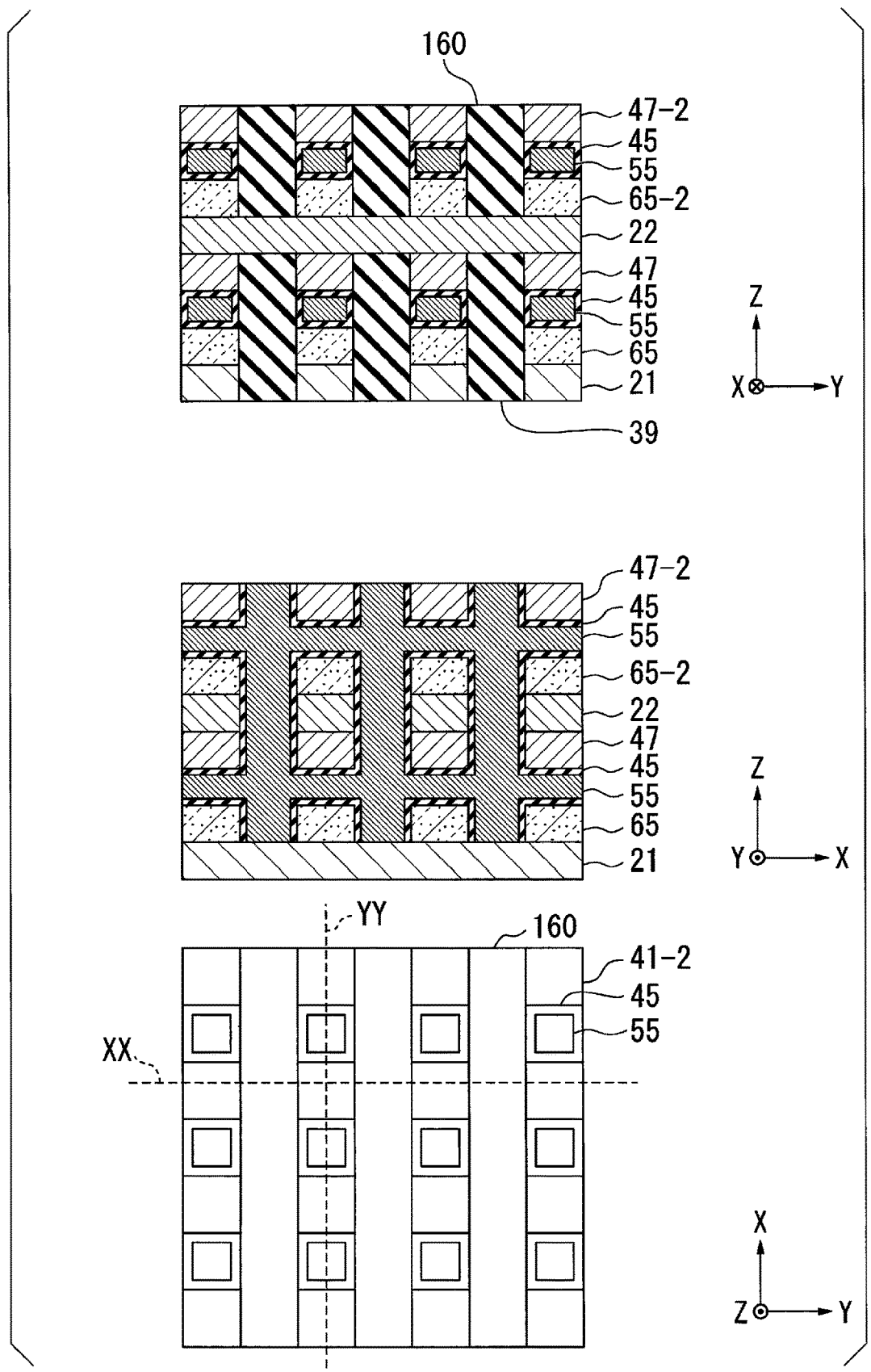
FIG. 30 is a cross-sectional view and a plan view showing an example of the manufacturing step of the plurality of memory cells according to the third embodiment.

FIG. 30 is a cross-sectional view and a plan view showing an example of the manufacturing step of the memory cell MC, and showing an insulating film and resistance changing film forming step. For example, as shown in FIG. 30, the insulating film 45 is formed on a surface exposed in the space S using the ALD method or the CVD method. Subsequently, a resistance changing film forming film 55 is formed in a part where the insulating film 45 is not formed in the space S.

Figure 31:
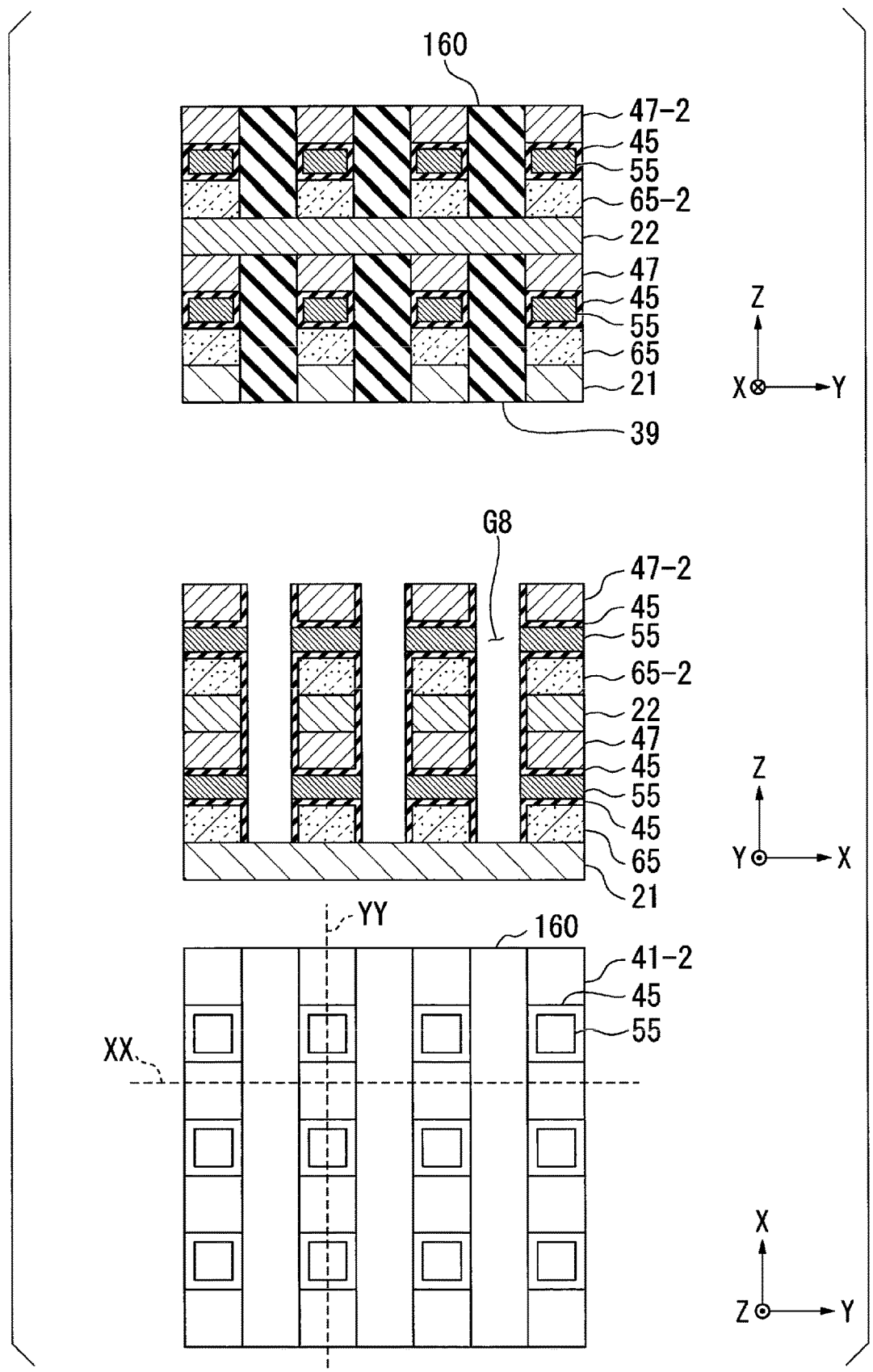
FIG. 31 is a cross-sectional view and a plan view showing an example of the manufacturing step of the plurality of memory cells according to the third embodiment.

FIG. 31 is a cross-sectional view and a plan view showing an example of the manufacturing step of the memory cell MC, and showing a resistance changing film partially removing step. For example, the resistance changing film forming film 55 formed at a location corresponding to the groove G7 shown in FIG. 29 is processed and removed from the groove G7 using a chemical solution or reactive ion etching (RIE).

Figure 32:
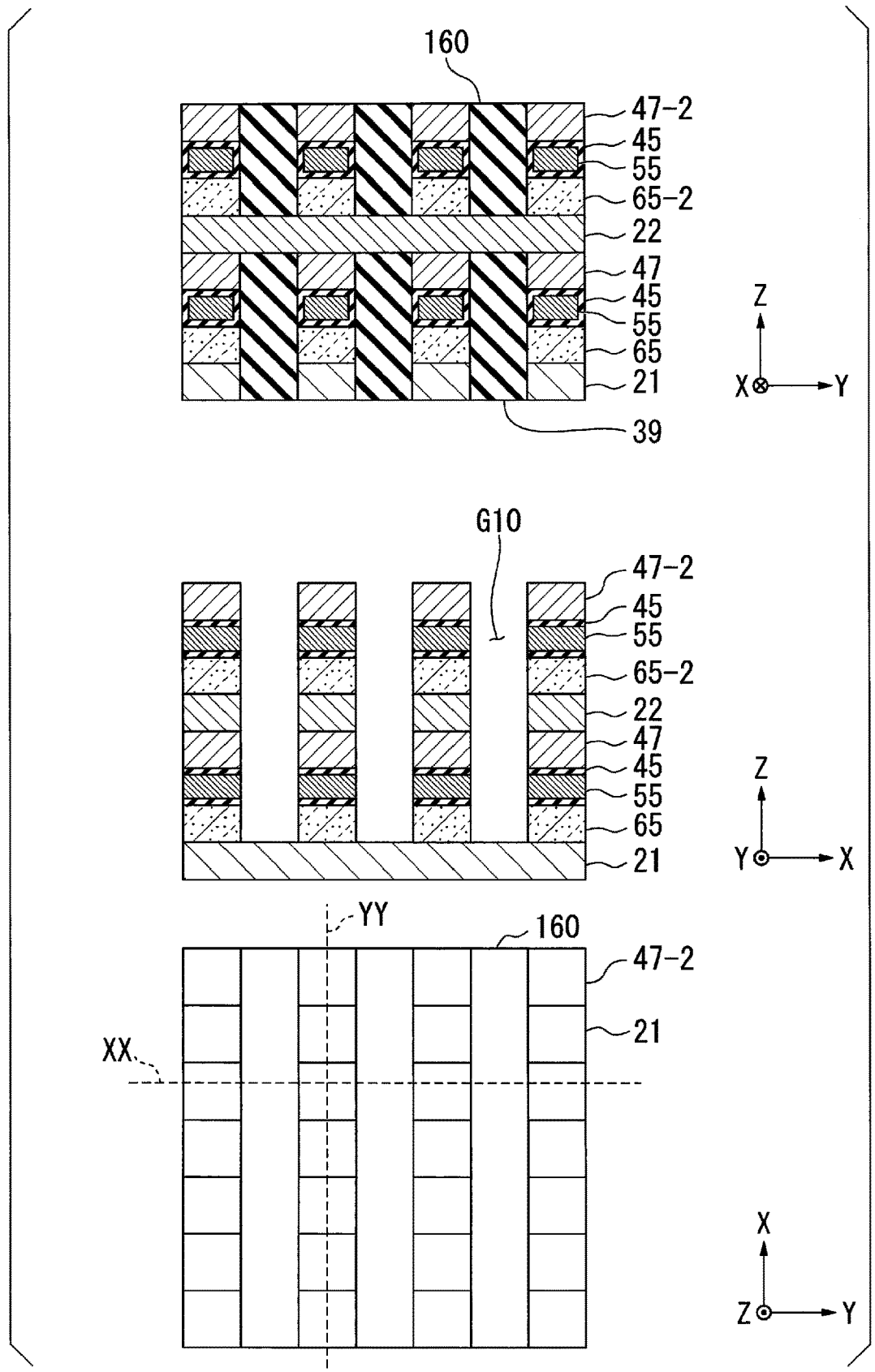
FIG. 32 is a cross-sectional view and a plan view showing an example of the manufacturing step of the plurality of memory cells according to the third embodiment.

FIG. 32 is a cross-sectional view and a plan view showing an example of the manufacturing step of the memory cell MC, and showing an insulating film partially removing step. For example, the insulating film 45 remaining on a side surface and a bottom surface of a groove G8 is removed by performing wet etching.

Figure 33:
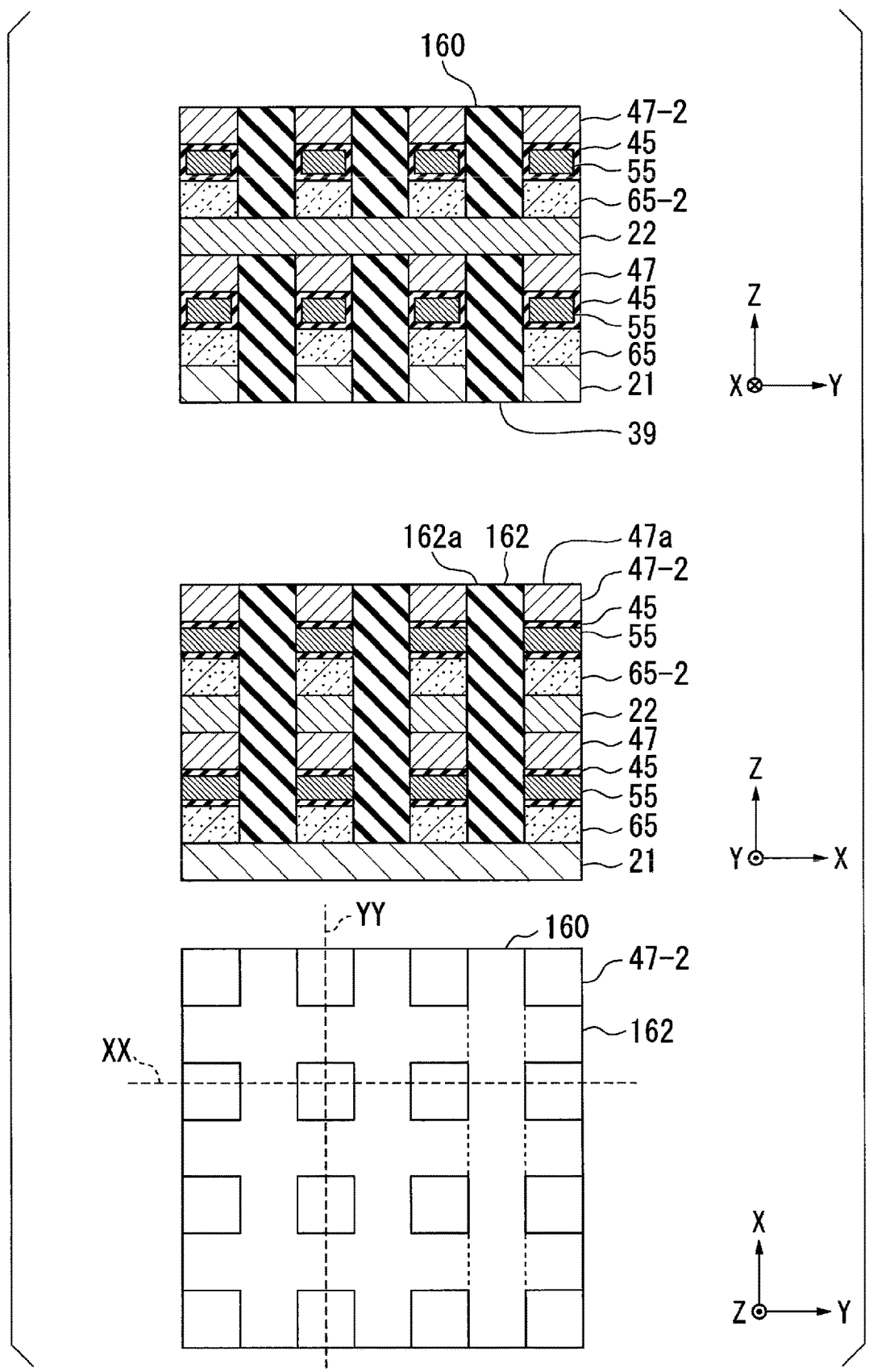
FIG. 33 is a cross-sectional view and a plan view showing an example of the manufacturing step of the plurality of memory cells according to the third embodiment.

FIG. 33 is a cross-sectional view and a plan view showing an example of the manufacturing step of the memory cell MC, and showing an insulating film forming step. For example, an insulating film 162 is buried in a groove G10 by the ALD method or the CVD method. The insulating film 162 is formed of, for example, silicon oxide ($SiO_2$).

Figure 34:
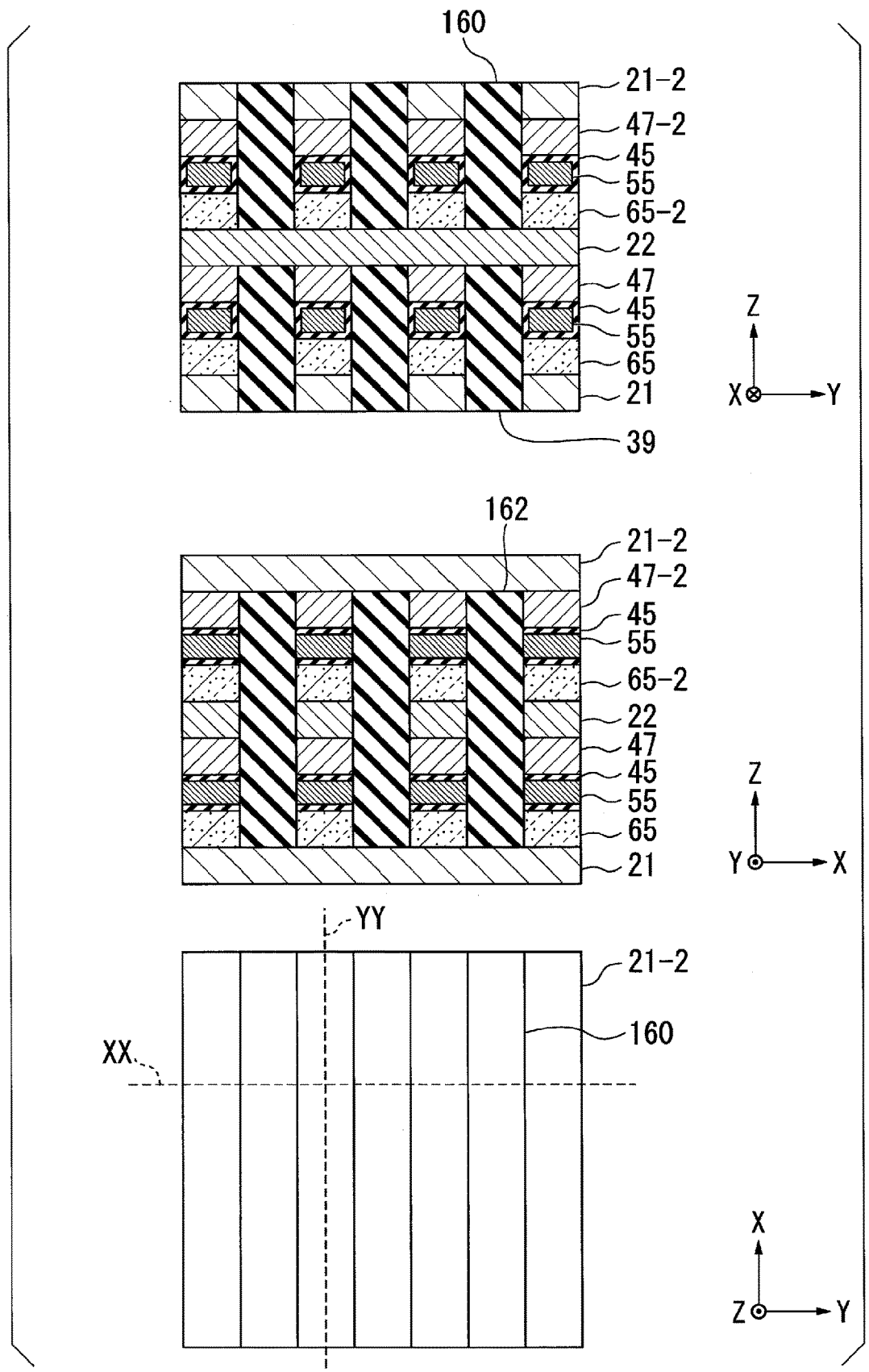
FIG. 34 is a cross-sectional view and a plan view showing an example of the manufacturing step of the plurality of memory cells according to the third embodiment.

FIG. 34 is a cross-sectional view and a plan view showing an example of the manufacturing step of the memory cell MC, and showing a second word line forming step. For example, a first conductor 21-2 is formed on a surface 162a of the insulating film 162 and the surface 47a of the stopper film 47-2 using the ALD method or the CVD method.

Figure 35:
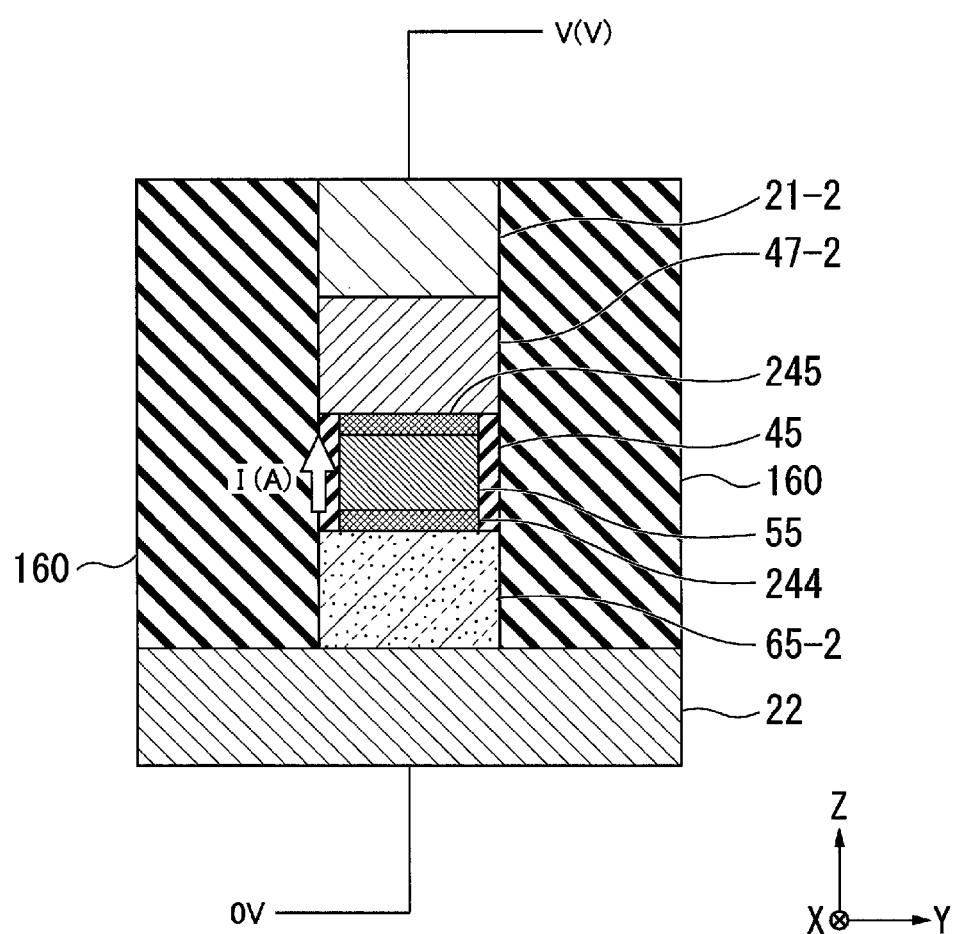
FIG. 35 is a cross-sectional view showing an example of the manufacturing step of the plurality of memory cells according to the third embodiment.

FIG. 35 is a cross-sectional view showing an example of the manufacturing step of the memory cell MC, and showing an insulation breaking step. For example, a voltage V[V] output to the first conductor 21-2 through the selector forming film 65-2, an insulation breaking portion 244, the resistance changing film forming film 55, an insulation breaking portion 245, and the stopper film 47-2 with the second conductor 22 being set to a basic potential of 0[V] can be detected. When insulation of the insulating film 45 adjacent to the resistance changing film forming film 55 in the Z direction is broken and the voltage V output to the first conductor 21-2 is rapidly increased, the insulation breaking is considered to be completed. The insulation breaking portions 244 and 245 are completed by breaking the insulation of the insulating film 45 that is adjacent to the resistance changing film forming film 55 in the Z direction. The insulation breaking portions 244 and 245 can be formed in the insulating film 45 between the stopper film 47 and the resistance changing film forming film 55 in the Z direction and the insulating film 45 between the resistance changing film forming film 55 and the selector forming film 65 in the Z direction by allowing the voltage V[V] output to the first conductor 21 through the stopper film 47, the resistance changing film forming film 55, the selector forming film 65, the insulation breaking portion 244, and the insulation breaking portion 245 with the second conductor 22 being set to the basic potential of 0[V] to be detected.

By performing the steps described above, each of the first conductors 21 and 21-2 functions as the word line WL shown in FIG. 22. Each of the selector forming films 65 and 65-2 is the selector film 61 shown in FIG. 22. The resistance changing film forming film 55 is the resistance changing film 51 shown in FIGS. 22 and 23, and the insulating film 45 is the insulating film 43 shown in FIGS. 22 and 23. Each of the insulation breaking portions 244 and 245 is any one of the insulation breaking portions 241 and 242 shown in FIGS. 22 and 23. Each of the stopper films 47 and 47-2 is the conductive film 81 shown in FIG. 22. The second conductor 22 functions as the bit line BL common to stacked bodies stacked on both sides in the Z direction.

By performing the steps described above, the memory cell MC shown in FIGS. 22 and 23 can be manufactured. The semiconductor storage device according to the third embodiment is formed by performing a known pretreatment before the steps described above and performing a known post-treatment after the steps described above. However, a method for manufacturing the semiconductor storage device according to the third embodiment is not limited to the method described above.

Next, an operation effect of the semiconductor storage device according to the third embodiment described above will be described. According to the semiconductor storage device according to the third embodiment, when viewed along the X direction, the thickness of the resistance changing film 51 in contact with the insulating film 43 in the Y direction is smaller than the width of the word line WL in the Y direction. Accordingly, similar to the semiconductor storage device 1 according to the first embodiment, the cross-sectional area of the resistance changing film 51 can be reduced, and the reset current for changing the resistance changing film 51 from the low resistance state to the high resistance state in the semiconductor storage device 1 can be reduced.

In the semiconductor storage device according to the third embodiment, the insulating film 43 is in contact with the resistance changing film 51 from the first side and the second side in the Y direction. Therefore, when, for example, RIE is performed on the end surface of the resistance changing film forming film 55 at a time of manufacturing the semiconductor storage device according to the third embodiment, a process residual is less likely to occur in each film or configuration such as the selector forming films 65 and 65-2 in contact with the resistance changing film forming film 55. Therefore, according to the semiconductor storage device in the third embodiment, the thickness of the resistance changing film 51 can be easily set as designed, and process damage to each component in contact with the resistance changing film 51 can be reduced.

In the semiconductor storage device according to the third embodiment, since the insulating film 43 is in contact with the resistance changing film 51 from the first side and the second side in the Y direction, one memory cell MC is less likely to be influenced by the adjacent memory cells MCs in the Y direction as compared with a semiconductor storage device in a related art. According to the semiconductor storage device according to the third embodiment, an influence of the memory cells MCs adjacent to each other in the Y direction can be reduced.

(Fourth Embodiment) Next, a configuration of a semiconductor storage device according to the fourth embodiment will be described. Although not shown, the semiconductor storage device according to the fourth embodiment is a so-called cross-point type semiconductor storage device using a PCM similar to the semiconductor storage device 1 according to the first embodiment. The semiconductor storage device according to the fourth embodiment includes, for example, the silicon substrate 11, the interlayer insulating layer 12, the plurality of word lines WLs, the plurality of bit lines BLs, and the plurality of memory cells MCs. Hereafter, regarding components of the semiconductor storage device according to the fourth embodiment, only contents different from the components of the semiconductor storage device 1 will be described, and detailed description of contents common to the components of the semiconductor storage device 1 will be omitted.

Figure 37:
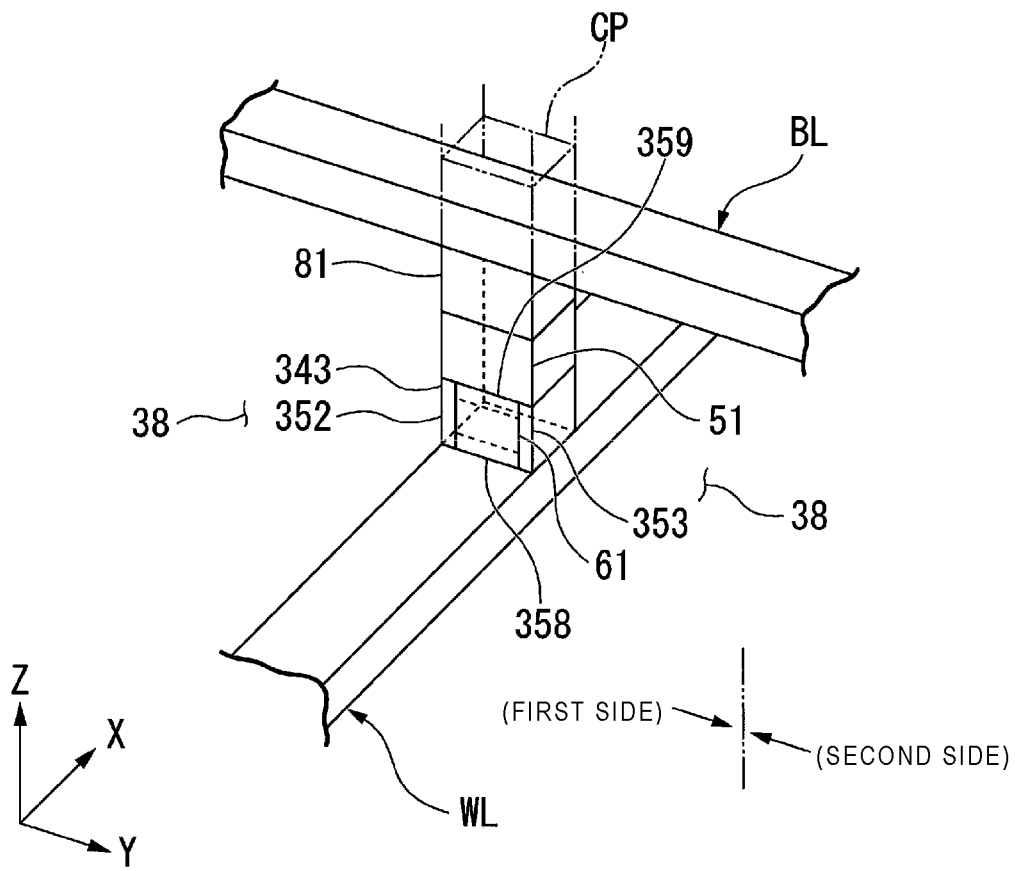
FIG. 37 is a perspective view of one memory cell according to a fourth embodiment.
Figure 38:
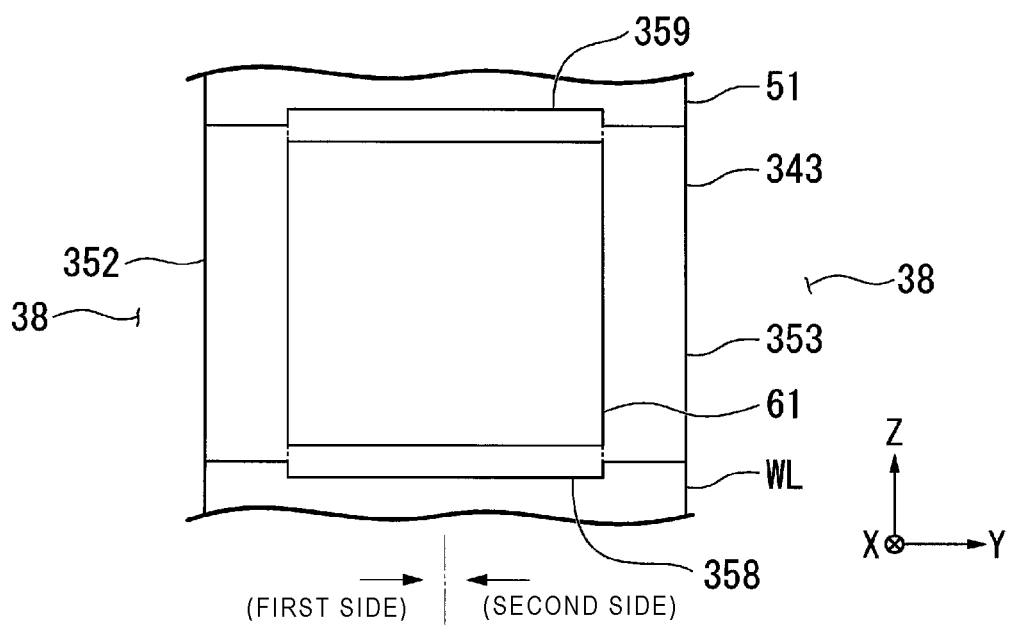
FIG. 38 is a cross-sectional view of a selector film and an insulating film of the one memory cell according to the fourth embodiment.

The memory cell MC includes, for example, the conductive film 81, the resistance changing film 51, the selector film 61, and an insulating film 343. FIG. 37 is a perspective view showing one memory cell MC of the semiconductor storage device according to the fourth embodiment. FIG. 38 is an enlarged side view showing a relative arrangement of the selector film 61 and the insulating film 343 of the memory cell MC.

A size of the resistance changing film 51 viewed from the Z direction is the same as that of the overlapping parts CP. That is, the sizes of the resistance changing film 51 in the Y direction and the X direction are the same as those of the overlapping parts CP.

The selector film 61 is adjacent to the insulating film 343 from the first side and the second side in the Y direction. More specifically, the insulating film 343 includes a first adjacent insulating portion 352, a second adjacent insulating portion 353, and insulation breaking portions 358 and 359. The resistance changing film 51 includes these resistance changing portions and is integrally formed. The first adjacent insulating portion 352 is adjacent to the selector film 61 from the first side in the Y direction. The second adjacent insulating portion 353 is adjacent to the selector film 61 from the second side in the Y direction. The insulation breaking portions 358 and 359 are adjacent to the selector film 61 from opposite sides in the Z direction. The insulating film 343 is formed of, for example, silicon oxide or silicon nitride.

Since the insulation breaking portions 358 and 359 are formed, the selector film 61 is electrically connected to the word line WL and the resistance changing film 51 in the Z direction, similar to the semiconductor storage device 1 according to the first embodiment, and the semiconductor storage devices according to the second embodiment and the third embodiment.

Next, a method for manufacturing the memory cell MC of the semiconductor storage device according to the fourth embodiment will be briefly described. However, similar to the third embodiment, a method for manufacturing the memory cell MC stacked in the Z direction will be described in the following description. The memory cell MC of the semiconductor storage device according to the fourth embodiment can be manufactured by performing similar steps as the method for manufacturing the semiconductor storage device 1 from the first hard mask forming step shown in FIG. 5 to the first groove forming step shown in FIG. 6. However, in the first hard mask forming step shown in FIG. 5, the selector forming film 65 is not formed, and the resistance changing film forming film 55 is formed between the sacrificial film 88 and the stopper film 47 in the Z direction.

An upper part of each of FIGS. 39 to 45 is a cross-sectional view of components in each manufacturing step when viewed along the X direction. A lower part of each of FIGS. 39 to 45 is a cross-sectional view of the components in each manufacturing step when viewed along the Y direction.

Figure 39:
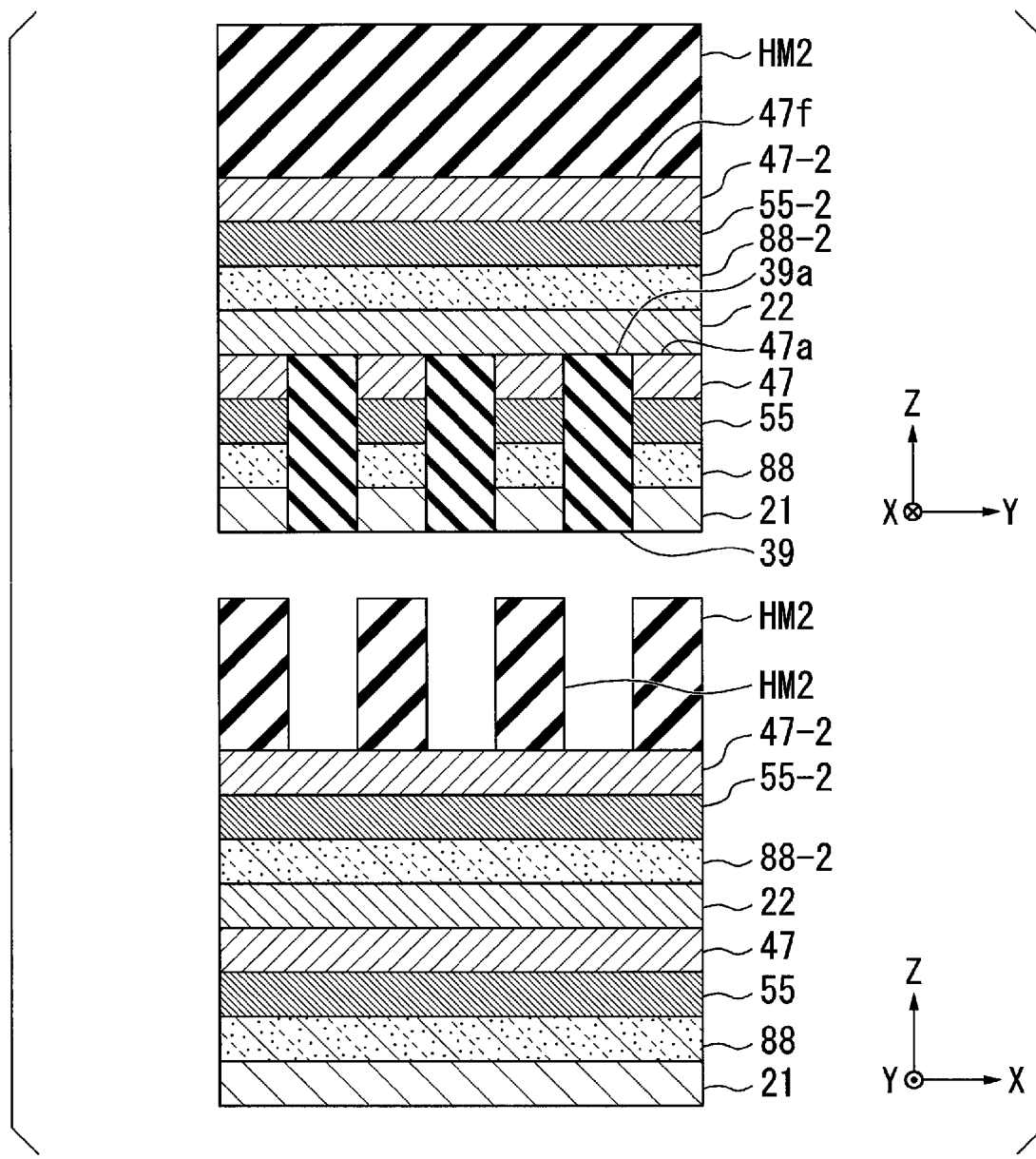
FIG. 39 is a cross-sectional view showing an example of a manufacturing step of a plurality of memory cells according to the fourth embodiment.

FIG. 39 is a cross-sectional view showing an example of the manufacturing step of the memory cell MC, and showing a second hard mask forming step. As shown in FIG. 39, after the insulating film 39 is buried in the groove G1 as shown in FIG. 6, the second conductor 22, the sacrificial film 88-2, a resistance changing film forming film 55-2, and the stopper film 47-2 are sequentially stacked on the surface 47a of the stopper film 47 and the surface 39a of the insulating film 39. A plurality of hard masks HM2 extending in the Y direction are formed on a surface 47f of the stopper film 47-2 at predetermined intervals in the X direction. The size of each of the plurality of hard masks HM2 in the X direction is set to be substantially the same as the size of the pillar 35 of the semiconductor storage device 1 in the X direction.

Figure 40:
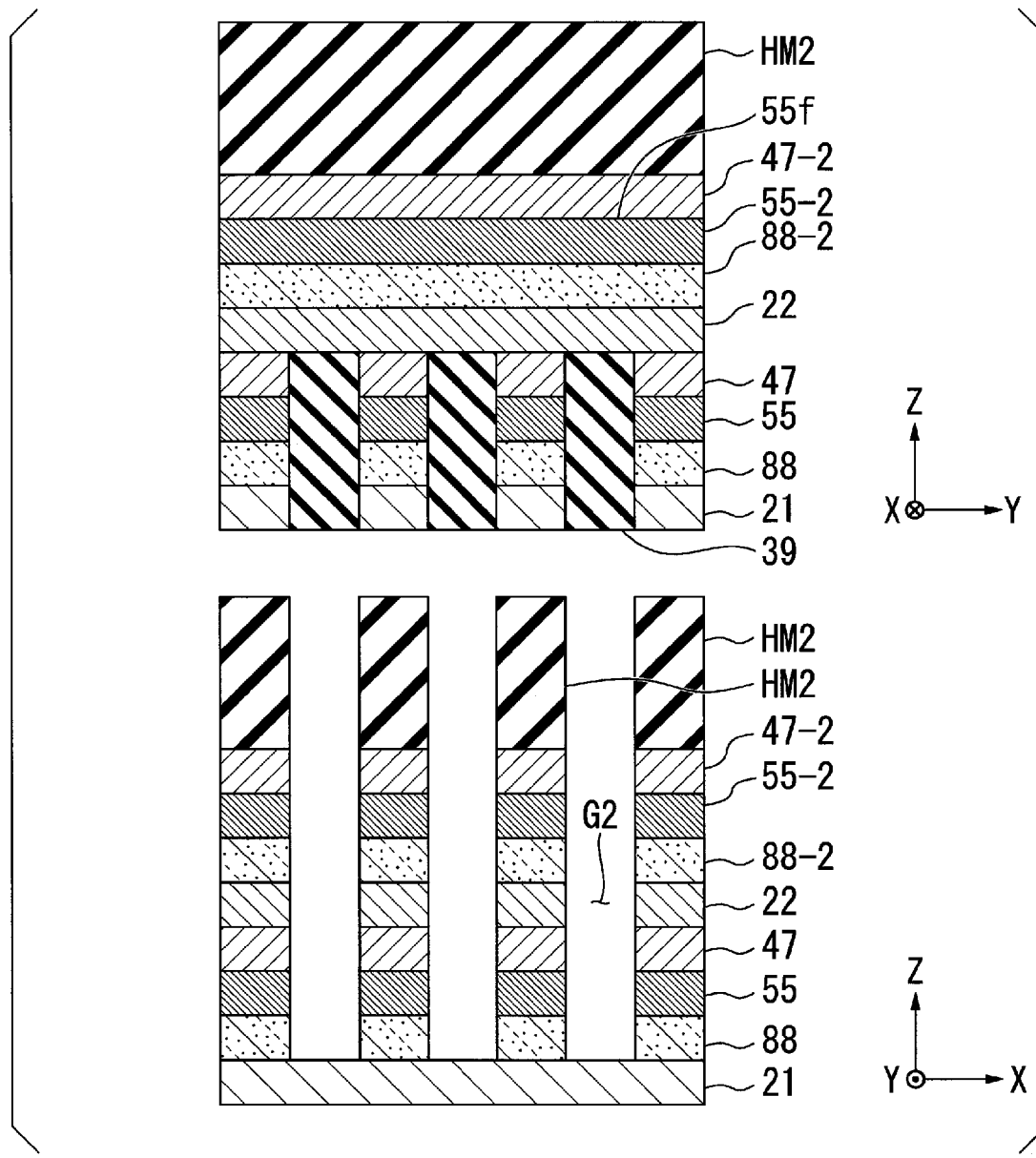
FIG. 40 is a cross-sectional view showing an example of the manufacturing step of the plurality of memory cells according to the fourth embodiment.

FIG. 40 is a cross-sectional view showing an example of the manufacturing step of the memory cell MC, and showing a second groove forming step. For example, the groove G2 is formed in the stacked body including the sacrificial film 88, the resistance changing film forming film 55, the stopper film 47, the second conductor 22, the sacrificial film 88-2, the resistance changing film forming film 55-2, and the stopper film 47-2 where the hard mask HM2 is not formed when viewed from the Z direction by performing patterning. The plurality of grooves G2 extend in the Y direction and are formed at intervals in the X direction.

Figure 41:
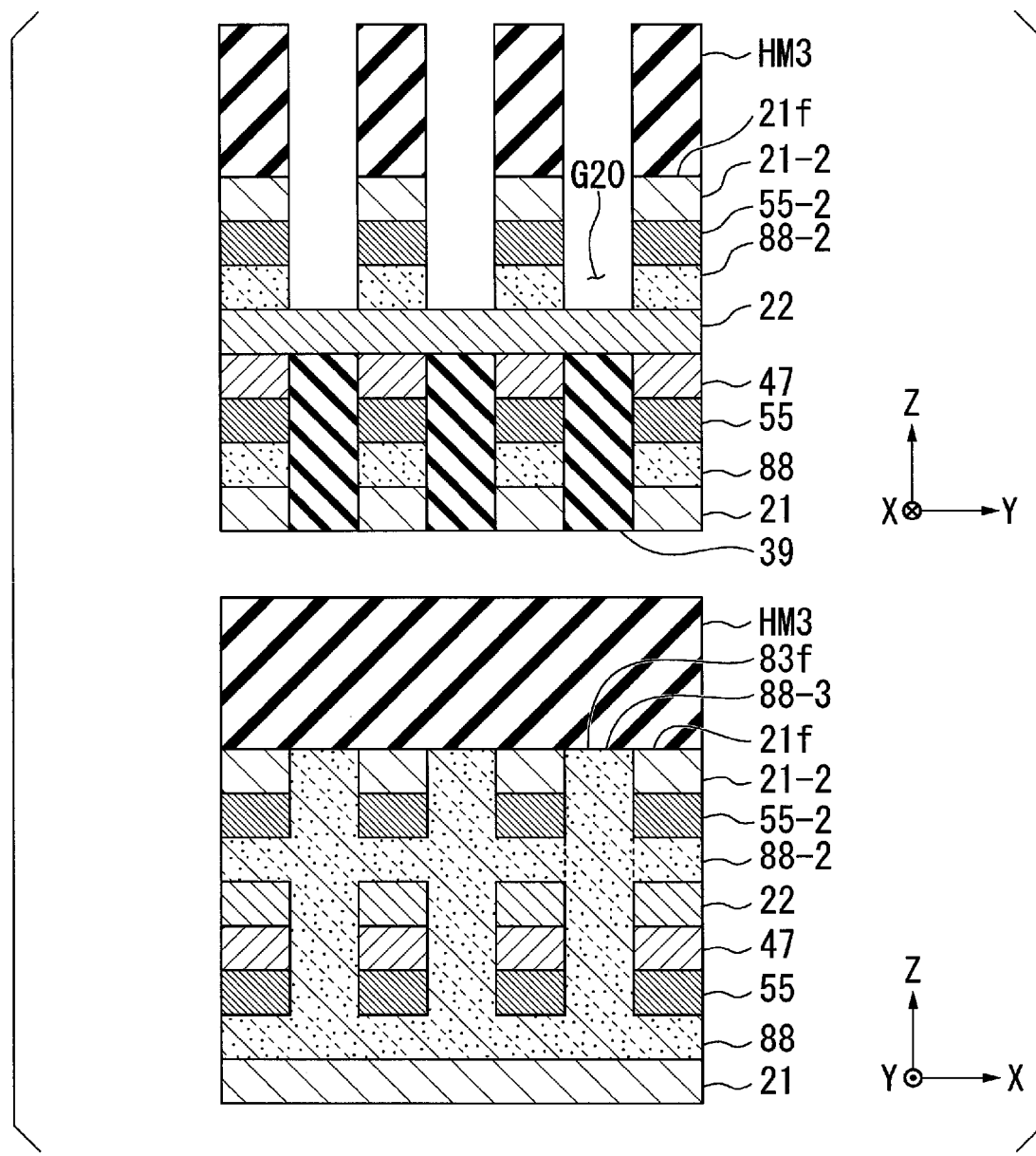
FIG. 41 is a cross-sectional view showing an example of the manufacturing step of the plurality of memory cells according to the fourth embodiment.

For example, by performing patterning or the CMP, the hard mask HM2 and the stopper film 47-2 are once removed, and the first conductor 21-2 is formed on a surface 55f of the resistance changing film forming film 55-2. FIG. 41 is a cross-sectional view showing an example of the manufacturing step of the memory cell MC, and showing a sacrificial film add forming step. The sacrificial film 88-3 is formed to a same height as the first conductor 21-2 in the groove G2 shown in FIG. 40. As shown in FIG. 41, a plurality of hard masks HM3 are formed on a surface 21f of the first conductor 21-2 and a surface 83f of the sacrificial film 83-3. The hard masks HM3 extend in the X direction and are formed at intervals in the Y direction. When viewed from the Z direction, the first conductor 21-2, the resistance changing film forming film 55-2, and the sacrificial film 88-2 at locations where a hard mask HM3 is not formed are removed, and a groove G20 is formed.

Figure 42:
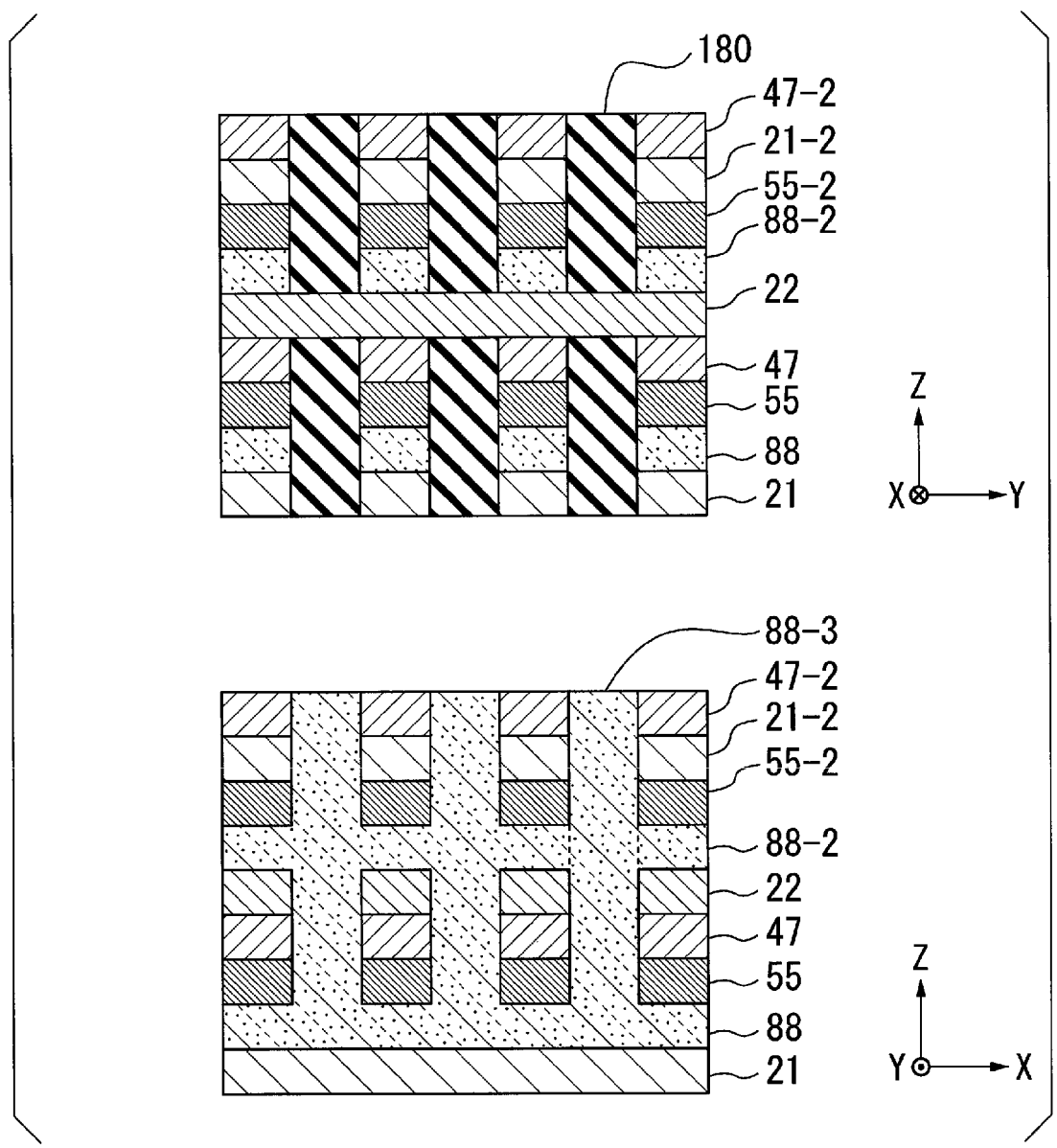
FIG. 42 is a cross-sectional view showing an example of the manufacturing step of the plurality of memory cells according to the fourth embodiment.

FIG. 42 is a cross-sectional view showing an example of the manufacturing step of the memory cell MC, and showing an insulating film forming step. As shown in FIG. 42, the hard mask HM3 is removed, and an insulating film 180 is buried in the groove G20. The stopper film 47-2 is formed at a location overlapping the first conductor 21-2 in the X direction.

Figure 43:
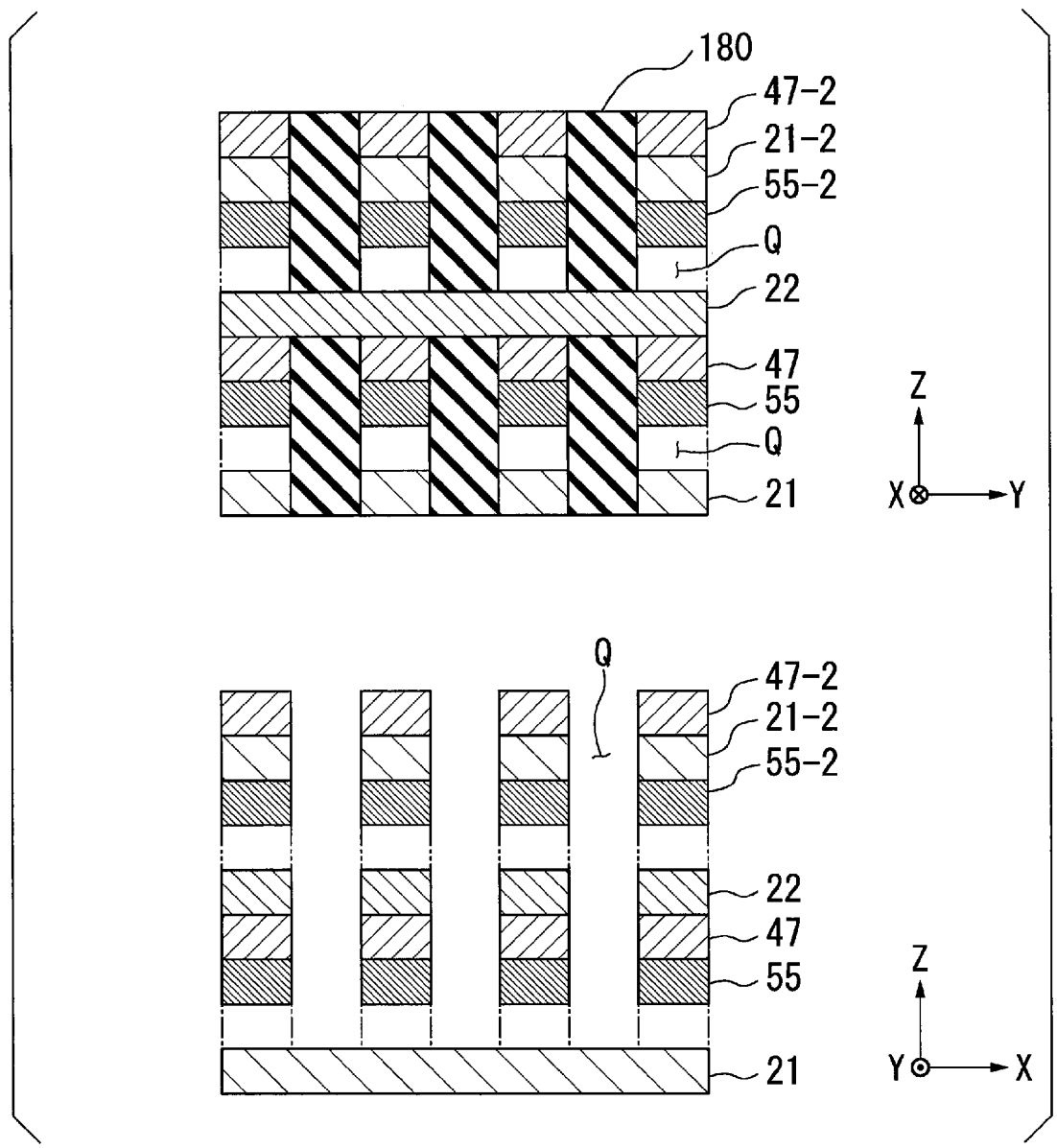
FIG. 43 is a cross-sectional view showing an example of the manufacturing step of the plurality of memory cells according to the fourth embodiment.

FIG. 43 is a cross-sectional view showing an example of the manufacturing step of the memory cell MC, and showing a sacrificial film removing step. For example, as shown in FIG. 43, the sacrificial films 88, 88-2, and 88-3 are removed using a chemical solution, and a space Q is formed.

Figure 44:
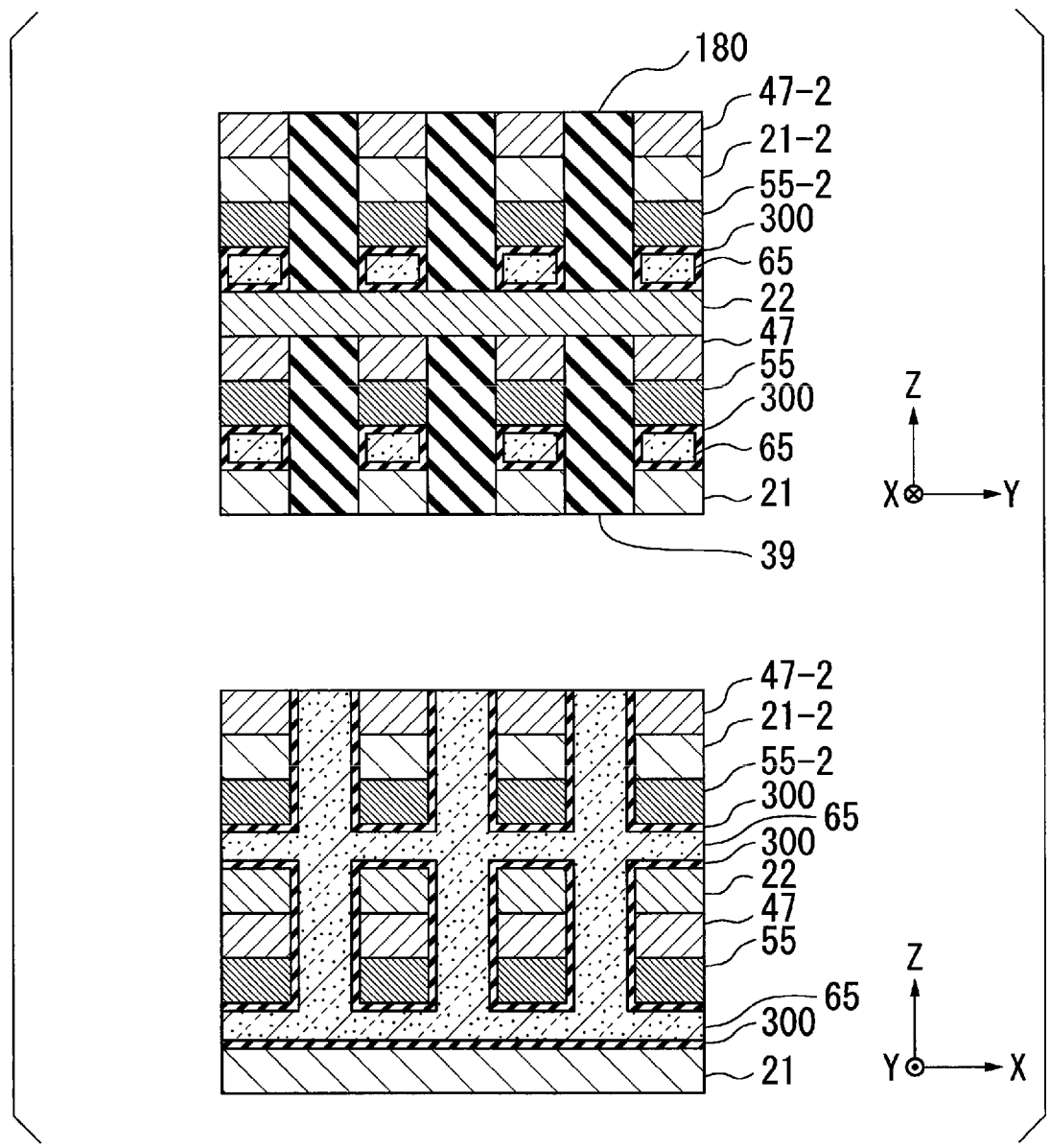
FIG. 44 is a cross-sectional view showing an example of the manufacturing step of the plurality of memory cells according to the fourth embodiment.

FIG. 44 is a cross-sectional view showing an example of the manufacturing step of the memory cell MC, and showing a selector film forming step. For example, an insulating film 300 is formed on a wall surface exposed in the space Q by the ALD method or the CVD method. Subsequently, as shown in FIG. 44, a selector forming film 65 is formed in the space Q inside the insulating film 300. The insulating film 300 is formed of, for example, silicon nitride.

Figure 45:
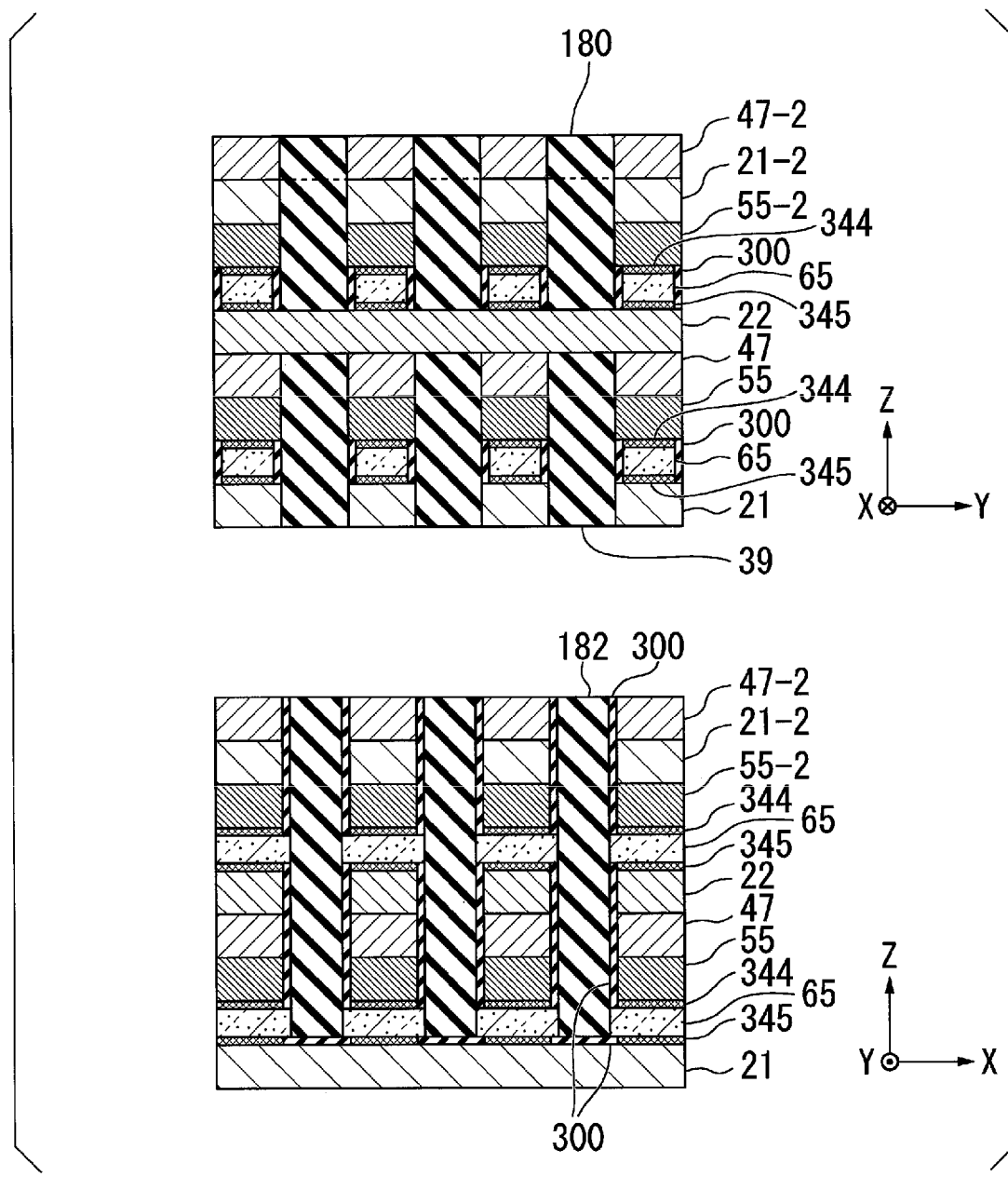
FIG. 45 is a cross-sectional view showing an example of the manufacturing step of the plurality of memory cells according to the fourth embodiment.

FIG. 45 is a cross-sectional view showing an example of the manufacturing step of the memory cell MC, and showing an insulation breaking portion forming step. For example, as shown in FIG. 45, when viewed along the Y direction, only the selector forming film 65 extending in the Z direction is removed by performing patterning or the like, and an insulating film 182 is formed in the space formed by the partial removal of the selector forming film 65. Subsequently, in a similar method as that in the third embodiment, insulation of the insulating film 300 adjacent to the selector forming film 65 in the Z direction is broken, and insulation breaking portions 344 and 345 are formed.

By performing the steps described above, each of the first conductors 21 and 21-2 functions as the word line WL shown in FIG. 37. The selector forming film 65 is the selector film 61 shown in FIG. 37. The resistance changing film forming film 55 is the resistance changing film 51 shown in FIG. 37, and the insulating film 300 is the insulating film 343 shown in FIG. 37. Each of the insulation breaking portions 344 and 345 is any one of the insulation breaking portions 358 and 359 shown in FIGS. 22 and 23. Each of the stopper films 47 and 47-2 is the conductive film 81 shown in FIG. 22. The second conductor 22 functions as the bit line BL common to the stacked bodies stacked on both sides in the Z direction.

By performing the steps described above, the memory cell MC shown in FIGS. 37 and 38 can be manufactured. The semiconductor storage device according to the fourth embodiment is formed by performing a known pretreatment before the steps described above and performing a known posttreatment after the steps described above. However, a method for manufacturing the semiconductor storage device according to the fourth embodiment is not limited to the method described above.

Next, an operation effect of the semiconductor storage device according to the fourth embodiment described above will be described. According to the semiconductor storage device in the fourth embodiment, since a configuration is provided in which the selector film 61 can be formed at least after the formation of the hard mask or the like, the selector film 61 is protected from an influence of heat caused when the resistance changing film 51 is formed, and the electrical characteristics of the selector film 61 can be prevented from decreasing.

Figure 36:
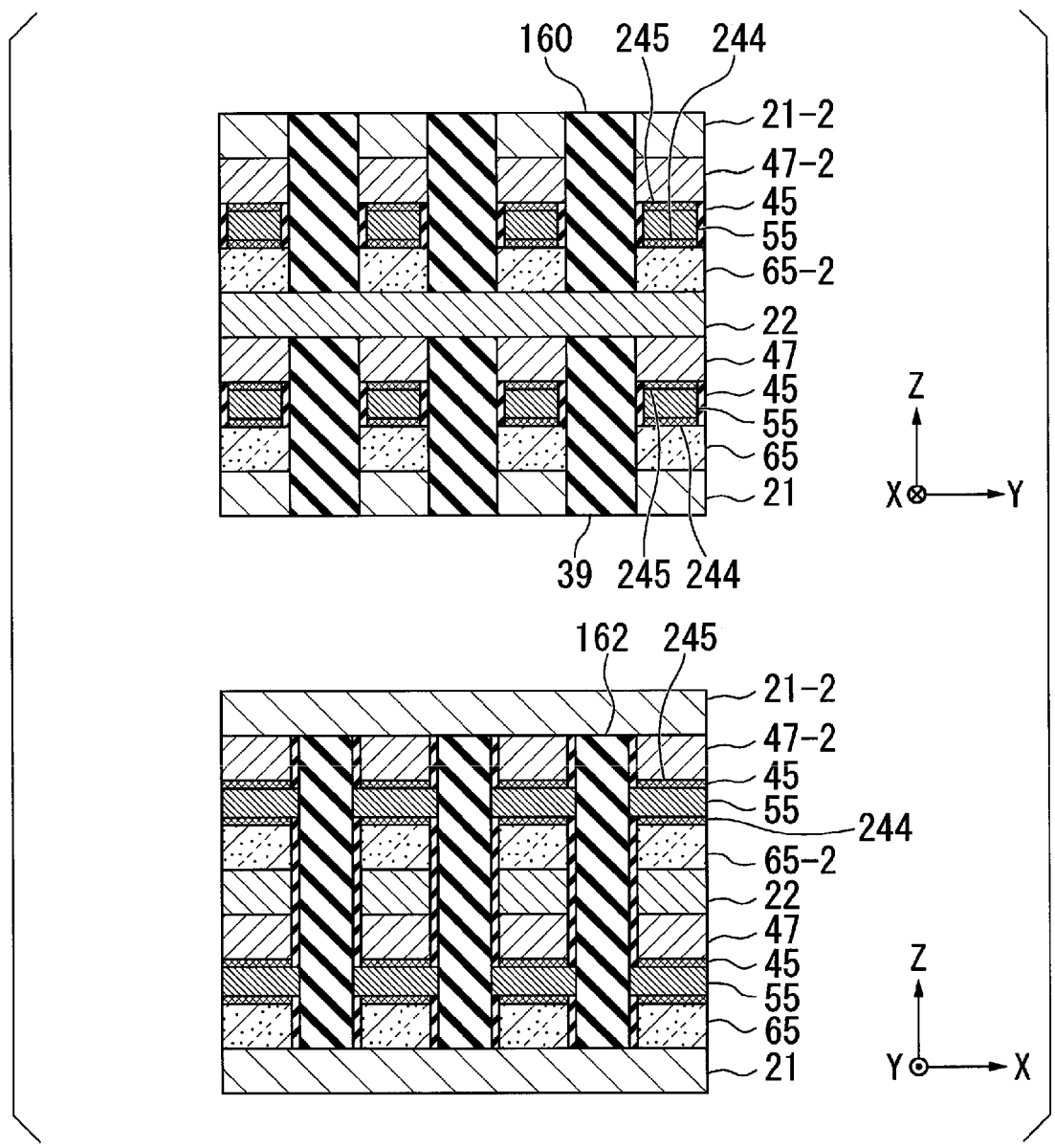
FIG. 36 is a cross-sectional view showing an example of a manufacturing step of a plurality of memory cells according to a modification of the third embodiment.

For example, in the manufacturing of the semiconductor storage device according to the third embodiment described above, the insulating film 45 on the side surface and the bottom surface of the groove G8 is removed by performing the insulating film partially removing step as shown in FIG. 32. However, the steps subsequent to FIG. 33 may be performed while the insulating film 45 on the side surface and the bottom surface of the groove G8 remains. In this case, as shown in the middle part of FIG. 36, the insulating film 45 remaining on the side surface and the bottom surface of the groove G8 is provided in the insulating film which is the interlayer insulating portion 38 of the memory cell MC in the X direction in addition to the insulating films 32, 160 and 162.

Hereinafter, several semiconductor storage devices will be additionally described.

[1] A semiconductor storage device including:
a first wiring extending in a first direction;
a second wiring that extends in a second direction intersecting the first direction, and is provided at a location different from that of the first wiring in a third direction intersecting the first direction and the second direction;
a first insulating film provided between the first wiring and the second wiring in the third direction;
a first resistance changing film that is provided between the first wiring and the second wiring in the third direction, and is adjacent to the first insulating film in the first direction; and
a first insulating portion adjacent to the first insulating film from the same side as a part of the first resistance changing film in the first direction.

[2] The semiconductor storage device according to [1], in which
The first resistance changing film is disposed at a center of the second wiring in the first direction.

[3] The semiconductor storage device according to [2], in which
the first resistance changing film is disposed between the center of the second wiring in the first direction and an edge of the second wiring in the first direction.

[4] The semiconductor storage device according to [1], in which
the first resistance changing film is in contact with the first insulating film in the first direction.

[6] The semiconductor storage device according to [1], in which
a maximum thickness of the first resistance changing film in the first direction is smaller than a maximum thickness of the first insulating film in the first direction.

[7] The semiconductor storage device according to [1], in which
a maximum thickness of the first resistance changing film in the first direction is equal to or lower than half a maximum width of the second wiring in the first direction.

[8] The semiconductor storage device according to [1], in which
a part of the first insulating portion is adjacent to the selector film in the first direction.

[9] The semiconductor storage device according to [1], in which
a maximum thickness of the first resistance changing film in the first direction is smaller than a maximum thickness of the selector film in the third direction.

[10] The semiconductor storage device according to [1] further including:
a third wiring that is adjacent to the second wiring in the first direction, and extends in the second direction;
a second insulating film provided between the first wiring and the third wiring in the third direction;
a second resistance changing film that is provided between the first wiring and the third wiring in the third direction, and is adjacent to the second insulating film in the first direction; and
a second insulating portion adjacent to the second insulating film from the same side as a part of the second resistance changing film in the first direction.

[11] The semiconductor storage device according to [10], in which
the first resistance changing film is disposed at a central part of the second wiring in the first direction, and
the second resistance changing film is disposed at a central part of the third wiring in the first direction.

[12] The semiconductor storage device according to [11], further including:
a fourth wiring that is adjacent to the second wiring from a side which is opposite to the third wiring in the first direction, and extends in the second direction;
a third insulating film provided between the first wiring and the fourth wiring in the third direction; and
a third resistance changing film that is provided between the first wiring and the fourth wiring in the third direction, and is adjacent to the third insulating film in the first direction, in which
the second insulating portion includes a part provided between the first wiring and the fourth wiring in the third direction.

[13] The semiconductor storage device according to [10], in which
the first resistance changing film is disposed at a central part of the second wiring in the first direction, and
the third resistance changing film is disposed at a central part of the fourth wiring in the first direction.

[14] The semiconductor storage device according to [12], in which
the second insulating portion is in contact with the first resistance changing film from a side which is opposite to the first insulating film.

[15] The semiconductor storage device according to [12], in which a part of the second insulating portion is provided between the second wiring and the third wiring in the first direction.

While certain embodiments have been described, these embodiments have been presented by way of example only, and are not intended to limit the scope of the claimed inventions. Indeed, the novel embodiments described herein may be embodied in a variety of other forms; furthermore, various omissions, substitutions and changes in the form of the embodiments described herein may be made without departing from the spirit of the claimed inventions. The accompanying claims and their equivalents are intended to cover such forms or modifications as would fall within the scope and spirit of the claimed inventions.

What is claimed is:

1. A semiconductor storage device comprising:
a first wiring that extends in a first direction;
a second wiring that extends in a second direction intersecting the first direction, and is positioned at a location different from the first wiring along a third direction, the third direction intersecting the first direction and the second direction;
an insulating film provided between the first wiring and the second wiring in the third direction, the insulating film having a first side and a second side which is opposite to the first side in the first direction; and
a resistance changing film provided between the first wiring and the second wiring in the third direction, adjacent to the insulating film from the first side and the second side, and the resistance changing film being smaller than the second wiring in the first direction,
wherein
the insulating film is disposed in a first region where the first wiring and the second wiring overlap each other when viewed from the third direction,
the resistance changing film includes a first resistance changing portion adjacent to the insulating film from the first side of the first region in the first direction, and a second resistance changing portion adjacent to the insulating film from the second side of the first region in the first direction, and
the resistance changing film further includes a third resistance changing portion adjacent to the insulating film from a third side of the first region in the third direction, and a fourth resistance changing portion adjacent to the insulating film from a fourth side which is opposite to the third side of the first region in the third direction.

2. The semiconductor storage device according to claim 1, wherein
the resistance changing film further includes a fifth resistance changing portion adjacent to the insulating film from a fifth side of the first region in the second direction.

3. The semiconductor storage device according to claim 1, further comprising:
a conductive film that is provided between the resistance changing film and the insulating film and the first wiring in the third direction; and
a selector film that is provided between the resistance changing film and the insulating film and the second wiring in the third direction, wherein
the resistance changing film is disposed in the first region where the first wiring and the second wiring overlap each other when viewed from the third direction, and
the insulating film includes a first adjacent insulating portion adjacent to the resistance changing film from the first side of the first region in the first direction, and a second adjacent insulating portion adjacent to the resistance changing film from the second side of the first region in the first direction.

4. A semiconductor storage device comprising:
a first wiring that extends in a first direction;
a second wiring that extends in a second direction intersecting the first direction, and is positioned at a location different from that of the first wiring in a third direction, the third direction intersecting the first direction and the second direction;
a selector film provided between the first wiring and the second wiring in the third direction;
an insulating film that is provided between the first wiring and the second wiring in the third direction, the insulating film having a first side and a second side, which is opposite to the first side in the first direction, and the insulating film is adjacent to the selector film from the first side and the second side; and
a resistance changing film that is provided between the first wiring and the second wiring in the third direction, and is connected to the selector film in the third direction,
wherein
the insulating film is disposed in a first region where the first wiring and the second wiring overlap each other when viewed from the third direction,
the resistance changing film includes a first resistance changing portion adjacent to the insulating film from the first side of the first region in the first direction, and a second resistance changing portion adjacent to the insulating film from the second side of the first region in the first direction, and
the resistance changing film further includes a third resistance changing portion adjacent to the insulating film from a third side of the first region in the third direction, and a fourth resistance changing portion adjacent to the insulating film from a fourth side which is opposite to the third side of the first region in the third direction.

5. A semiconductor storage device comprising:
a first wiring extending in a first direction;
a second wiring that extends in a second direction intersecting the first direction, and is provided at a location different from that of the first wiring in a third direction intersecting the first direction and the second direction;
a first insulating film provided between the first wiring and the second wiring in the third direction, the first insulating film having a first side and a second side which is opposite to the first side in the first direction;
a first resistance changing film that is provided between the first wiring and the second wiring in the third direction, and is adjacent to the first insulating film in the first direction; and
a first insulating portion adjacent to the first insulating film from the same side as a part of the first resistance changing film in the first direction
wherein
the first insulating film is disposed in a first region where the first wiring and the second wiring overlap each other when viewed from the third direction,
the first resistance changing film includes a first resistance changing portion adjacent to the first insulating film from the first side of the first region in the first direction, and a second resistance changing portion adjacent to the first insulating film from the second side of the first region in the first direction, and the first resistance changing film further includes a third resistance changing portion adjacent to the first insulating film from a third side of the first region in the third direction, and a fourth resistance changing portion adjacent to the first insulating film from a fourth side which is opposite to the third side of the first region in the third direction.

6. The semiconductor storage device according to claim 5, wherein
the first resistance changing film is disposed at a center of the second wiring in the first direction.

7. The semiconductor storage device according to claim 6, wherein
the first resistance changing film is disposed between the center of the second wiring in the first direction and an edge of the second wiring in the first direction.

8. The semiconductor storage device according to claim 5, wherein
the first resistance changing film is in contact with the first insulating film in the first direction.

9. The semiconductor storage device according to claim 5, wherein
a maximum thickness of the first resistance changing film in the first direction is smaller than a maximum thickness of the first insulating film in the first direction.

10. The semiconductor storage device according to claim 5, wherein
a maximum thickness of the first resistance changing film in the first direction is equal to or lower than half a maximum width of the second wiring in the first direction.

11. The semiconductor storage device according to claim 5, wherein
a part of the first insulating portion is adjacent to the selector film in the first direction.

12. The semiconductor storage device according to claim 5, wherein
a maximum thickness of the first resistance changing film in the first direction is smaller than a maximum thickness of the selector film in the third direction.

13. The semiconductor storage device according to claim 5, further comprising:
a third wiring that is adjacent to the second wiring in the first direction, and extends in the second direction;
a second insulating film provided between the first wiring and the third wiring in the third direction;
a second resistance changing film that is provided between the first wiring and the third wiring in the third direction, and is adjacent to the second insulating film in the first direction; and
a second insulating portion adjacent to the second insulating film from the same side as a part of the second resistance changing film in the first direction.

14. The semiconductor storage device according to claim 13, wherein
the first resistance changing film is disposed at a central part of the second wiring in the first direction, and
the second resistance changing film is disposed at a central part of the third wiring in the first direction.

15. The semiconductor storage device according to claim 14, further comprising:
a fourth wiring that is adjacent to the second wiring from a side which is opposite to the third wiring in the first direction, and extends in the second direction;
a third insulating film provided between the first wiring and the fourth wiring in the third direction; and
a third resistance changing film that is provided between the first wiring and the fourth wiring in the third direction, and is adjacent to the third insulating film in the first direction, in which
the second insulating portion includes a part provided between the first wiring and the fourth wiring in the third direction.

16. The semiconductor storage device according to claim 13, wherein
the first resistance changing film is disposed at a central part of the second wiring in the first direction, and
the third resistance changing film is disposed at a central part of the fourth wiring in the first direction.

17. The semiconductor storage device according to claim 15, wherein
the second insulating portion is in contact with the first resistance changing film from a side which is opposite to the first insulating film.

18. The semiconductor storage device according to claim 15, wherein
a part of the second insulating portion is provided between the second wiring and the third wiring in the first direction.

* * * * *